United States Patent
Lee et al.

(10) Patent No.: US 11,168,937 B2
(45) Date of Patent: Nov. 9, 2021

(54) REFRIGERATOR

(71) Applicant: LG ELECTRONICS INC., Seoul (KR)

(72) Inventors: Ikkyu Lee, Seoul (KR); Dongrim Woo, Seoul (KR)

(73) Assignee: LG ELECTRONICS INC., Seoul (KR)

(*) Notice: Subject to any disclaimer, the term of this patent is extended or adjusted under 35 U.S.C. 154(b) by 200 days.

(21) Appl. No.: 16/458,396

(22) Filed: Jul. 1, 2019

(65) Prior Publication Data

US 2019/0323768 A1 Oct. 24, 2019

Related U.S. Application Data

(63) Continuation of application No. 15/818,966, filed on Nov. 21, 2017, now Pat. No. 10,378,815.

(30) Foreign Application Priority Data

Nov. 29, 2016 (KR) .................... 10-2016-0160178
Mar. 4, 2017 (KR) .................... 10-2017-0028004

(51) Int. Cl.
*F25D 29/00* (2006.01)
*F25D 23/02* (2006.01)
(Continued)

(52) U.S. Cl.
CPC .............. *F25D 29/005* (2013.01); *E06B 9/24* (2013.01); *F25D 23/02* (2013.01); *F25D 23/028* (2013.01);
(Continued)

(58) Field of Classification Search
CPC .... F25D 29/005; F25D 23/028; F25D 27/005; F25D 2323/023; F25D 2323/024;
(Continued)

(56) References Cited

U.S. PATENT DOCUMENTS 4,223,482 A * 9/1980 Barroero ................. A47F 3/043
16/75
4,671,582 A * 6/1987 Stromquist ............. A47F 3/043
16/93 R
(Continued)

FOREIGN PATENT DOCUMENTS

KR 10-2005-0014447 2/2005
KR 10-1668921 10/2016
(Continued)

OTHER PUBLICATIONS

Instructables. (Sep. 22, 2012). How to remove and RE-ATTACH LCD ribbon from a Pcb with a fine pitch. Retrieved Mar. 27, 2021, from https://www.instructables.com/How-to-remove-and-re-attach-LCD-Ribbon-from-a-PCB-/ (Year: 2012).*
(Continued)

*Primary Examiner* — Jianying C Atkisson
*Assistant Examiner* — Miguel A Diaz
(74) *Attorney, Agent, or Firm* — Ked & Associates LLP

(57) ABSTRACT

Provided is a refrigerator in which a transparent display assembly and electric modules, which are disposed in a door to see through a storage space and output a screen, are easily connected to a control unit provided in a cabinet and guided through a narrow door hinge.

24 Claims, 41 Drawing Sheets

(51) Int. Cl.
| | |
|---|---|
| *F25D 23/04* | (2006.01) |
| *F25D 27/00* | (2006.01) |
| *G02F 1/133* | (2006.01) |
| *E06B 9/24* | (2006.01) |
| *F21V 8/00* | (2006.01) |
| *H05K 5/00* | (2006.01) |
| *H05K 7/14* | (2006.01) |

(52) U.S. Cl.
CPC ............. *F25D 23/04* (2013.01); *F25D 27/00* (2013.01); *F25D 27/005* (2013.01); *F25D 29/00* (2013.01); *G02B 6/009* (2013.01); *G02B 6/0083* (2013.01); *G02B 6/0088* (2013.01); *G02B 6/0091* (2013.01); *G02F 1/133* (2013.01); *H05K 5/0017* (2013.01); *H05K 7/1427* (2013.01); *E06B 2009/2464* (2013.01); *F25D 2201/10* (2013.01); *F25D 2323/023* (2013.01); *F25D 2323/024* (2013.01); *F25D 2400/18* (2013.01); *F25D 2400/36* (2013.01); *F25D 2400/361* (2013.01); *F25D 2400/40* (2013.01)

(58) Field of Classification Search
CPC ............. F25D 2400/18; F25D 2400/36; F25D 2400/361; F25D 2400/40; G02B 6/0083; G02B 6/0088; G02B 6/009; G02B 6/0091; H05K 5/0017; H05K 7/1427
See application file for complete search history.

(56) References Cited

U.S. PATENT DOCUMENTS

| | | | | |
|---|---|---|---|---|
| 5,363,611 A * | 11/1994 | Richardson | ............. | A47F 3/043 312/116 |
| 5,910,083 A * | 6/1999 | Richardson | ......... | E06B 3/66366 52/171.1 |
| 7,322,209 B2 * | 1/2008 | Hwang | ............... | E05D 11/0081 312/120 |
| 8,683,745 B2 * | 4/2014 | Artwohl | ..................... | G09F 9/35 49/70 |
| 9,311,834 B2 * | 4/2016 | Lee | ......... | G06F 3/041 |
| 10,007,385 B2 | 6/2018 | Kim | | |
| 10,378,815 B2 * | 8/2019 | Lee | ....................... | F25D 23/028 |
| 10,436,504 B2 * | 10/2019 | Lee | ....................... | F25D 27/005 |
| 10,528,087 B2 * | 1/2020 | Kang | .................... | G06F 1/1677 |
| 10,599,392 B2 * | 3/2020 | Jeon | ........................ | F25D 23/02 |
| 10,704,826 B2 * | 7/2020 | Lee | ........................ | F25D 27/005 |
| 10,767,917 B2 * | 9/2020 | Kim | ........................ | F25D 23/025 |
| 10,877,728 B2 * | 12/2020 | Jeon | .................... | G06F 3/04886 |
| 10,941,982 B2 * | 3/2021 | Lee | ......................... | F25D 23/02 |
| 2005/0217308 A1 * | 10/2005 | Hwang | ............... | E05D 11/0081 62/440 |
| 2005/0284159 A1 | 12/2005 | Kim | | |
| 2006/0196214 A1 | 9/2006 | Lee et al. | | |
| 2011/0063261 A1 | 3/2011 | Park | | |
| 2012/0105424 A1 * | 5/2012 | Lee | ......................... | G09F 27/00 345/212 |
| 2012/0285089 A1 * | 11/2012 | Artwohl | ................. | A47F 3/0434 49/70 |
| 2012/0286638 A1 * | 11/2012 | Lee | ......................... | F25D 23/02 312/405 |
| 2014/0035850 A1 * | 2/2014 | Shin | ........................ | G06F 3/041 345/173 |
| 2014/0144083 A1 | 5/2014 | Artwohl | | |
| 2015/0276302 A1 * | 10/2015 | Roh | ......................... | F25D 29/00 62/56 |
| 2015/0335174 A1 | 11/2015 | Artwohl et al. | | |
| 2015/0356934 A1 | 12/2015 | Yamashita | | |
| 2016/0188025 A1 | 6/2016 | Park et al. | | |
| 2016/0220039 A1 * | 8/2016 | Chang | .................... | F21V 14/08 |
| 2017/0027339 A1 * | 2/2017 | Chang | .................... | A47F 3/0486 |
| 2017/0059875 A1 * | 3/2017 | Seung | .................... | F25D 23/028 |
| 2017/0089632 A1 * | 3/2017 | Kang | .................... | A47F 3/0434 |
| 2017/0370636 A1 * | 12/2017 | Koo | ......................... | F25D 23/02 |
| 2018/0209722 A1 * | 7/2018 | Koo | ......................... | F25D 29/005 |
| 2018/0274846 A1 * | 9/2018 | Kim | .................... | A47F 3/0434 |
| 2018/0363970 A1 * | 12/2018 | Koo | ......................... | F25D 23/028 |

FOREIGN PATENT DOCUMENTS

| | | |
|---|---|---|
| WO | WO 2014/019281 | 2/2014 |
| WO | WO 2016/175563 | 11/2016 |

OTHER PUBLICATIONS

European Extended Search Report in European Application No. 17202681.7 dated Apr. 25, 2018, 10 pages.
U.S. Notice of Allowance issued in U.S. Appl. No. 15/818,966 dated Apr. 1, 2019.
Korean Office Action dated Apr. 9, 2021.

* cited by examiner

REFRIGERATOR

CROSS-REFERENCE TO RELATED APPLICATIONS

This application is a Continuation Application of prior U.S. patent application Ser. No. 15/818,966, filed Nov. 21, 2017, which claims priority under 35 U.S.C. § 119 to Korean Application Nos. 10-2016-0160178, filed on Nov. 29, 2016 and 10-2017-0028004, filed on Mar. 4, 2017, whose entire disclosures are hereby incorporated by reference.

BACKGROUND

1. Field

The present disclosure relates to a refrigerator.

2. Background

In general, refrigerators are home appliances for storing foods at a low temperature in a storage space that is covered by a door. For this, refrigerators cool the inside of the storage space by using cool air generated by being heat-exchanged with a refrigerant circulated through a refrigeration cycle to store foods in an optimum state.

In recent years, refrigerators tend to increase in size more and more, and multi-functions are applied to refrigerators as dietary life changes and high-quality is pursued, and accordingly, refrigerators of various structures for user convenience and efficient use of an internal space are being brought to the market.

A storage space of such a refrigerator may be opened and closed by a door. Also, refrigerators may be classified into various types according to an arranged configuration of the storage space and a structure of the door for opening and closing the storage space.

Generally, the refrigerator has a limitation that foods stored therein are not confirmed unless the door is not opened. That is, the door has to be opened to confirm that a desired food is stored in the refrigerator or in a separate storage space provided in the door. In addition, if the stored position of the food is not known precisely, an opened time of the door may increase, or the number of times for opening the door increases. In this case, there is a limitation that unnecessary leakage of cool air occurs.

In recent years, to solve such a limitation, a refrigerator has been developed while allows a portion of a door thereof to be transparent or allows the inside thereof to be seen from the outside.

The above references are incorporated by reference herein where appropriate for appropriate teachings of additional or alternative details, features and/or technical background.

SUMMARY

Embodiments provide a refrigerator in which at least a portion of a refrigerator door is selectively transparent by user's manipulation to allow the user to see the inside of the refrigerator even though the refrigerator door is closed, and simultaneously, to selectively output a screen.

Embodiments also provide a refrigerator in which a see-through part constituting a portion of a door is capable of being transparent or opaque or outputting a screen according to selective turn-on/off of a door light or a display light.

Embodiments also provide a refrigerator in which a PCB and a cable connected to the PCB are disposed in a door, which is capable of seeing through the inside of the refrigerator by a transparent display assembly, without being exposed through the transparent display.

Embodiments also provide a refrigerator in which is capable of preventing a display and PCBs for driving the display within a door from being damaged and also insulating the inside of the refrigerator.

Embodiments also provide a refrigerator in which a PCB connected to electric modules is easily assembled and mounted in a door.

Embodiments also provide a refrigerator in which a plurality of electric modules in a door are simply connected to a control unit of a main body.

Embodiments also provide a refrigerator in which a door has a compact structure through arrangement and connection of wires connected to electric modules of a transparent display assembly provided in the door.

Embodiments also provide a refrigerator in which a transparent display assembly and electric modules, which are provided in a door, are easily connected to a control unit and guided through a narrow door hinge.

In one embodiment, a refrigerator includes: a cabinet defining a storage space; a control unit disposed on an upper portion of the cabinet; a door connected to the cabinet through a hinge to open and close the storage space and having an opening of which at least a portion is penetrated toward the storage space; and a transparent display assembly mounted to cover the opening and including a plurality of electric modules for see-through of the storage space and an output of an image, wherein the transparent display assembly includes: a PCB disposed inside the door and electrically connected to a portion of the electric modules; and a docking PCB disposed adjacent to the PCB, the docking PCB being connected to the other portion of the electric modules and the PCB through a cable and connected to the control unit through a connection cable to allow the electric modules and the PCB to be indirectly connected to the control unit, wherein, in the docking PCB, the number of connection connectors, to which the connection cable guided to the outside of the door via the hinge is connected, is less than that of connectors to which the cables are connected, and a control signal of the control unit is transmitted to the PCB through the docking PCB to control the electric modules.

At least a portion of the cables may be provided as a flexible flat cable, and the connection cable may be provided as a wire type cable.

The connection cable may be guided to the outside of the door by passing through a wire hole that is opened in an upper cap deco defining a top surface of the door.

The connection cable may be guided to the outside of the door by passing through a hinge shaft of the hinge mounted on an upper end of the door.

The electric modules may include: a display for outputting a screen; a touch sensor for touch manipulation of the display; and a display light for brightening up a light guide plate disposed at a rear side of the display.

A source PCB may be disposed on one end of both ends of the display, and the source PCB may be disposed in a direction perpendicular to the display inside the transparent display assembly.

The refrigerator may further include a flat type display cable connecting the source PCB to the PCB, wherein the display cable may be bent to extend along a circumferential surface of the transparent display assembly.

The refrigerator may further include a flat type touch cable connecting the touch sensor to the PCB, wherein the touch cable may be connected to the PCB by passing through the circumferential surface of the transparent display assembly inside the transparent display assembly.

The refrigerator may further include a flat type display light cable connecting the display light to the PCB, wherein the display light cable may be disposed along a protrusion that protrudes to the outside of a panel defining a front or rear surface of the transparent display assembly.

The electric modules may include a door light disposed on a rear surface of the door to brighten up a rear space of the door.

The PCB may include: a touch PCB electrically connected to the touch sensor; and a T-CON board electrically connected to the display, wherein at least one of the touch PCB and the T-CON board may be connected to the docking PCB.

An opening through which the cable connected to the PCB is exposed and into which the PCB connected to the cable is inserted may be defined in a circumference of the door, and an insulation material may be filled around the door except for a space between the opening and the transparent display assembly.

The opening may be defined in a cap deco defining a top or bottom surface of the door, a deco cover covering the opening may be disposed on the cap deco, and in the deco cover, a PCB mounting part, on which the PCB and the docking PCB are mounted, may extend into the opening.

The connection cable may include: a first connection cable for supplying power; and a second connection cable for processing a signal.

The connection cable may include: a first connection cable connected to the electric module for which supply of a high voltage is required; and a second connection cable connected to the electric module for which supply of a low voltage is required.

The connection cable may include: a first connection cable through which the power is supplied; and a second connection cable through which the power is supplied according an operation signal.

The door may include: a main door opening and closing a first storage space within the cabinet and defining an opened second storage space; a main hinge allowing the main door to be rotatably mounted on the cabinet; a sub door disposed on a front side of the main door to open and close the second storage space and having the opening penetrated at a position corresponding to the second storage space; and a sub hinge allowing the sub door to be rotatably mounted on the main door.

A hinge shaft of the sub hinge may have an inner diameter less than that of a rotation shaft of the main hinge, and the connection cable may be guided to the outside of the door by passing through the hinge shaft of the sub hinge.

The hinge shaft of the sub hinge may communicate with a space, in which the docking PCB is mounted, inside the sub door.

In the connection cable, a plurality of wires may be bound as one bundle by a binding member to pass through the hinge shaft of the sub hinge.

The details of one or more embodiments are set forth in the accompanying drawings and the description below. Other features will be apparent from the description and drawings, and from the claims.

BRIEF DESCRIPTION OF THE DRAWINGS

The embodiments will be described in detail with reference to the following drawings in which like reference numerals refer to like elements wherein.

DETAILED DESCRIPTION

Reference will now be made in detail to the embodiments of the present disclosure, examples of which are illustrated in the accompanying drawings. The invention may, however, be embodied in many different forms and should not be construed as being limited to the embodiments set forth herein; rather, that alternate embodiments included in other retrogressive inventions or falling within the spirit and scope of the present disclosure will fully convey the concept of the invention to those skilled in the art.

Figure 1:
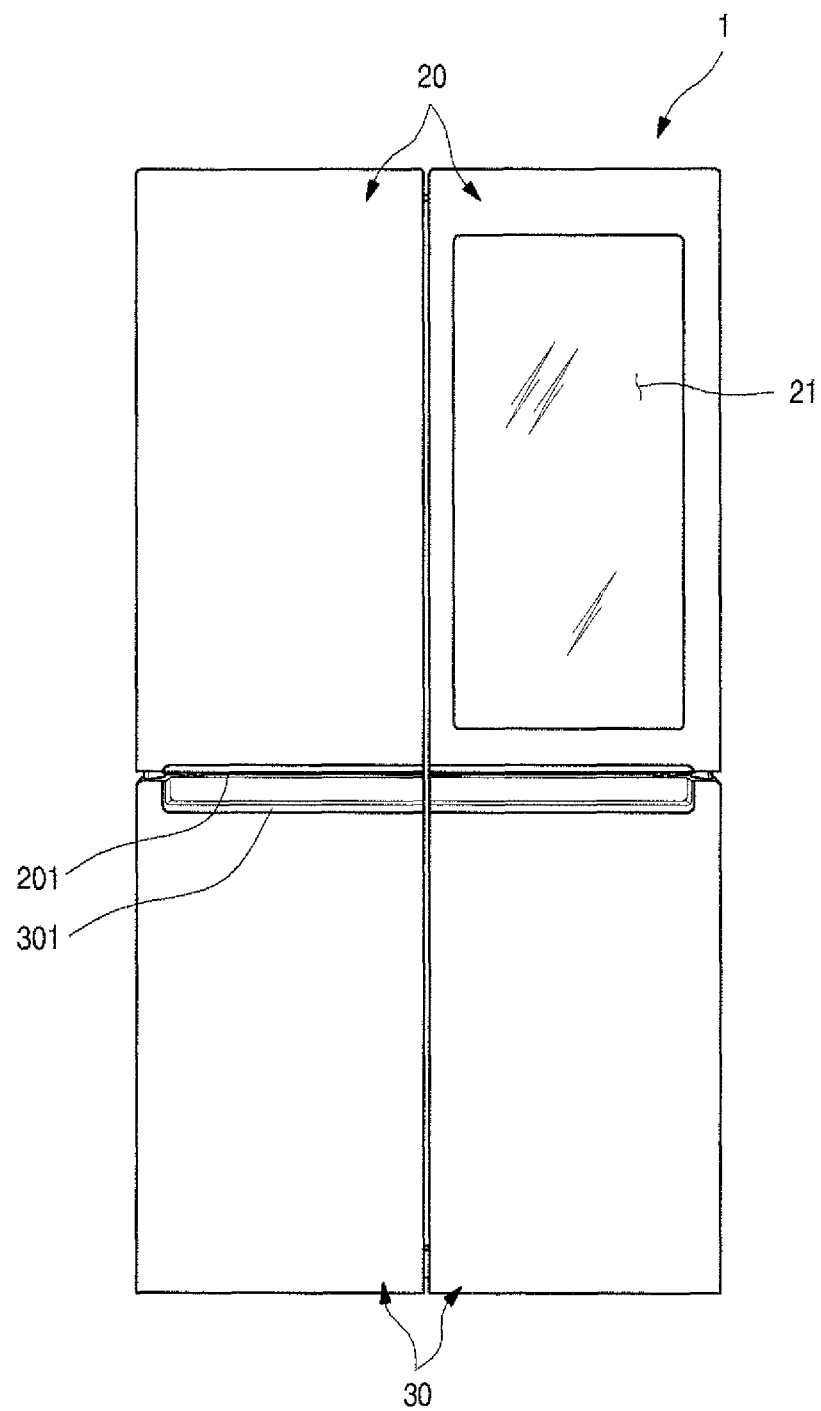
FIG. 1 is a front view of a refrigerator according to a first embodiment.

FIG. 1 is a front view of a refrigerator according to a first embodiment. Also, FIG. 2 is a perspective view of the refrigerator.

Figure 2:
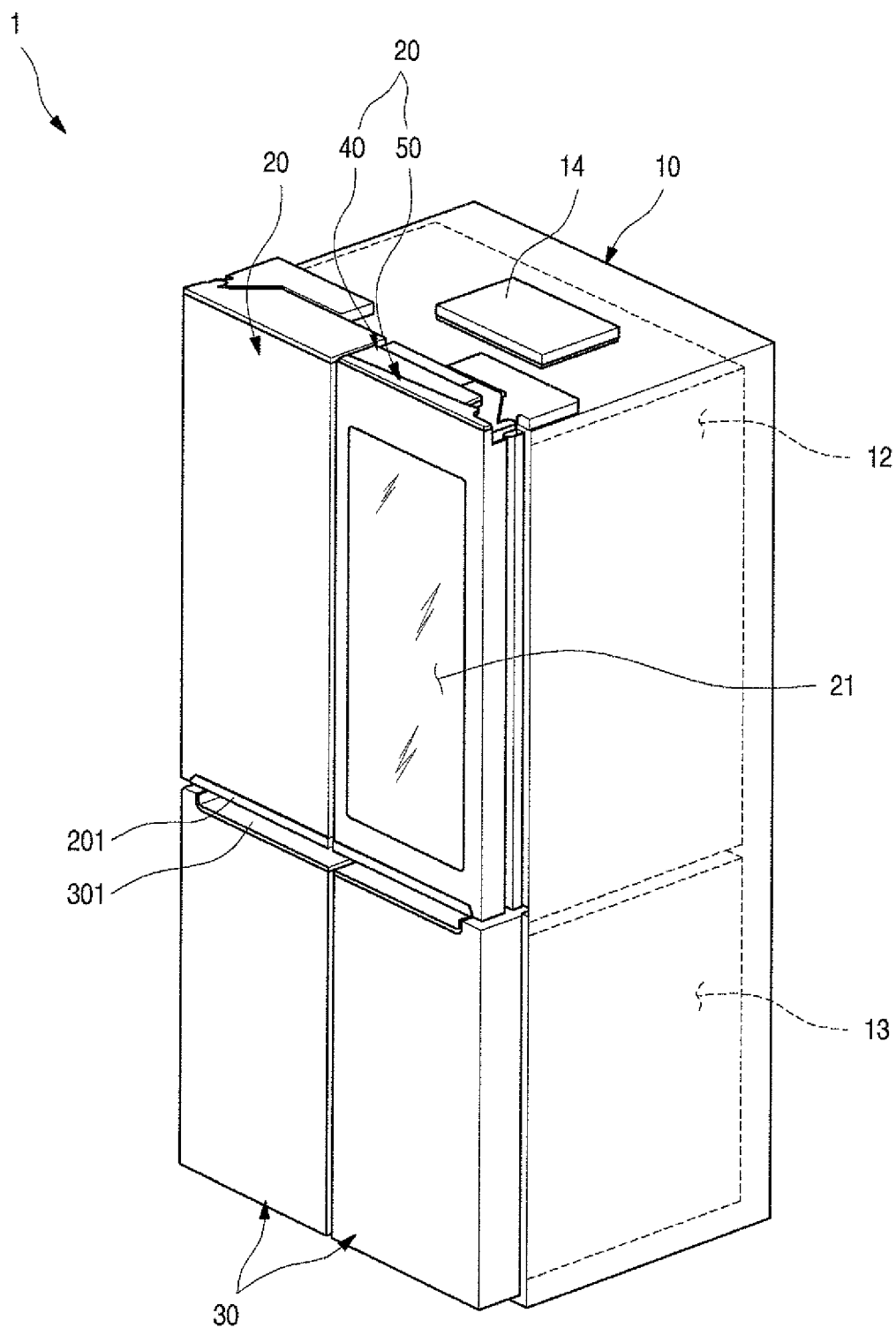
FIG. 2 is a perspective view of the refrigerator.

Referring to FIGS. 1 and 2, a refrigerator 1 according to a first embodiment includes a cabinet 10 defining a storage space and a door that opens or closes the storage space. Here, an outer appearance of the refrigerator 1 may be defined by the cabinet 10 and the door.

Figure 11:
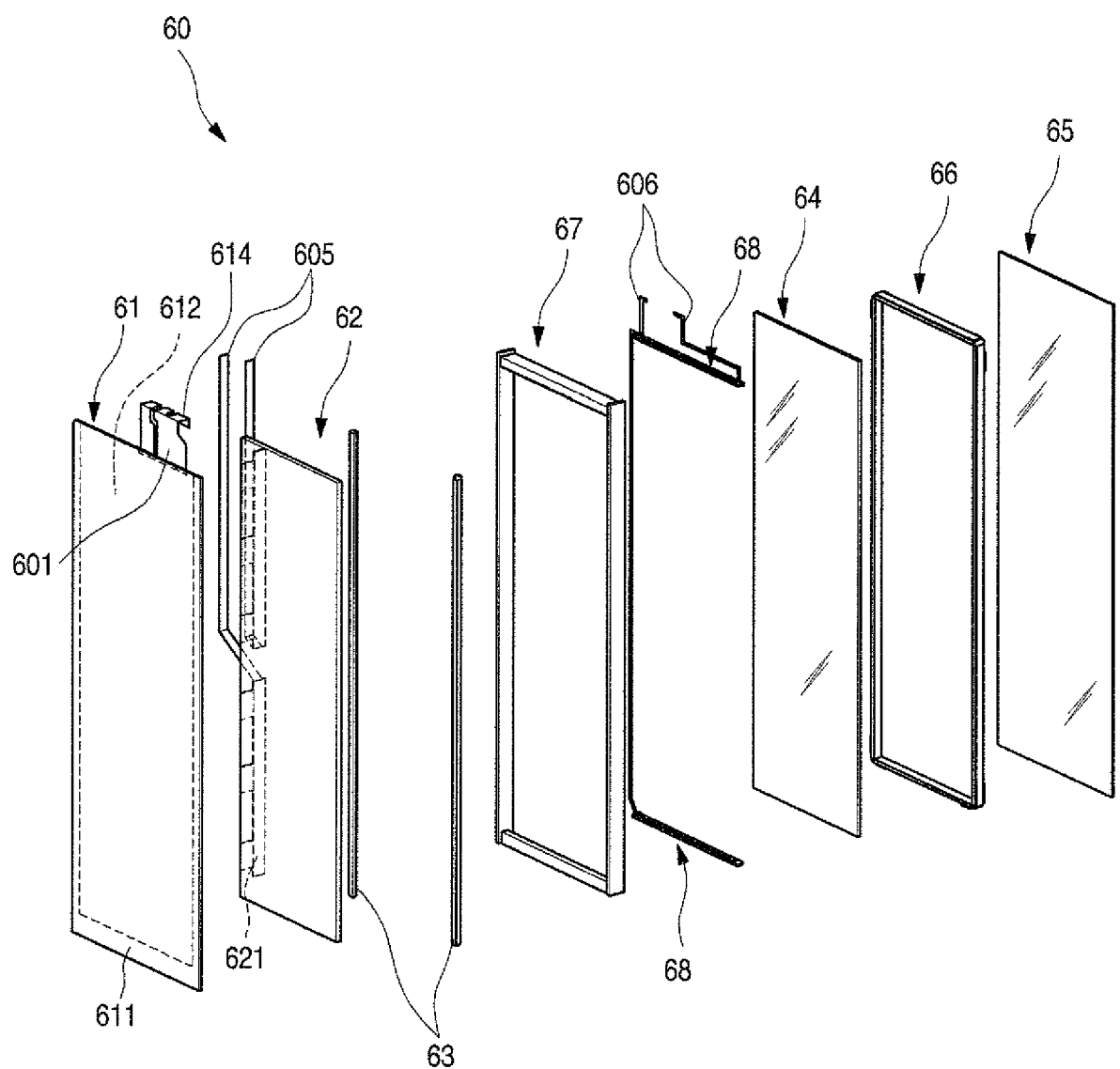
FIG. 11 is an exploded perspective view of the transparent display assembly.

The inside of the cabinet 10 is partitioned into upper and lower portions by a barrier (see FIG. 11). A refrigerating compartment 12 may be defined in the upper portion of the cabinet 10, and a freezing compartment 13 may be defined in the lower portion of the cabinet 10.

Also, a control unit 14 for controlling an overall operation of the refrigerator 1 may be disposed on a top surface of the cabinet 10. The control unit 14 may be configured to control a cooling operation of the refrigerator as well as electric modules for selective see-through and screen output of a see-through part 21.

The door may include a refrigerating compartment door and a freezing compartment door 30. The refrigerating compartment door 20 may be opened and closed by rotating an opened front surface of the refrigerating compartment 12, and the freezing compartment door 30 may be switched by rotating an opened front surface of the freezing compartment 13.

Also, the refrigerating compartment door 20 may be provided in a pair of left and right doors. Thus, the refrigerating compartment 12 is covered by the pair of doors. The freezing compartment door 30 may be provided in a pair of left and right doors. Thus, the freezing compartment 13 may be opened and closed by the pair of doors. Alternatively, the freezing compartment door 30 may be withdrawable in a draw type as necessary and provided as one or more doors.

Although a refrigerator in which, a French type door in which a pair of doors rotate to open and close one space is applied to a bottom freezer type refrigerator in which the freezing compartment 13 is provided at a lower portion, is described as an example in this embodiment, the present disclosure may be applied to all types of refrigerators including door without being limited to shapes of the refrigerators.

Also, recessed handle grooves 201 and 301 may be provided in a lower end of the refrigerating compartment door 20 and an upper end of the freezing compartment door 30. A user may insert a his/her hand into the handle groove 201 or 301 to open and close the refrigerating compartment door 20 or the freezing compartment door 30.

At least one door may be provided so that the inside of the refrigerator is seen through the door. A see-through part 21 that is an area, through which the storage space in the rear surface of the door and/or the inside of the refrigerator are seen, may be provided in the refrigerating compartment door 20. The see-through part 21 may constitute at least a portion of a front surface of the refrigerating compartment door 20. The see-through part 21 may be selectively transparent or opaque according to user's manipulation. Thus, foods accommodated in the refrigerator may be accurately identified through the see-through part 21.

Also, although the structure in which the see-through part 21 is provided in the refrigerating compartment door 20 is described as an example in this embodiment, the see-through part 21 may be provided in different types of refrigerator doors such as the freezing compartment door 30 according to a structure and configuration of the refrigerator.

Figure 3:
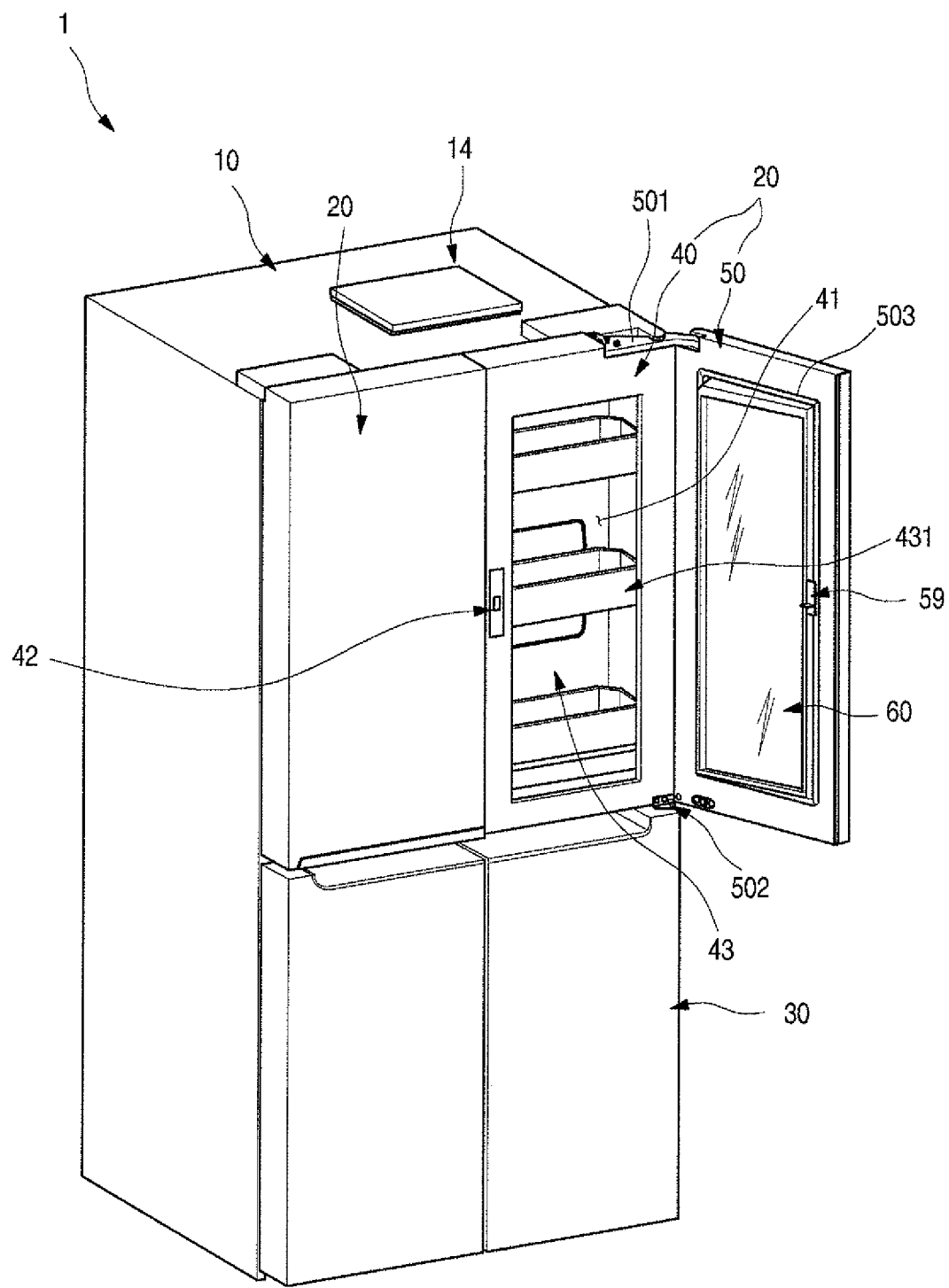
FIG. 3 is a perspective view of the refrigerator with a sub door opened.

FIG. 3 is a perspective view of the refrigerator with a sub door opened. Also, FIG. 4 is a perspective view of the refrigerator with a main door opened.

Figure 4:
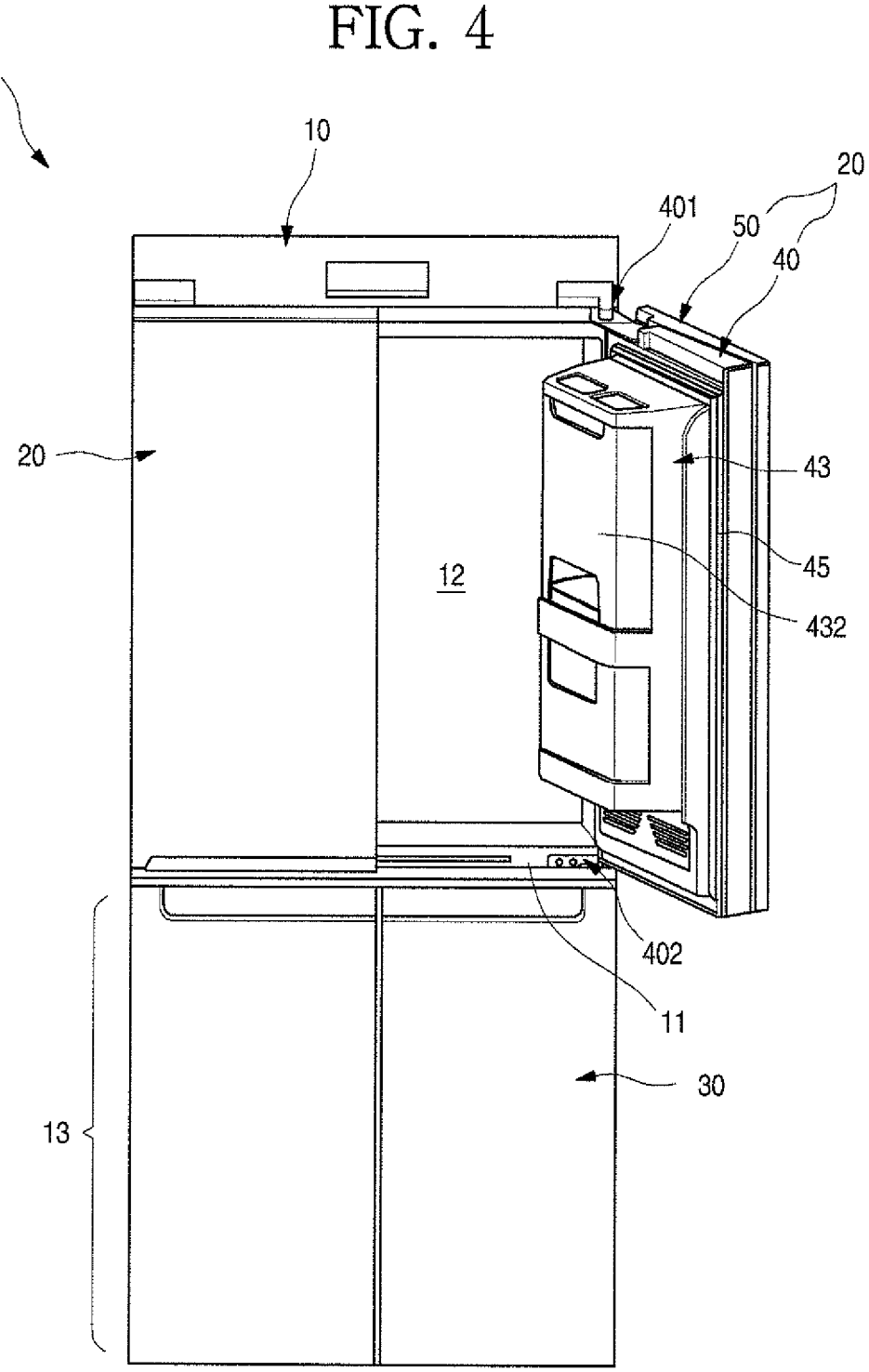
FIG. 4 is a perspective view of the refrigerator with a main door opened.

As illustrated in FIGS. 3 and 4, the refrigerating compartment door 20, which is disposed at the right side (when viewed in FIG. 3), of the pair of refrigerating compartment doors 20 may be doubly opened and closed. In detail, the refrigerating compartment door 20, which is disposed at the right side, may include a main door 40 that opening and closing the refrigerating compartment 12 and a sub door 50 rotatably disposed on the main door 40 to open and close an opening defined in the main door 40.

The main door 40 may have the same size as that of the refrigerating compartment door 20, which is disposed at the left side (when viewed in FIG. 1), of the pair of refrigerating compartment doors 20. The main door 40 may be rotatably mounted on the cabinet 10 by an upper hinge 401 and a lower hinge 402 to open at least a portion of the refrigerating compartment door 20.

Also, an opening 41 that is opened with a predetermined size is defined in the main door 40. A door basket 431 may be mounted on the rear surface of the main door 40 as well as the inside of the opening 41. Here, the opening 41 may have a size that occupies most of the front surface of the main door 40 except for a portion of a circumference of the main door 40.

Also, a main gasket 45 may be disposed on a circumference of the rear surface of the main door 40 to prevent cool air within an internal space of the cabinet 10 from leaking when the main door 40 is opened.

The sub door 50 may be rotatably mounted on the front surface of the main door 40 to open and close the opening 41. Thus, the sub door 50 may be opened to expose the opening 41.

The sub door 50 may have the same size as the main door 40 to cover the entire front surface of the main door 40. Also, when the sub door 50 is closed, the main door 40 and the sub door 50 may be coupled to each other to provide the same size and configuration as those of the left refrigerating compartment door 20. Also, a sub gasket 503 may be disposed on the rear surface of the sub door 50 to seal a gap between the main door 40 and the sub door 50.

A transparent display assembly 60 that selectively sees the inside and outputs a screen may be disposed at a center of the sub door 50. Thus, even though the sub door 50 is closed, the inside of the opening 41 may be selectively seen, and also an image inside the opening 41 may be outputted. The see-through part 21 may be a portion of the sub door 50, through which the inside of the refrigerator 1 is seen. However, the see-through part 21 may not necessarily match the entirety of the transparent display assembly 60.

The transparent display assembly 60 may be configured to be selectively transparent or opaque according to user's manipulation. Thus, only when the user desires, the transparent display assembly 60 may be transparent so that the inside of the refrigerator 1 is visualized, otherwise, be maintained in the opaque state. Also, the transparent display assembly 60 may output a screen in the transparent or opaque state.

A sub upper hinge 501 and a sub lower hinge 502 may be respectively provided on upper and lower ends of the sub door 50 so that the sub door 50 is rotatably mounted on the front surface of the main door 40. Also, an opening device 59 may be provided on the sub door 50. A locking unit 42 may be provided on the main door 40 to correspond to the opening device 59. Thus, the sub door 50 may be maintained in the closed state by the coupling between the opening device 59 and the locking unit 42. When the coupling between the opening device 59 and the locking unit 42 is released by manipulation of the opening device 59, the sub door 50 may be opened with respect to the main door 40.

Also, a damping device 504 may be provided on a lower end of the sub door 50. The damping device 504 may be disposed on edges of the lower end and lateral end of the sub door 50, which are adjacent to the sub lower hinge 502, so that an impact is damped when the sub door 50 having a relatively heavy weight by the transparent display assembly 60 is closed.

An accommodation case 43 may be provided in the rear surface of the main door 40. A plurality of door baskets 431 may be disposed on the accommodation case 43, and a case door 432 may be provided on the accommodation case 43.

Figure 5:
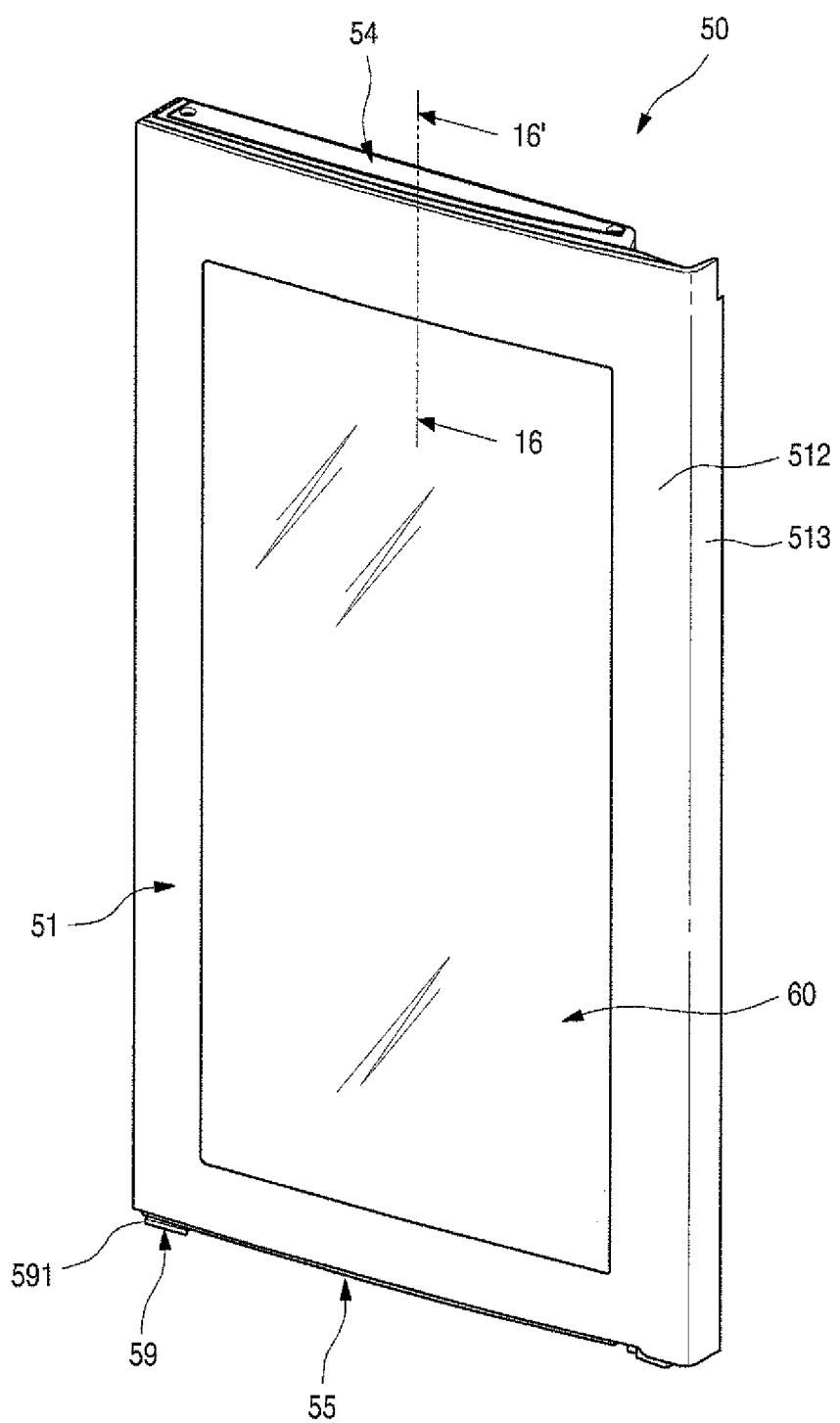
FIG. 5 is a perspective view of the sub door when viewed from a front side.
Figure 6:
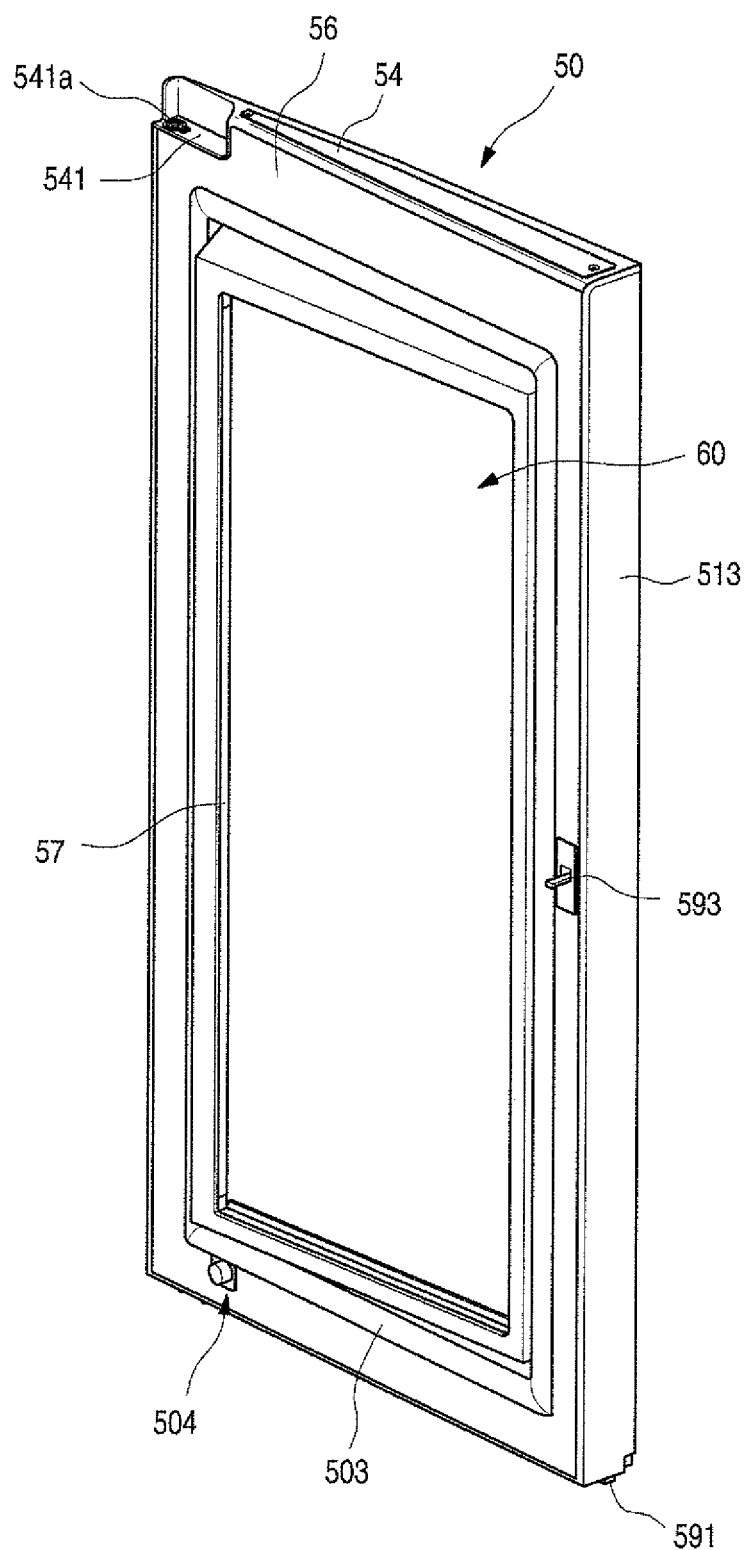
FIG. 6 is a perspective view of the sub door when viewed from a rear side.
Figure 7:
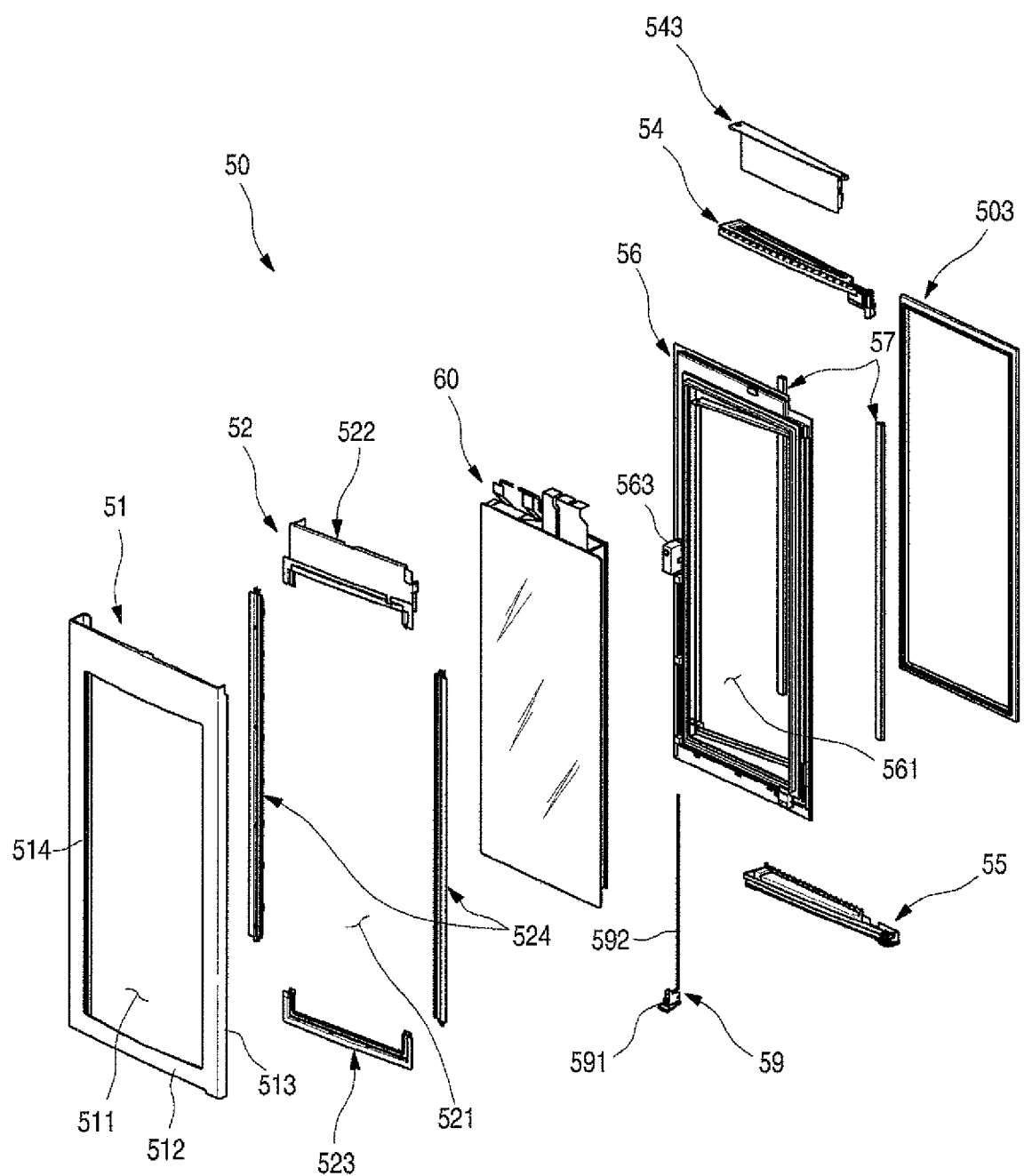
FIG. 7 is an exploded perspective view of the sub door.

FIG. 5 is a perspective view of the sub door when viewed from a front side. FIG. 6 is a perspective view of the sub door when viewed from a rear side. Also, FIG. 7 is an exploded perspective view of the sub door.

As illustrated in the drawings, the sub door 50 may include an outer plate 51 defining an outer appearance of the sub door 50, a door linear 56 mounted to be spaced apart from the outer plate 51, the transparent display assembly 60 mounted on an opening of the outer plate 51 and the door linear 56, and upper and lower cap decos 54 and 55 defining the top and bottom surfaces of the sub door 50. The above-described constituents may be coupled to define the whole outer appearance of the sub door 50.

The outer plate 51 may constitute an outer appearance of the front surface of the sub door 50 and a portion of a circumferential surface of the sub door 50 and be made of a stainless steel material. The outer plate 51 may constitute a portion of the outer appearance of the sub door 50 as well as the front surface of the sub door 50. Also, the outer plate 51 may be made of the same material of the front surface of each of the refrigerating compartment door 20 and the freezing compartment door 30. Various surface treatments such as coating or film attachment so as to realize anti-fingerprint coating, hair lines, colors, or patterns may be performed on the front surface of the outer plate 51.

The outer plate 51 may include a front part 512 defining the outer appearance of the front surface and a side part 513 defining an outer appearance of the side surface that is exposed to the outside. Also, a plate opening 511 may be defined at a center of the front part 512. Here, the plate opening 511 may be covered by the transparent display assembly 60. Also, since the inside of the refrigerator 1 is seen through the transparent display assembly 60 covering the plate opening 511, the inside of the plate opening 511 is called the see-through part 21.

The front part 512 may have a curvature that gradually decreases outward from a central side of the refrigerator 1 as a whole. The front part 512 may be rounded to correspond to the front surface of the refrigerating compartment door 20, which is adjacent to the front part 512. Thus, the outer appearance of the front surface of the refrigerator 1 may be three-dimensionally viewed as a whole.

Also, an opening bent part 514 that is bent backward may be disposed on a circumferential surface of the plate opening 511. The opening bent part 514 may be disposed along a circumference of the plate opening 511 and extend by a predetermined length so as to be inserted into and fixed to an inner frame 52 that will be described below. Thus, the plate opening 511 may be defined by the opening bent part 514.

The side part 513 that is bent backward may be disposed on each of both ends of the front part 512. The side part 513 may define an outer appearance of the side surface of the sub door 50. Also, an end of the side part 513 may also be bent inward to be coupled to the door linear 56.

Upper and lower ends of the outer plate 51 may also be bent to be coupled to the upper cap deco 54 and the lower cap deco 55. Thus, the outer plate 51 may define the outer appearance of the sub door 50 by being coupled to the door linear 56 and the upper and lower cap decos 54 and 55.

The door linear 56 defines the rear surface of the sub door 50 and has a door linear opening 561 in the area on which the transparent display assembly 60 is disposed. Also, a sub gasket 503 for sealing a gap between the sub door 50 and the main door 40 may be mounted on the rear surface of the door linear 56.

Also, a door light 57 may be provided on each of both sides of the door linear opening 561. The door light 57 may illuminate the rear surface of the sub door 50 and a rear side of the transparent display assembly 60.

Thus, the door light 57 may illuminate an inner space of the accommodation case 43, and simultaneously, serve as an auxiliary backlight function of the transparent display assembly 60 to more clearly output a screen of the transparent display assembly 60. When the door light 57 is turned on, the inside of the accommodation case 43 may be brightened up, and thus, the inside of the refrigerator 1 may be more brightened up than the outside of the refrigerator 1 so that the inside of the refrigerator 1 may be visualized through the transparent display assembly 60.

The door light 57 may be disposed on both sides of the transparent display assembly 60 in directions facing each other. The mounted position of the door light 57 may variously vary as long as the door light 57 has sufficient brightness at the rear side of the sub door.

Also, the opening device 59 may be mounted on the door linear 56. The opening device 59 may include a manipulation member 591 exposed to the lower end of the sub door 50, a load 592 extending from the manipulation member 591, and a locking member 593 protruding from the rear surface of the door linear 56. The user may manipulate the manipulation member 591 to allow the load 592 to move the locking member 593 so that the sub door 50 is selectively restricted by the main door 40 and also to manipulate the opening and closing of the sub door 50.

The upper cap deco 54 may define a top surface of the sub door 50 and be coupled to upper ends of the outer plate 51 and the door linear 56. Also, a sub upper hinge mounting part 541 may be disposed on one end of the upper cap deco 54, and a hinge hole 541a into which a hinge shaft of the upper hinge 401 is inserted may be defined in the sub upper hinge mounting part 541. A structure of the upper cap deco 54 will be described below in more detail.

The lower cap deco 55 may define a bottom surface of the sub door 50 and be coupled to lower ends of the outer plate 51 and the door linear 56.

The transparent display assembly 60 may be disposed between the outer plate 51 and the door linear 56. Also, the transparent display assembly 60 may be configured to cover the plate opening 511 and the door linear opening 561. Also, the transparent display assembly 60 may be selectively manipulated to one state of transparent, translucent, opaque, and screen output states by the user.

Thus, the user may selectively see through the inner space of the sub door 50 through the transparent display assembly 60 and see the screen outputted through the transparent display assembly 60.

The inner frame 52 for supporting the transparent display assembly 60 is mounted on a circumference of the plate opening 511 of the outer plate 51. The transparent display assembly 60 may be fixed and mounted on the outer plate 51 by the inner frame 52. Particularly, a front surface of the outer plate 51 and the front surface of the transparent display assembly 60 may be disposed on the same extension line so that the front surface of the sub door 50 has a sense of unity.

A frame opening 521 is defined at a center of the inner frame 52. The frame opening 521 has a size somewhat less than that of the plate opening 511 and has a structure in which the transparent display assembly 60 is seated thereon. Also, the frame opening 521 may have a size less than that of the front panel 61 and greater than that of the rear panel 65. Thus, when the transparent display assembly 60 is mounted, the rear panel 65 may successively pass through the plate opening 511 and the frame opening 521 and then be seated on the door linear 56.

Also, the inner frame 52 may have a coupling structure with the outer plate 51. Here, the outer plate 51 and an end of the transparent display assembly 60 may be mounted on the inner frame 52 in a state in which the outer plate 51 and the end of the transparent display assembly 60 are closely attached to each other.

Figure 8:
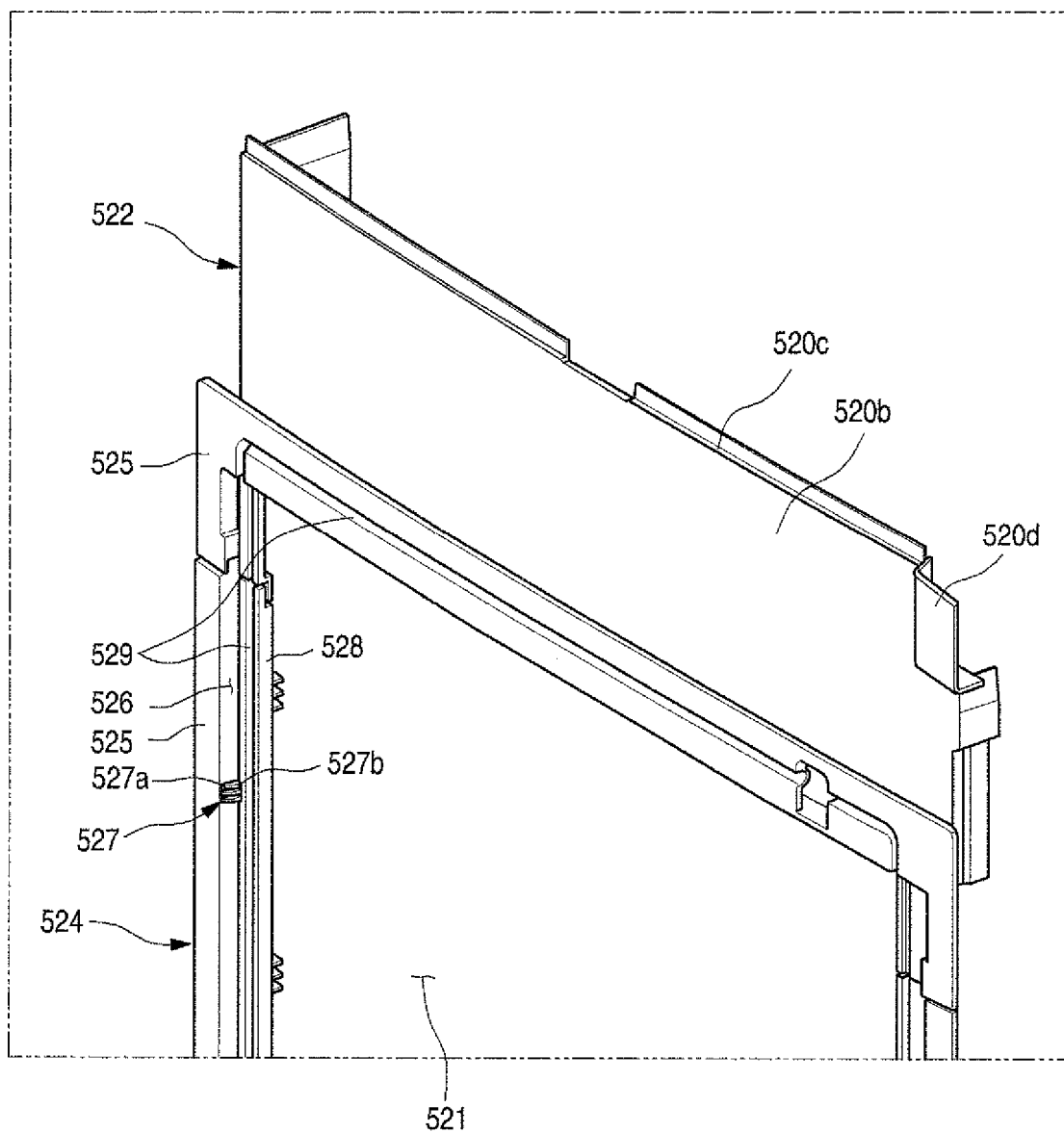
FIG. 8 is a partial perspective view illustrating an upper portion of an inner frame when viewed from a front side according to the first embodiment.
Figure 9:
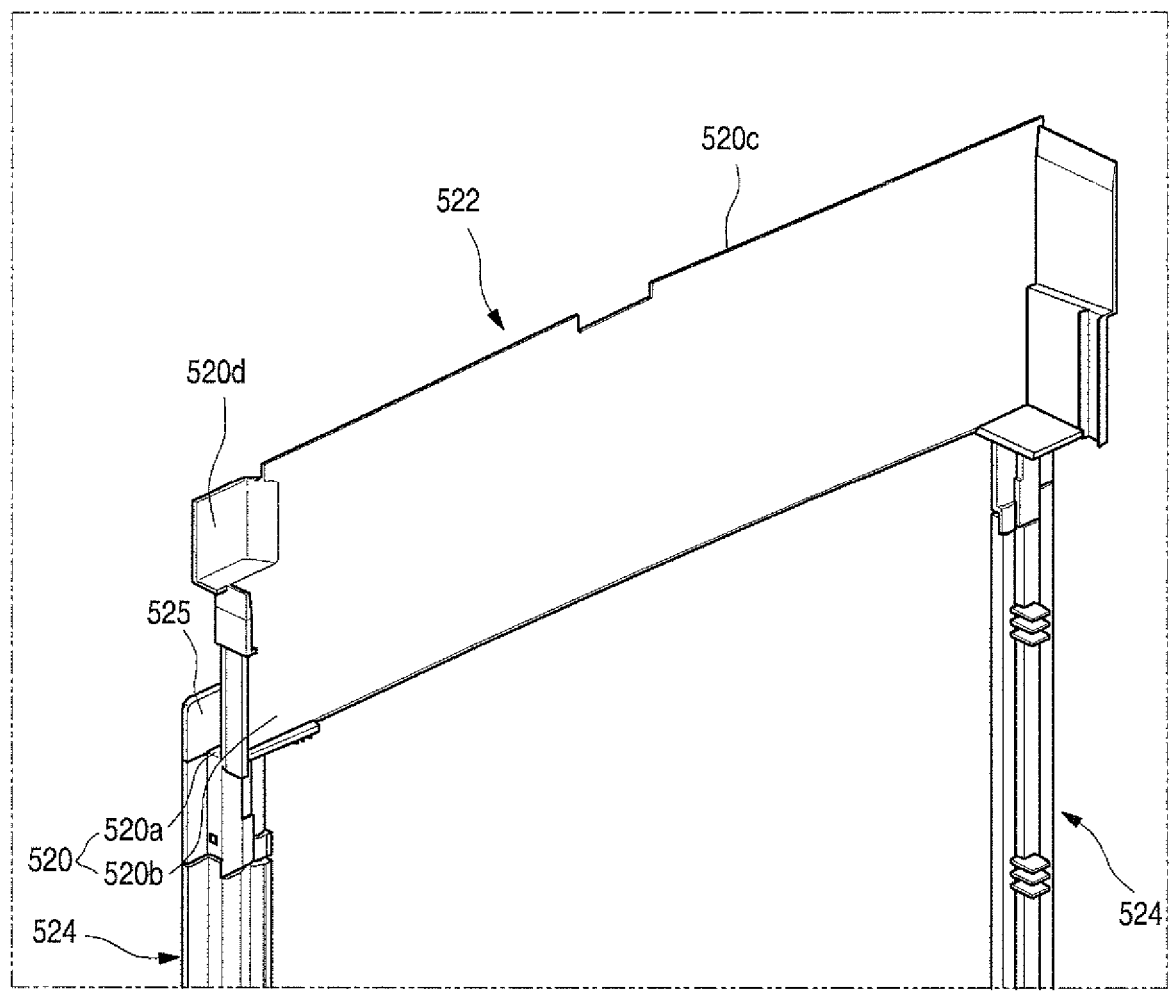
FIG. 9 is a partial perspective view of the upper portion of the inner frame when viewed from a rear side.

Also, FIG. 8 is a partial perspective view illustrating an upper portion of the inner frame when viewed from a front side according to the first embodiment. Also, FIG. 9 is a partial perspective view of the upper portion of the inner frame when viewed from a rear side.

As illustrated in the drawings, the inner frame 52 has a rectangular frame shape, and the frame opening 521 is defined in the center of the inner frame 52. Also, the inner frame 52 has a predetermined width to fix the outer plate 51 and also support the transparent display assembly 60.

That is, the front surface of the inner frame 52 may have a portion coming into contact with the rear surface of the outer plate 51 and the other portion supporting a rear portion of the front panel 61 defining the front surface of the transparent display assembly 60.

In detail, the inner frame 52 may include a plate support part 525, a plate accommodation groove 526, a front panel support part 528, and a heater accommodation groove 529 as a whole.

The plate support part 525 may define the outermost portion of the inner frame 52 and have a flat front surface. Also, the plate support part 525 may be closely attached to the rear surface of the outer plate 51. That is, a circumference of the outermost portion of the inner frame 52 may support the rear surface of the outer plate 51 and adhere to the rear surface of the outer plate 51 by an adhesion member 692 or a member for adhesion such as a double-sided tape.

The plate support part 525 may be disposed on all of an upper frame 522, a lower frame 523, and side frames 524, which constitute the inner frame 52, and be disposed along the circumference of the inner frame 52 to define an outer appearance of the inner frame 52.

The plate accommodation groove 526 may be recessed from an end of the plate support part 525 and inserted into the opening bent part 514 that is bent along the opening of the outer plate 51.

Thus, in a state in which the outer plate 51 adheres to the upper frame 522, the opening bent part 514 may be in the state of being inserted into the plate accommodation groove 526. Also, the opening bent part 514 may come into contact with the end of the transparent display assembly 60 in the state of being inserted into the plate accommodation groove 526 and thus be closely attached between the outer plate 51 and the front surface of the transparent display assembly 60 without generating a gap.

The plate accommodation groove 526 may be defined in the side frames 524 and the lower frame 523 except for the upper frame 522. Also, the opening bent part 514, which defines the upper end, of the plate opening 511 may be closely attached to an inner end of the upper frame 522 so that the whole of the opening bent part 514 of the outer plate 51 may be supported by the inner frame 52.

Also, a guide rib 527 may be disposed on an end that connects the plate support part 525 to the bottom of the plate accommodation groove 526. The guide rib 527 guides the opening bent part 514 so that the opening bent part 514 is maintained in an accurate position in the state in which the opening bent part 514, which is inserted into the plate accommodation groove 526, is inserted into the plate accommodation groove 526.

The guide rib 527 may protrude to come into contact with an inner surface of the opening bent part 514 and extend to a direction that crosses perpendicular to the extension direction of the opening bent part 514. A plurality of guide ribs 527 may be disposed adjacent to each other. As illustrated in the drawing, three guide ribs 527 may be successively disposed adjacent to each other. In this structure, the guide ribs 527 may be disposed at a predetermined interval to entirely support the opening bent part 514 along the circumference of the opening bent part 514.

The guide rib 527 may extend from one side of the inner surface of the plate accommodation groove 526 to the bottom surface of the plate accommodation groove 526. Also, the guide rib 527 may protrude more and more from a position that is close to the plate support part 525 to form an inclined part 527a having inclination. Thus, when the opening bent part 514 is inserted into the plate accommodation groove 526, the opening bent part 514 may be inserted along the inclined part 527a.

Also, a vertical part 527b may be disposed on an end of the inclined part 527a. The vertical part 527b may come into contact with the inner surface of the opening bent part 514 to support the opening bent part 514. Thus, the opening bent part 514 may be supported by the vertical part 527*b* in the state in which the opening bent part 514 is completely inserted into the plate accommodation groove 526.

A front panel support part 528 may be disposed at an inner side of the plate accommodation groove 526. The front panel support part 528 may support the rear surface of the front panel 61 that defines the front surface of the transparent display assembly 60. The front panel support part 528 may be disposed at a rear side of the plate support part 525 and be stepped with respect to the plate support part 525.

An adhesion member 693 such as a double-sided tape may be attached to a front surface of the front panel support part 528, or an adhesive may be applied to the front surface of the front panel support part 528 to adhere to the rear surface of the front panel 61. Here, a height difference between the front panel support part 528 and the plate support part 525 may correspond to a thickness of the front panel 61. Thus, a stepped portion or a gap may not occur in the front surface of the sub door 50. Also, an outer end of the transparent display assembly 60 and an end of the plate opening 511 of the outer plate 51 may be disposed on the same plane so that the entire front surface of the sub door 50 has a sense of unity without being stepped. Also, the front panel support part 528 may also be disposed along the side frames 524 and the lower frame 523 except for the upper frame 522.

A heater accommodation groove 529 may be defined in the front panel support part 528. The heater accommodation groove 529 may heat the circumference of the transparent display assembly 60 coming into the contact with the front panel support part 528 to prevent dew from being generated on the transparent display assembly 60 and be disposed along the front panel support part 528.

The heater accommodation groove 529 may have a shape corresponding to that of a heater 532. The heater accommodation groove 529 may completely accommodate the heater 532 so that the rear surface of the front panel 61 seated on the front panel support part 528 when the front panel 61 is mounted. Here, the heater 632 may come into contact with the rear surface of the front panel 61.

As illustrated in FIGS. 8 and 9, a frame barrier 520 may be disposed on an upper end of the upper frame 522. The frame barrier 520 may partition the inside of the sub door 50, which is provided above the upper frame 522, into front and rear sides and extend from the rear surface of the upper frame 522 to the upper cap deco 54.

In more detail, the frame barrier 520 may include an extension part 520*a* extending backward from the rear surface of the upper frame 522 and a barrier part 520*b* extending upward from an end of the extension part 520*a*.

The extension part 520*a* may extend from an inner end of the upper frame 522, which define the frame opening 521. The outer plate 51 may be away from the barrier part 520*b* according to an extending length of the extension part 520*a* to provide a space, in which an insulation material 531 is foamed and filled, between the outer plate 51 and the barrier part 520*b*.

The barrier part 520*b* may connect the extending end of the extension part 520*a* to the bottom surface of the upper cap deco 54 to partition the upper end of the sub door 50 into front and rear portions. Thus, the front space of the barrier part 520*b* may be an insulation space in which the insulation material 531 is provided. Also, PCBs for controlling the electric modules within the sub door 50 such as the transparent display assembly 60, the door light 57, and the heater 532 may be disposed in the rear space of the barrier part 520*b*. The electric modules may include all of electric devices and components, which are provided in the door and further include a touch sensor 612 and a display light 68.

An insertion rib 520*c* that is inserted into a barrier coupling part 541*e* disposed on the bottom surface of the upper cap deco 54 may protrude from the upper end of the barrier part 520*b*. Thus, the barrier part 520*b* may be maintained in the state of being firmly fixed by the coupling with the bottom surface of the upper cap deco 54 and allow the front portion and the rear portion of the upper portion of the sub door 50 to be completely partitioned from each other.

Also, a hinge avoiding part 520*d* for avoiding an interference with a sub upper hinge 501 for the rotation of the sub door 50 may be further disposed on one end of the upper end of the barrier part 520*b*. The hinge avoiding part 520*d* may be disposed on one end of the barrier part 520*d* and define a space protruding forward.

The PCB may be disposed in the upper space of the sub door 50, i.e., disposed in a space between the front barrier 520 and the door linear 56. As occasion demands, at least a portion of the upper cap deco 54 may be opened so that heat generated from the PCB is released to the outside of the sub door 50.

Figure 10:
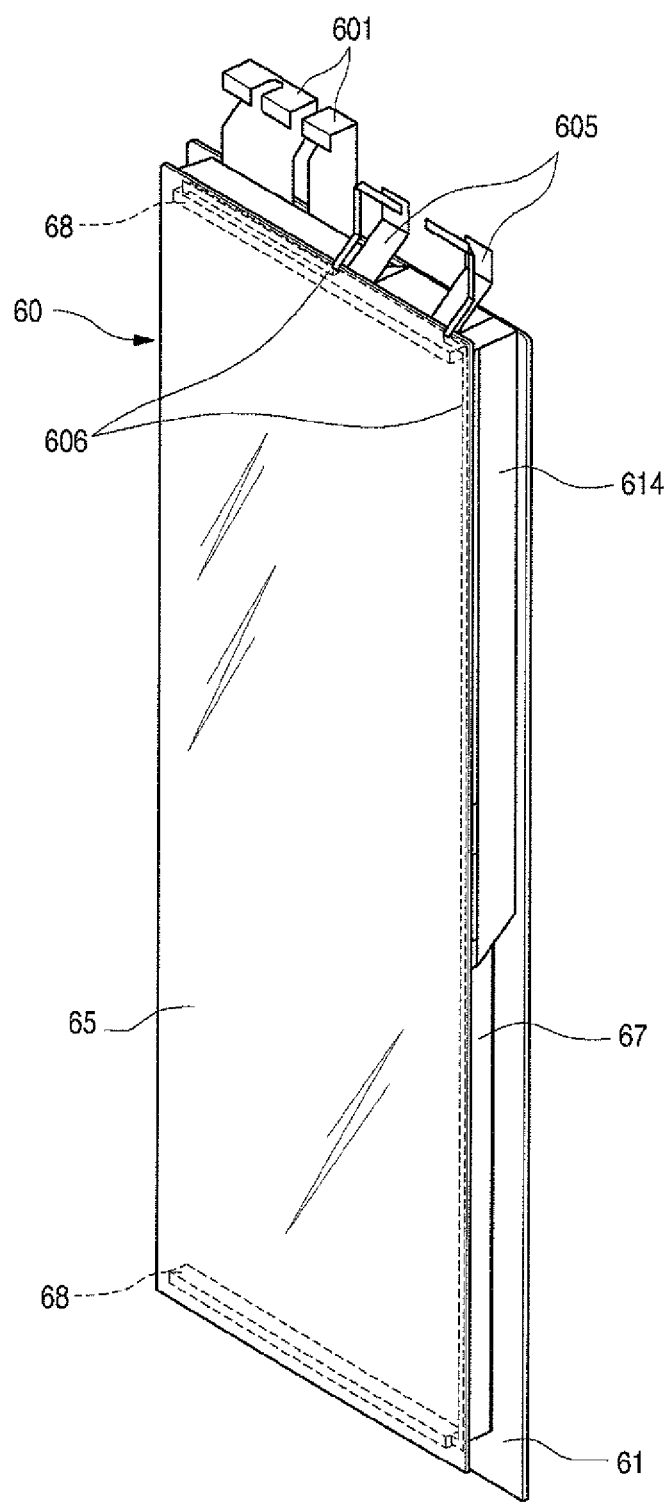
FIG. 10 is a perspective view of a transparent display assembly according to the first embodiment.
Figure 12:
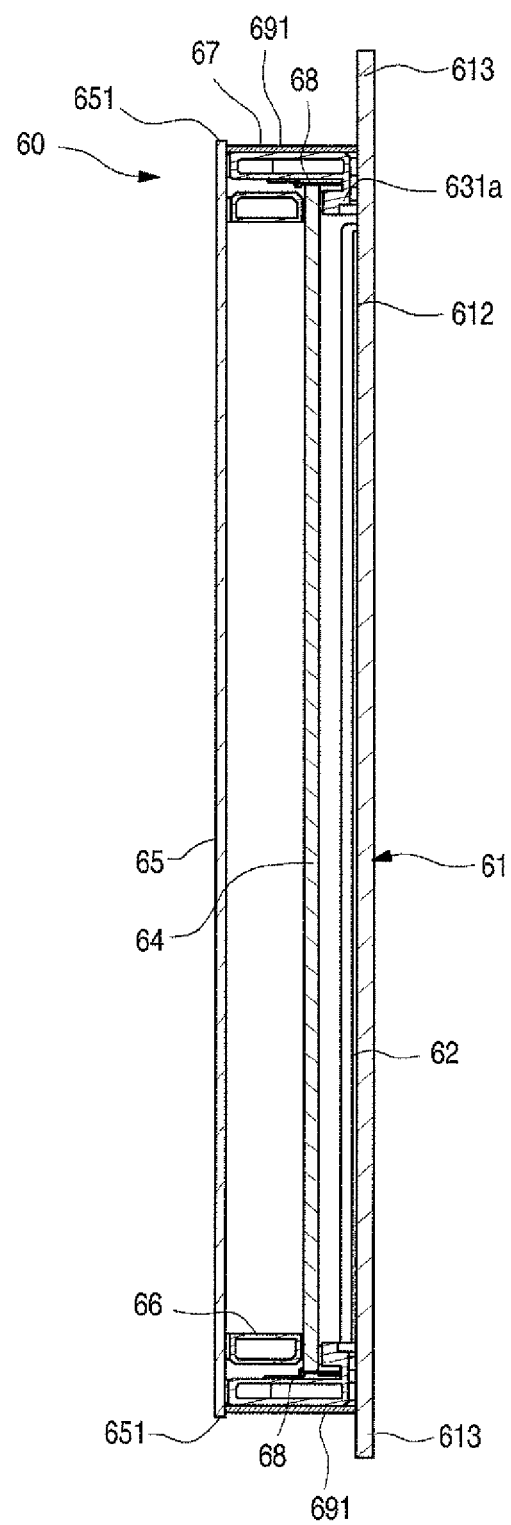
FIG. 12 is a cross-sectional view of the transparent display assembly.

FIG. 10 is a perspective view of the transparent display assembly according to the first embodiment. Also, FIG. 11 is an exploded perspective view of the transparent display assembly. Also, FIG. 12 is a cross-sectional view of the transparent display assembly.

As illustrated in the drawings, the transparent display assembly 60 may have a size that is enough to cover the plate opening 511 and the linear opening 561 inside the sub door 50. Also, the see-through part 21 may be provided in the transparent display assembly 60 so that the inner space of the refrigerator is selectively seen, and a screen is outputted.

In more detail with respect to the transparent display assembly 60, the transparent display assembly 60 may have an outer appearance that is defined by the front panel 61 and the rear panel 65, which define the front and rear surfaces of the transparent display assembly 60, and the module frame 67 connecting the front panel 61 to the rear panel 65.

Also, a display 62 and a light guide plate 64 may be disposed between the front panel 61 and the rear panel 65. In addition, a spacing rod 63 for supporting the display 62 and the light guide plate 64 may be further provided, and a display light 68 for emitting light to the light guide plate 64 may be provided.

In more detail, the front panel 61 may be made of a transparent glass material (e.g., blue glass) that defines an outer appearance of the front surface of the transparent display assembly 60. The front panel 61 may be made of a different material through which the inside of the front panel 61 is seen, and a touch input is enabled.

The front panel 61 may have a size greater than that of the plate opening 511 and be supported by the inner frame 52. That is, when the transparent display assembly 60 is assembled and mounted from the rear side, a circumferential portion of the front panel 61 may be supported by the rear surface of the inner frame 52.

In detail, a front protrusion 613 that further protrudes outward than the rear panel may be disposed on the front panel 61. The front protrusion may have a length greater than that of the rear panel 65 in all directions. Also, the front panel 61 defining the front surface of the transparent display assembly 60 may further extend outward from the plate opening 511 and then be stably fixed and mounted on the inner frame 52 due to characteristics of the transparent display assembly 60 mounted on at the rear side of the outer plate 51.

Thus, when the transparent display assembly 60 is mounted, each of the extending ends of the front panel 61, i.e., the front protrusion 613 may be supported by the inner frame 52, and thus, the transparent display assembly 60 may be stably maintained in the mounted state without being separated.

A bezel 611 may be disposed on a circumference of the rear surface of the front panel 61. The bezel 611 may be printed with a black color and have a predetermined width so that the module frame 67 and the spacing rod 63 are covered without being exposed to the outside.

Also, the heater 532 may be disposed along the bezel 611. Thus, the heater 532 may heat the circumference of the front panel 61 adjacent to the outer plate 51 while being covered by the bezel 611 without being exposed to the outside to prevent dew from being generated on the front surface of the front panel 61.

A touch sensor 612 may be disposed on an inner area of the bezel 611. The touch sensor 612 may be formed on the rear surface of the front panel 61 in a printing manner and be configured to detect user's touch manipulation of the front panel 61. Alternatively, the touch sensor 612 may be formed in various manners such as a film adhesion manner, rather than the printing manner, so that the user touches the front panel 61 to perform the touch input.

A touch cable 601 connected to the touch sensor 612 may be disposed on the upper end of the front panel 61. The touch cable 601 may be provided as a flexible film type cable such as a flexible flat cable (FFC) or a flexible print cable or flexible print circuit board (FPC). A printed circuit may be printed on the touch cable 601 to constitute at least a portion of a touch PCB 603. Also, the touch cable 601 may be connected to the touch PCB 603 that will be described below in detail.

The display 62 may be disposed on the rear surface of the front panel 61. The display 62 may be provided as an LCD module for outputting a screen. Also, the display 62 may be transparent so that the user sees the inside through the display 62 when the screen is not outputted.

A source board 621 may be disposed on one end of both left and right sides of the display 62. The source board 621 may be configured to output a screen through the display 62 and provided as one assembly with the display 62. Also, a portion of the source board 621 may include the flexible film type cable structure and extend upward along a side surface of the transparent display assembly 60 in the bent state.

Also, the source board 621 may have a width less than a thickness of the transparent display assembly 60 and be bent while the transparent display assembly 60 is assembled. Here, a position at which the source board 621 is disposed may be defined between the inside of the module frame 67 and the spacing rod 63 and come into contact with an inner surface of the module frame 67 in the bent state.

Also, the source board 621 may be connected to a display cable 605. The display cable 605 may be connected to a T-CON board 623 at an upper portion of the sub door 50.

In detail, when the source board 621 is disposed on the rear surface of the display 62, the source board 621 may be exposed to the outside through the see-through part 21 due to the characteristics of the display 62 that is transparent. Also, when the source board 621 has a structure that protrudes laterally, the sub door 50 may increase in size.

Thus, the source board 621 may be disposed on an end of a circumferential side of the display 62 and bent to come into contact with the inner surface of the module frame 67 inside the module frame 67. Also, the source board 621 may have a size corresponding to that of the module frame 67 without getting out of a region of the module frame 67 in a state of being closely attached to the module frame 67.

The source board 621 may be constituted by two upper and lower boards 621 and respectively connected to the pair of display cables 605. The display cable 605 may have a flexible and flat structure like the touch cable 601 and also have a structure that is freely bendable.

The display cable 605 may extend along the circumferential surface of the transparent display assembly 60 and pass through a sealant 691 defining the side surface of the transparent display assembly 60 to extend to the outside of the transparent display assembly 60.

Also, the display cable 605 may be bent to extend along the circumferential surface of the transparent display assembly 60, i.e., be bent so that an end thereof extends upward from the transparent display assembly 60. Thus, the display cable 605 may be coupled to the T-CON board 602 at the upper side of the sub door 50.

Both ends of the display 62 may be supported by the spacing rod 63. The spacing rod 63 may have a rod shape that extending from an upper end to the lower end of the display 62 and be constituted by a first spacing rod 631 and a second spacing rod 632.

The light guide plate 64 may be disposed at a rear side of the display and disposed to be spaced a predetermined distance from the display 62 by the first spacing rod 631 and the second spacing rod 632. There may be a difference in depth feeling of the screen outputted from the display 62 according to the position of the light guide plate 64.

Thus, the light guide plate 64 may be disposed further forward than an intermediate point between the front panel 61 and the rear panel 65 so that the screen outputted by the display 62 is felt closer to the front panel 61. As a result, a height of each of the first spacing rod 631 and the second spacing rod 632 may be determined.

The light guide plate 64 may diffuse or scatter light emitted from the display light 68 and be made of various materials. For example, the light guide plate 64 may be made of a polymer material or formed by forming a pattern or attaching a film on a surface thereof. The light guide plate 64 may illuminate the display 62 from the rear side of the display 62 when the display light 68 is turned on. For this, the light guide plate 64 may have a plate shape having a size equal to or somewhat greater than that of the display 62. The display light 68 may be disposed at a position corresponding to each of upper and lower ends of the light guide plate 64.

The rear panel 65 may be disposed at a rear side of the light guide plate 64. The rear panel 65 may define the rear surface of the transparent display assembly 60 and have a size greater than that of the light guide plate and less than that of the front panel 61. Also, the rear panel 65 may have a size greater than that of the linear opening 561 to cover the linear opening 561.

A circumference of the rear panel 65 may further protrude outward from the module frame 67 to provide a rear panel protrusion 651. The rear panel protrusion 651 may be seated on the door linear 56 when the transparent display assembly 60 is mounted and provide a space in which a foaming solution is filled when the insulation material 531 is molded in the sub door 50.

The rear panel 65 may be made of low-ε glass to realize thermal insulation. A low radiation coating layer may be formed on a surface of glass for general insulation to form the low-ε glass, and thus, the low-ε glass may have excellent thermal insulation. As a result, the rear panel 65 may prevent heat of cool air within the refrigerator from being transferred to the outside through the transparent display assembly 60.

A spacer 66 may be disposed between the rear panel 65 and the light guide plate 64. The spacer 66 may have a rectangular frame shape disposed along a circumference of the light guide plate 64 and adhere to the light guide plate 64 and the rear panel 64 to maintain a predetermined distance between the light guide plate 64 and the rear panel 65.

The distance between the front panel 61 and the light guide plate 64 may be maintained in fixed distance so as to output the screen of the display 62. Also, the distance between the light guide plate 64 and the rear panel 65 may be determined according to a thickness of the sub door 50 or the total thickness of the transparent display assembly 60. That is, the spacer 66 may be adjusted in thickness to determine the total thickness of the transparent display assembly 60 so as to be mounted to match a specification of the sub door 50.

The rear panel 65 may come into contact with the door light 57. Thus, a distance between the display 62 and the door light 57 may be determined according to the position of the rear panel 65. The door light 57 may serve as an auxiliary backlight of the display 62 in the turn-on state.

In detail, a distance between the display 62 and the door light 58 may range from about 5 cm to about 15 cm. When the distance between the display 62 and the door light 57 is less than about 5 cm, a shade may occur. When the distance between the display 62 and the door light 57 exceeds about 5 cm, the door light may not serve as the backlight. Thus, to maintain the distance between the display 62 and the door light 57, the rear panel 65 may also be maintained to be spaced a predetermined distance from the display 62, and thus, the width of the spacer 66 may be determined.

A gap between the light guide plate 64 and the rear panel 65 may be sealed by the spacer 66. Thus, a space between the spacer 66 and the light guide plate 64 may become to a vacuum state, or an insulative gas such as argon may be injected for the thermal insulation to more improve the thermal insulation performance.

In the state in which the rear panel 65 adheres to the spacer 66, an outer end of the rear panel 65 may further extend outward from the spacer 66. Also, the module frame 67 may be mounted on the outer end of the rear panel 65 so that the rear panel 65 and the front panel 61 are fixed to each other.

The module frame 67 may connect the rear surface of the front panel 61 to the front surface of the rear panel 65 and also define the circumferential surface of the transparent display assembly 60. Also, a space in which the display light 68 is mounted may be provided in an inner surface of the module frame 67.

The module frame 67 may have a rectangular frame shape. Also, the module frame 67 may have a size in which the light guide plate 64 and the spacing rod 63 are accommodated. Also, the display light 68 may be mounted on each of the upper and lower ends of the module frame 67. The light guide plate 64 may be disposed between the display lights 68 disposed on the upper and lower ends of the module frame 67.

Thus, light emitted through the display light 68 may be directed to an end of the light guide plate 64 and then travel along the light guide plate 64 so that the entire surface of the light guide plate 64 emits light.

The display lights 68 disposed on the inner upper and lower ends of the transparent display assembly 60 may be connected to a display light cable 606. The display light cable 606 may have a flexible and flat shape like the touch cable 601 and the display cable 605.

The display light cable 606 may be connected to the display light 68 that is mounted inside the module frame 67 to extend to the outside of the transparent display assembly 60 through the sealant 691.

Also, the display light cable 606 may extend along the circumference of the transparent display 62 so that the display light cable 606 is not exposed through the transparent display 62. Also, the display light cable 606 may extend upward in a state of being closely attached to the rear surface of the rear panel 65. As occasion demands, the display light cable 606 may be bent in the state of adhering to the rear surface of the rear panel 65 and then may be connected to a docking PCB 604 disposed on the upper portion of the sub door 50.

Here, since the display light cable 606 extends in the state of being closely attached to a rear surface of the rear protrusion 651 of the rear panel 65, when the sub door 50 is viewed from the outside, the display light cable 606 may not be exposed through the transparent display assembly 60.

The sealant 691 may be applied to the circumference of the module frame 67. The sealant 691 may be applied to form the circumferential surface of the transparent display assembly 60. That is, the sealant 691 may form a circumferential surface between the front panel 61 and the rear panel 65.

The sealant 691 may seal the transparent display assembly 60 to prevent air from being introduced into the transparent display assembly 60 and be made of a polysulfide (that is called a thiokol) material. As occasion demands, the sealant 691 may be made of a different sealant material such as silicon or urethane so that the sealant 691 comes into direct contact with the foaming solution that is injected to mold the insulation material 531.

The sealant 691 may maintain the coupling of the module frame 67, the front panel 61, and the rear panel 65 and completely seal the connected portions of the components to prevent water or moisture from being introduced. Also, the sealant 691 may be a portion, which comes into directly contact with the foaming solution when the insulation material 531 is molded, and protect the circumference of the transparent display assembly 60.

Also, the sealant 691 may allow cables 601, 605, and 606 connected to the touch sensor 612, the display panel 62, and the display light 68 within the transparent display assembly 60 to be accessible therethrough. The sealant 691 may cover outer surfaces of the cables 601, 605, and 606 to prevent water or moisture from being introduced through spaces through which the cables 601 605, and 606 are accessible when the cables 601 605, and 606 extent through the circumferential surface of the transparent display assembly 60.

Figure 13:
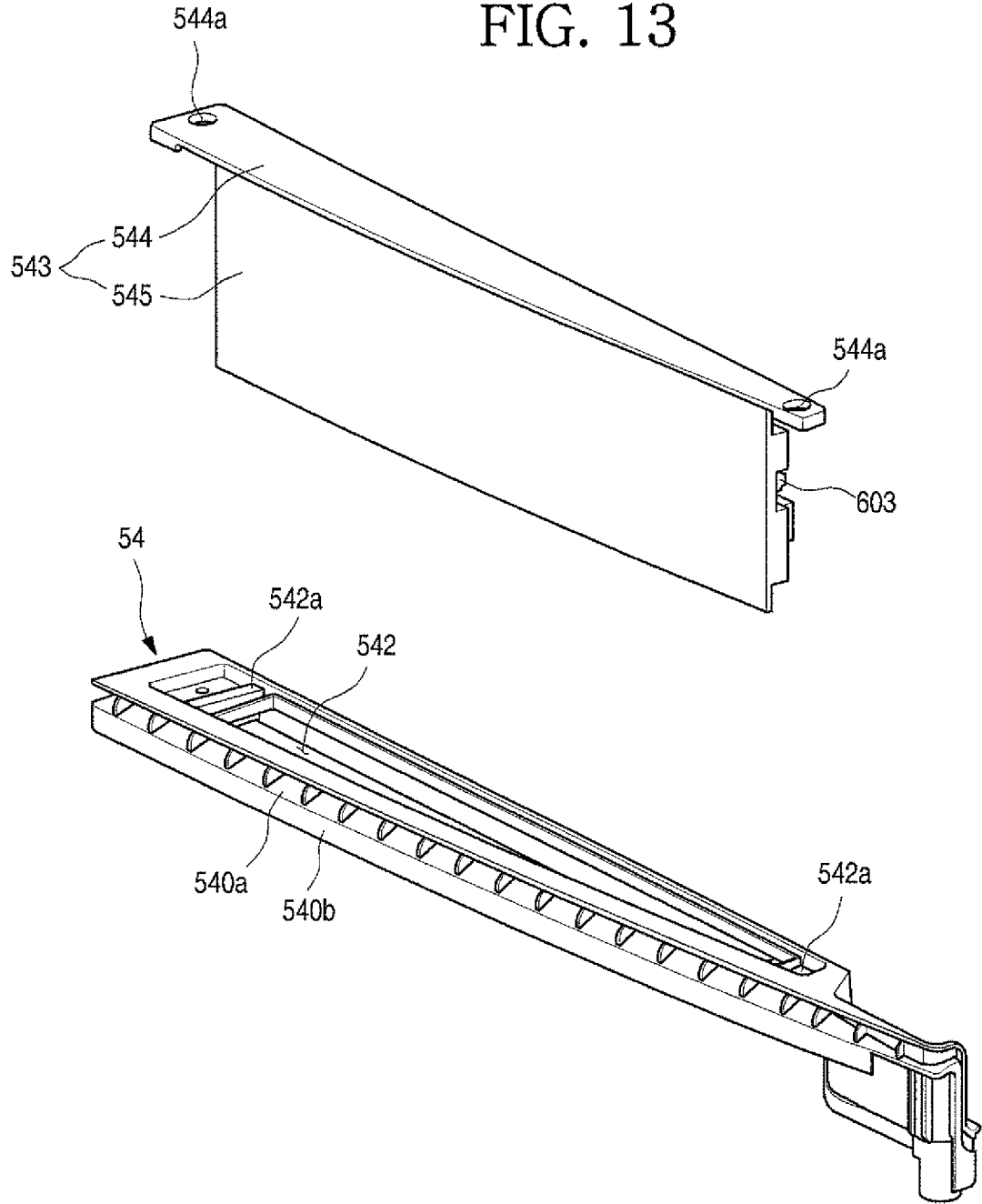
FIG. 13 is an exploded perspective view of a coupling structure between a cap deco and a PCB according to the first embodiment.
Figure 14:
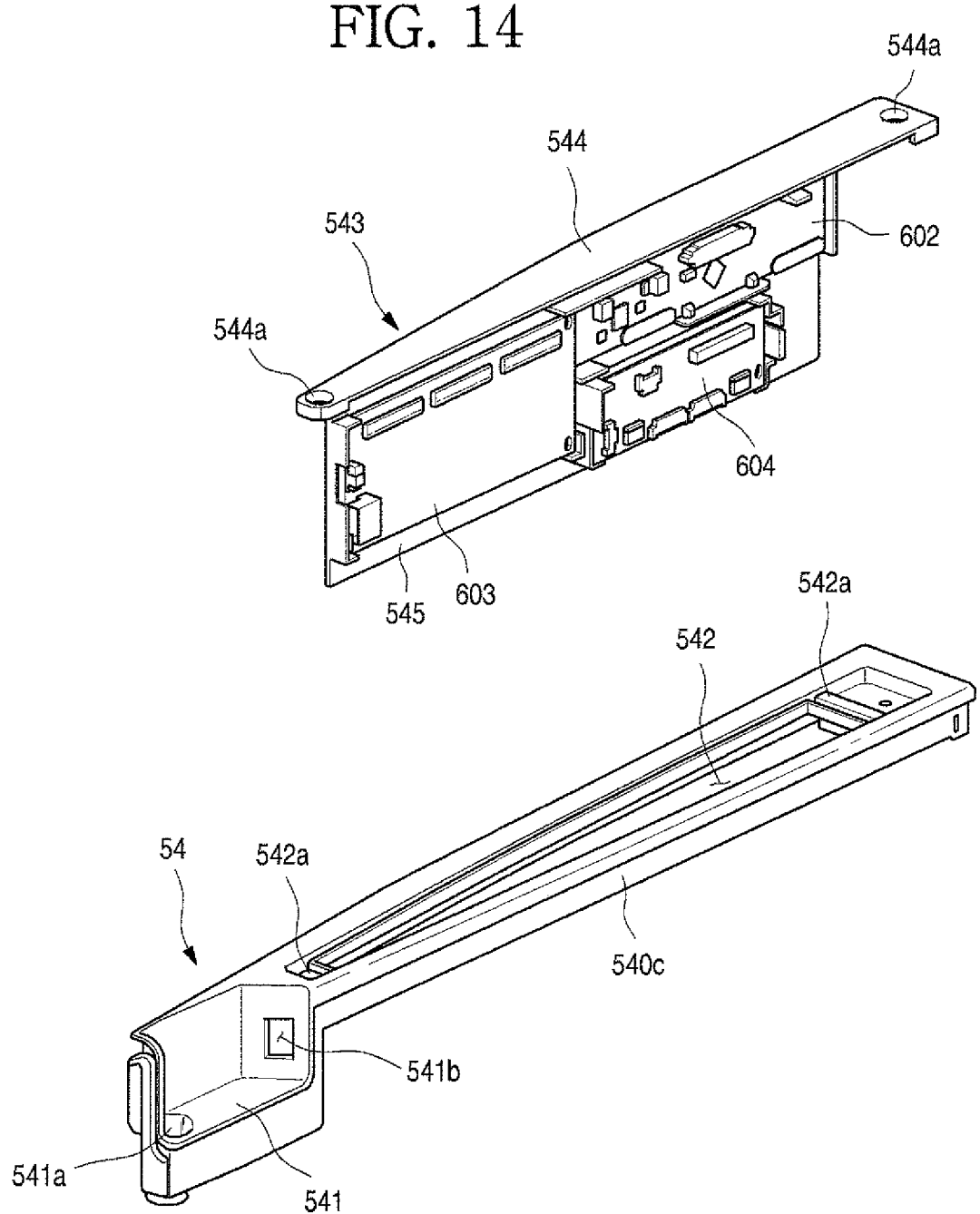
FIG. 14 is an exploded perspective view of the coupling structure between the cap deco and the PCB according to the first embodiment.
Figure 15:
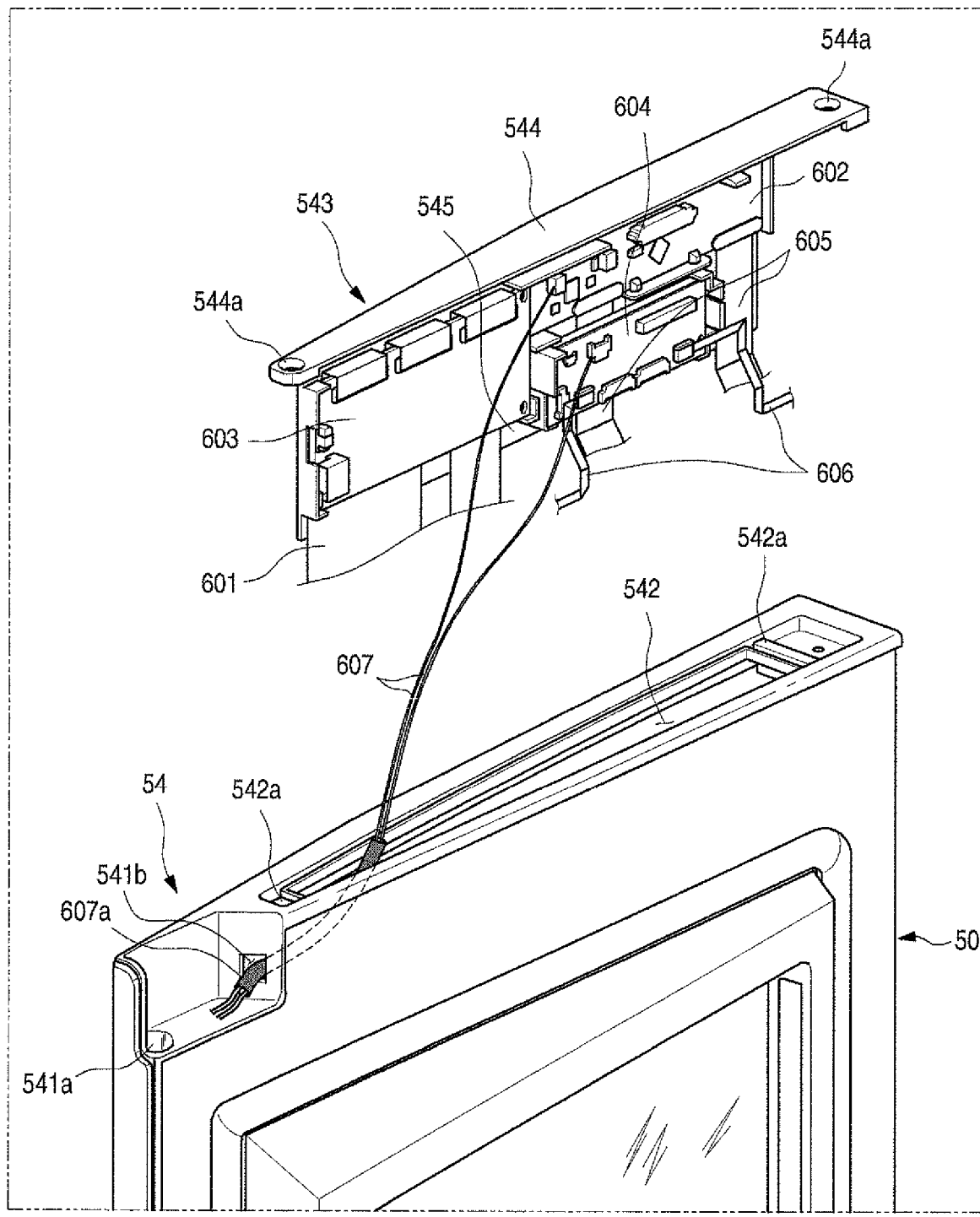
FIG. 15 is an exploded perspective view illustrating a structure in which the PCB is mounted on the sub door.
Figure 16:
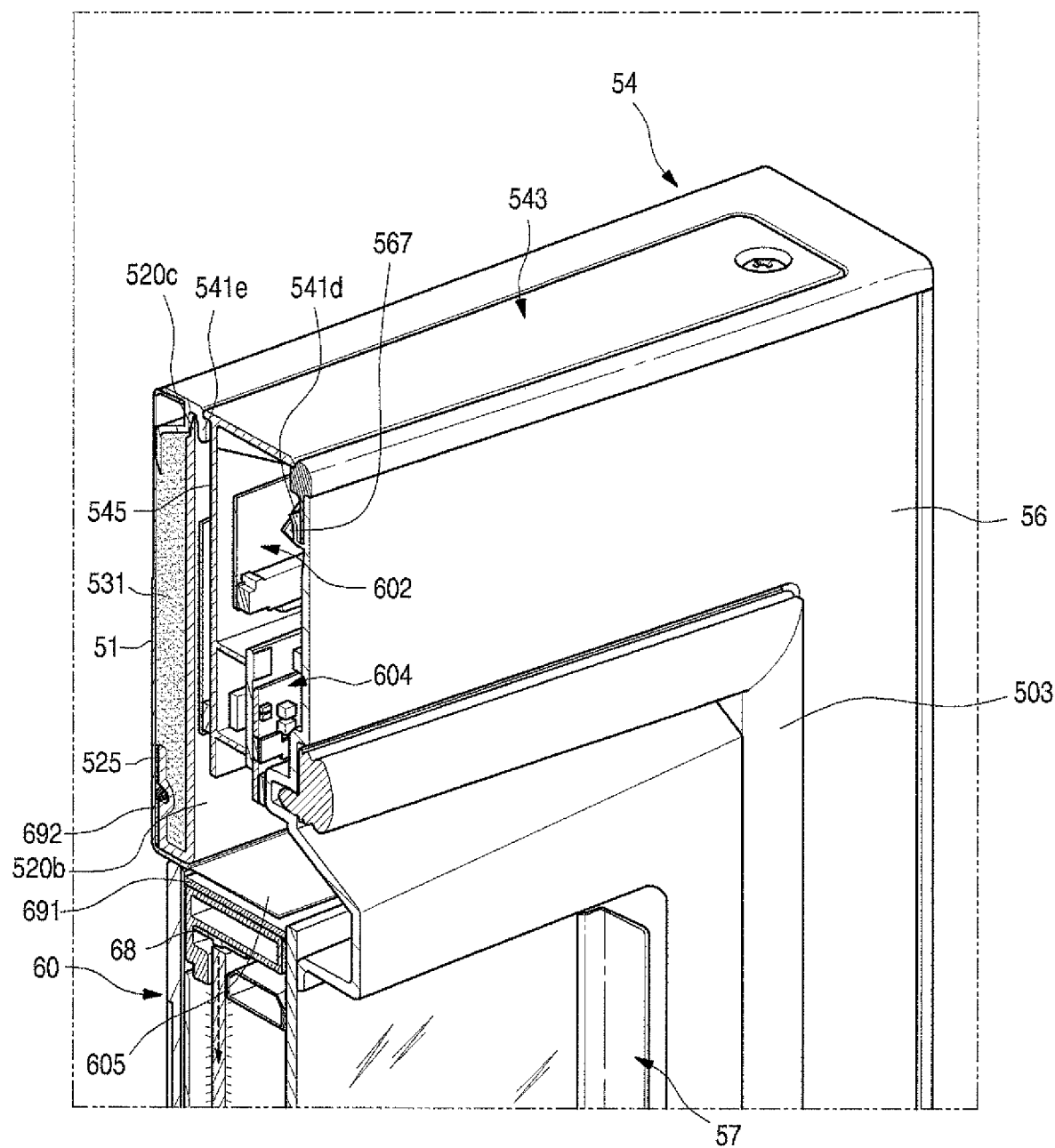
FIG. 16 is a cut-away perspective view illustrating an upper end of the sub door.

FIG. 13 is an exploded perspective of a coupling structure between the cap deco and the PCB according to the first embodiment. Also, FIG. 14 is an exploded perspective view of the coupling structure between the cap deco and the PCB according to the first embodiment. Also, FIG. 15 is an exploded perspective view illustrating a structure in which the PCB is mounted on the sub door. Also, FIG. 16 is a cut-away perspective view illustrating an upper end of the sub door.

As illustrated in the drawings, the upper end of the sub door 50 may be defined by the upper cap deco 54, and the upper cap deco 54 may be coupled to the upper end of the outer plate 51 and the upper end of the door linear 56.

For this, a plate insertion part 540*a* into which the upper end of the outer plate 51 is inserted may be defined in a circumference of a front surface of the upper cap deco 54. Also, a plate contact part 540*b* coming into contact with the rear surface of the outer plate 51 may be disposed below the plate insertion part 540*a*. Also, a closed space in which the insulation material 531 is provided may be defined by the plate contact part 540*b* and the upper end of the front surface of the inner frame 52.

A linear mounting part 540*c* coupled to a cap deco insertion part 567 defined in the upper end of the door linear 56 may be disposed on a circumference of a rear surface of the upper cap deco 54. The linear mounting part 540*c* may have a shape that extends downward. A lower end of the linear mounting part 540*c* may be inserted into the cap deco insertion part 567 so that the linear mounting part 540*c* and the cap deco insertion part 567 are coupled to each other.

Also, the barrier coupling part 541*e* may be disposed on the bottom surface of the upper cap deco 54. The barrier coupling part 541*e* may extend from one end to the other end of the upper cap deco 54 and be coupled to the insertion rib 520*c* disposed on the upper end of the barrier part 520*b*. Thus, the upper cap deco 54 and the barrier part 520*b* may be coupled to each other to partition an inner upper space of the sub door 50 into front and rear spaces.

The insulation material 531 may be disposed in the front space partitioned by the barrier part 520*b* to thermally insulate the sub door 50. The PCBs 602, 603, and 604 may be disposed in the rear space partitioned by the barrier part 520*b* to drive the plurality of electric modules provided in the sub door 50 in addition to the transparent display assembly 60.

Also, a deco opening 542 may be defined in a top surface of the upper cap deco 54, and a deco cover 543 may be disposed on the deco opening 542. The deco opening 542 may communicate with the rear space, which is defined by the barrier part 520*b*, of the upper cap deco 54. Thus, the deco cover 543 may be separated to open the space in which the PCBs 602, 603, and 604 are mounted.

The deco cover 543 may be detachably disposed on the upper cap deco 54, and the PCBs 602, 603, and 604 for driving the transparent display assembly 60 may be mounted on the deco cover 543. Thus, after the sub door 50 is foamed, the PCBs 602, 603, and 604 may be mounted on the deco cover 543, and then the PCBs 602, 603, and 604 may be inserted and mounted through the deco opening 542.

In detail, the deco cover 543 may be constituted by a cover part 544 covering the deco opening 542 and a PCB mounting part 545 on which the PCBs 602, 603, and 604 are mounted. The cover part 544 may have a shape corresponding to the deco opening 542. Also, a screw hole 544*a* may be defined in each of both sides of the cover part 544, and then, a coupling member such as a screw may be coupled in the state in which the upper cap deco 54 is mounted so that the cover part covers the deco opening 542.

A wire hole 541*b* may be defined in one side of the deco cover 543, i.e., in a wall of one side of the hinge mounting part 541. The wire hole 541*b* may be defined in one side of the PCB mounting part 545 to communicate with the space, in which the PCBs 602, 603, and 604 are disposed, of the spaces partitioned by the barrier part 520*b*.

The wire hole 541*b* may have a size through which the connection cable 607 connected to the control unit 14 is accessible and be introduced into the cabinet 10 along the upper hinge 401 or the cover covering the upper hinge 401. Thus, even when the sub door 50 is opened or closed, the connection cable 607 may pass through the sub door 50 and the cabinet 10 without interference.

The connection cable 607 may be a wire type cable and have a structure in which the connection cable 607 easily passes through the wire hole 541*b*. Also, the connection cable 607 may be provided in plurality. Here, the plurality of connection cables 607 may be protected by a cable cover 607*a* accommodating the plurality of connection cables 607. The cable cover 608*a* may be provided as a shrinkable tube or a tape. Also, the plurality of connection cables 607 may be accessed through the wire hole 541*b* in a state in which the plurality of connection cables 607 are bundled as one unit to prevent the bundle of the connection cables 607 from interfering with the cable cover 607*a*.

The plurality of PCBs 602, 603, and 604 may be connected to the cables 601, 605, and 606 exposed within the deco cover 543 before the deco cover 543 is mounted on the deco opening 542. In detail, in the state in which the plurality of PCBs 602, 603, and 604 are mounted on the PCB mounting part 545, the cables 601, 605, and 606 may be respectively connected to the PCBs 602, 603, and 604. The connection cable 607 introduced through the wire hole 541*b* may also be connected to the docking PCB 604 and the T-CON board, which will be described below in detail. In the state in which the connection of the cables 601, 605, and 606 are completed, the deco cover 543 may be mounted on the upper cap deco 54 to cover the deco opening 542.

Also, a cover support part 542*a* may be further disposed on each of both ends of the deco opening 542 to support both ends of the deco cover 543. The coupling member such as the screw may be coupled to the cover support part 542*a*.

The PCB mounting part 545 may extend downward from a bottom surface of the cover part 544. A front surface of the PCB mounting part 545, which faces the barrier part 520*b*, may have a flat shape, and the plurality of PCBs may be mounted on a rear surface of the PCB mounting part 545, which faces the door linear 56. As occasion demands, the plurality of PCBs 602, 603, and 604 may be disposed on both the front and rear surfaces of the PCB mounting part 545 so that all of the plurality of PCBs 602, 603, and 604 are disposed in the massed space.

The PCBs mounted on the PCB mounting part 545 may include the T-CON board 602, the touch PCB 603, and the docking PCB 604. The T-CON board 602 may include a display cable 605 for driving the display 62. The touch PCB 603 may process a touch input signal of the touch sensor 612 and include a touch cable 601 connected to the touch sensor 612. The docking PCB 604 may connect the cables 601, 605, and 606 connected to the PCBs 602, 603, and 604 to the connection cable 607 connected to the control unit 14 to guide the connection cable 607 that is a single or a lesser number of wire cables, in which the plurality of flat cables 601, 605, and 606 are integrated with each other, to the outside of the sub door 50.

Figure 17:
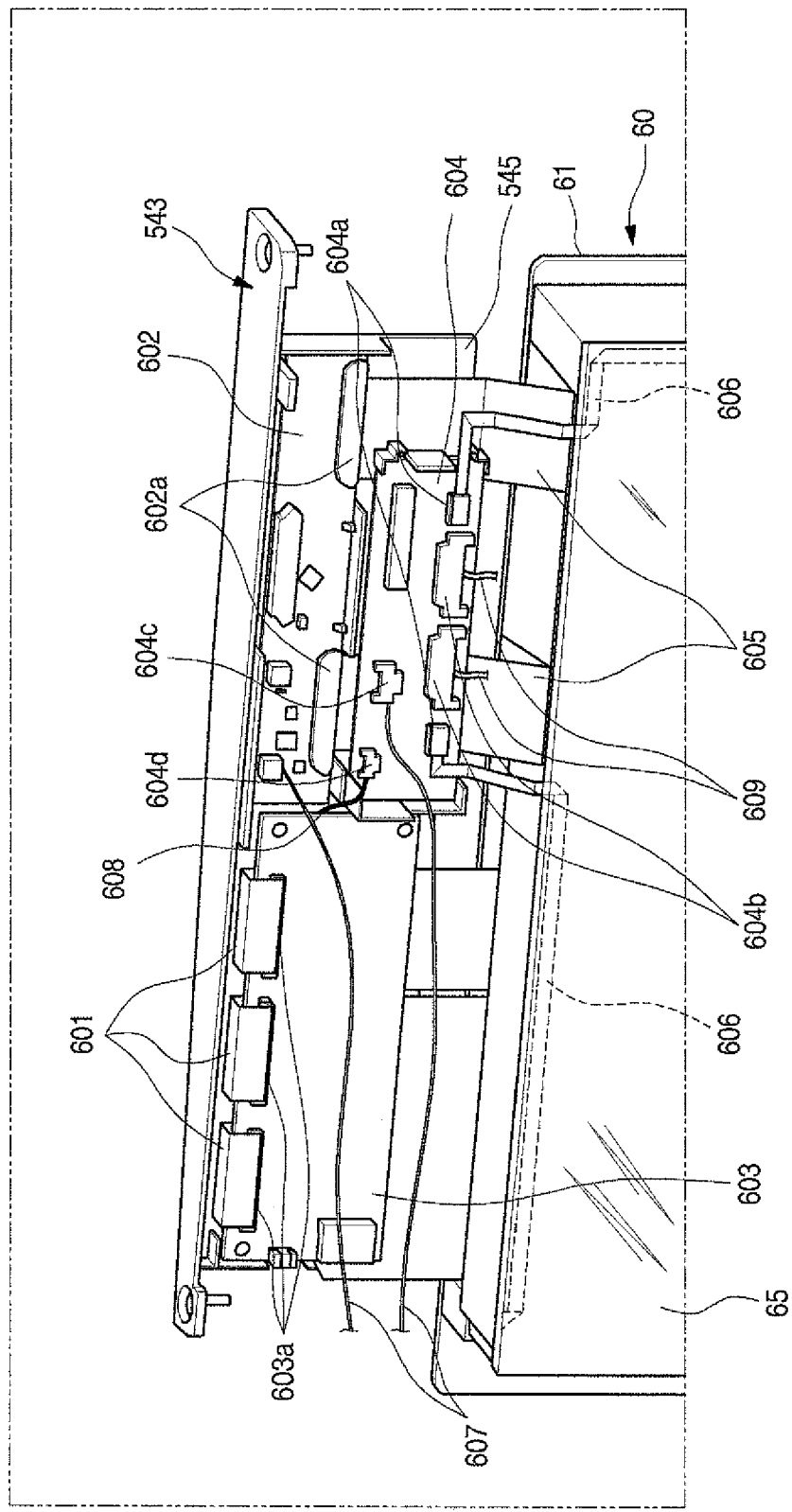
FIG. 17 is a partial perspective view illustrating a connection structure between cables and PCBs of the transparent display assembly.
Figure 18:
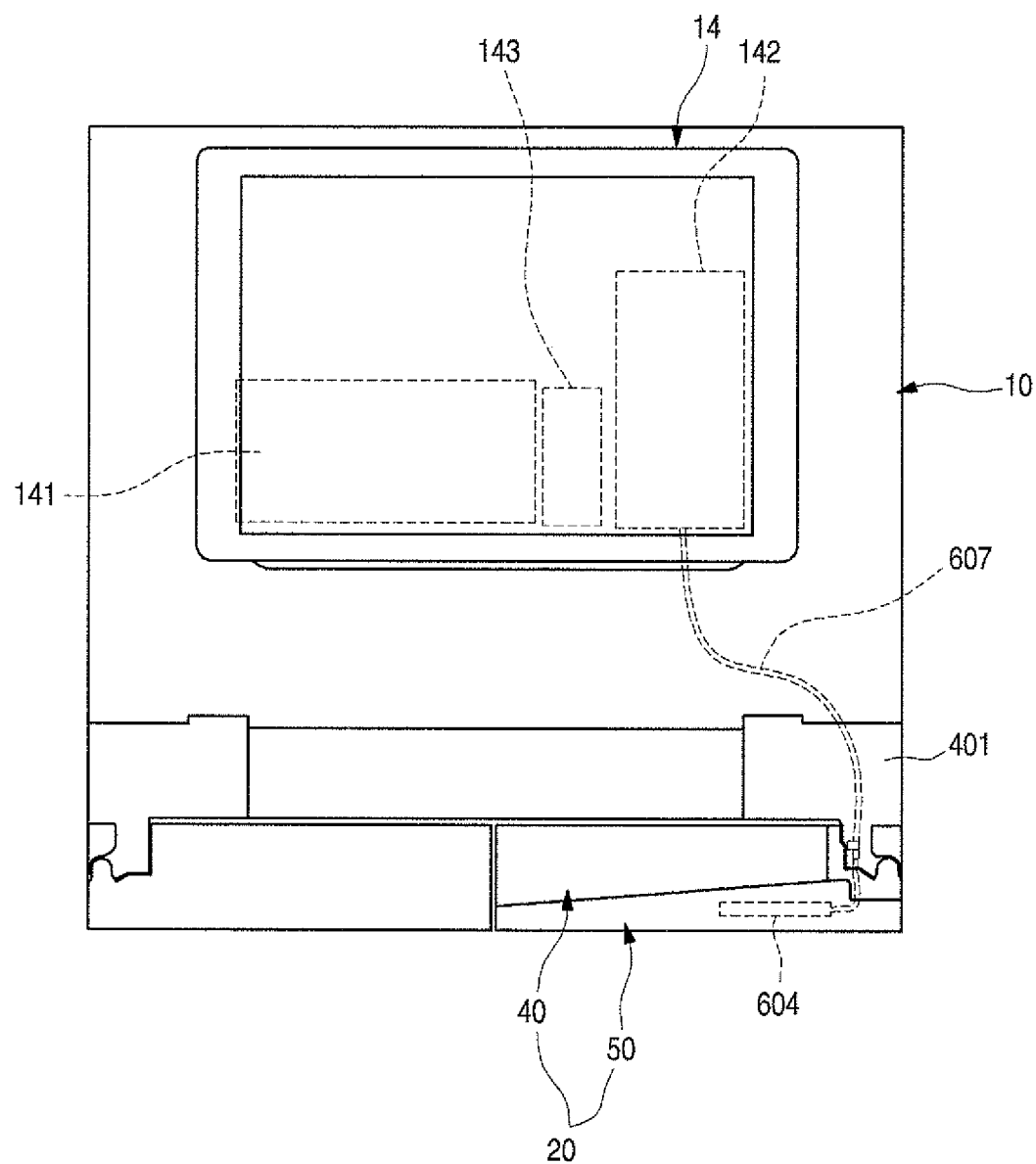
FIG. 18 is a plan view illustrating an arrangement of the cable connecting the sub door to a control unit.
Figure 19:
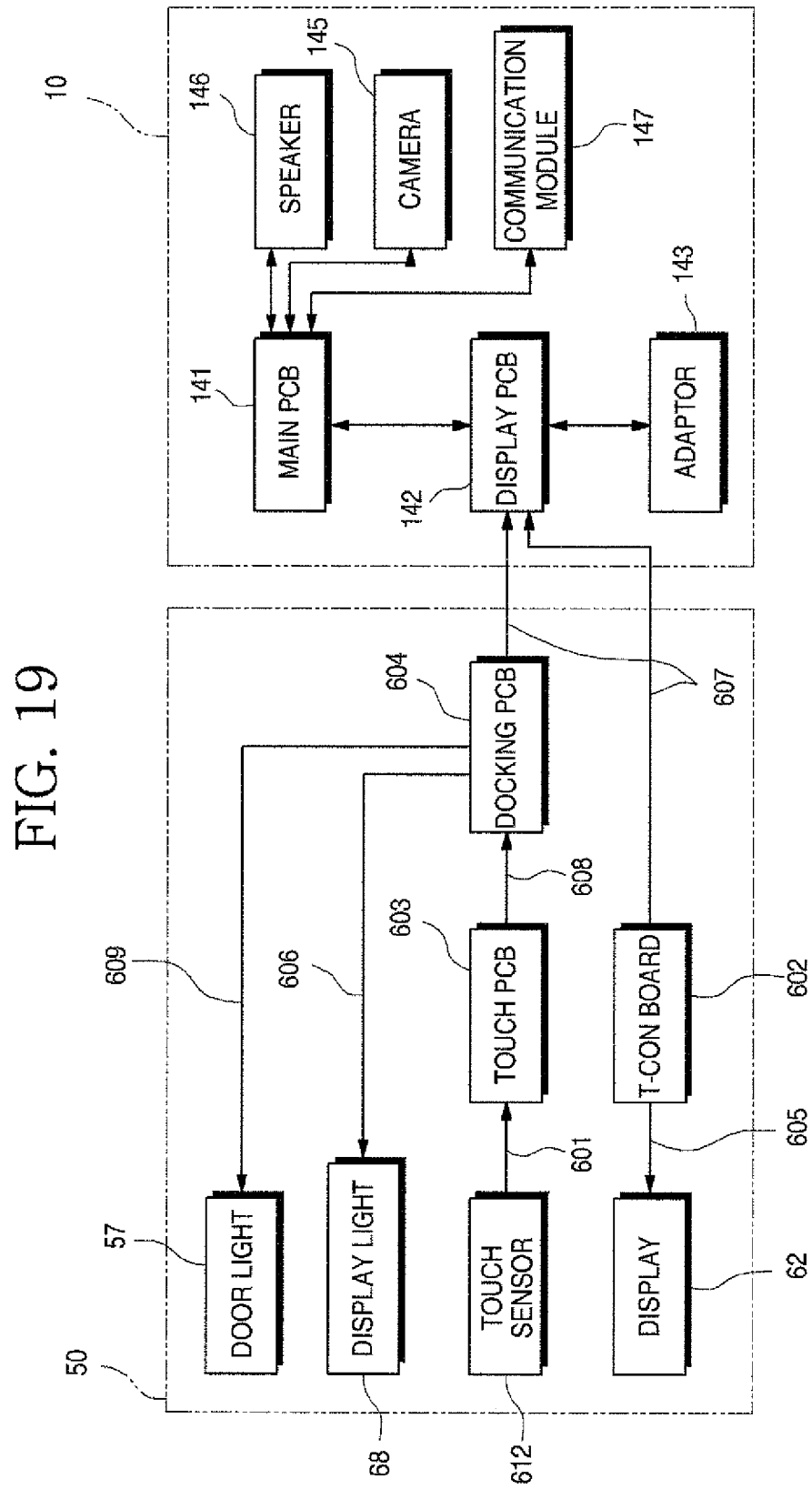
FIG. 19 is a block diagram illustrating a flow of a control signal of the refrigerator.

FIG. 17 is a partial perspective view illustrating a connection structure between the cables and the PCBs of the transparent display assembly. Also, FIG. 18 is a plan view illustrating an arrangement of the cable connecting the sub door to the control unit. Also, FIG. 19 is a block diagram illustrating a flow of a control signal of the refrigerator.

As illustrated in the drawings, the deco cover 543 may be disposed on the upper portion of the sub door 50, and the plurality of PCBs 602, 603, and 604, i.e., the touch PCB 603, the T-CON board 602, and the docking PCB 604 may be mounted on the PCB mounting part 545 of the deco cover 543. Also, the plurality of PCBs 602, 603, and 604 may be connected to the plurality of cables 601, 605, and 606 within the sub door 50.

The cables 601, 605, and 606 connecting the plurality of cables 602, 603, and 604 to each other may be provided as the flexible film type FFC or FPC. Thus, the touch cable 601, the display cable 605, and the display light cable 606 may occupy a large space within the sub door 50 and be disposed to be closely attached to each other along the outside of the transparent display assembly 60. Also, the connection structure with the PCBs 602, 603, and 604 may also be simply provided and may not be exposed to the outside through the see-through part 21. In addition, when the insulation material 531 is foamed to be molded in the sub door 50, the PCBs 602, 603, and 604 may not interfere with the insulation material 531.

In more detail, the touch cable 601 may extend from an upper end of the touch sensor 612 and then be connected to the touch PCB 603. The touch PCB 603 may be disposed at a position corresponding to the extending end of the touch cable 601. A touch connector 603a into which the extending end of the touch cable 601 is inserted may be disposed on the touch PCB 603. The touch cable 601 may have a flat shape, and the extending end of the touch cable 601 may be bent to be inserted into the touch connector 603a. Thus, the touch cable 601 may be easily inserted into the touch connector 603a and have a structure that is connected to the touch PCB 603.

The display cable 605 may be connected to the source board 621 to extend upward. Then, the display cable 605 may extend along the circumference of the side surface of the transparent display assembly 60 and then be connected to the T-CON board 602. Also, the display connector 602a disposed at the position corresponding to the end of the display cable 605 may be disposed on the T-CON board 602. Thus, the end of the display cable 604 having the flat cable shape may be inserted into the display connector 602a and connected to the T-CON board 602.

The display light cable 606 may be connected to the display light 68 disposed on each of the upper and lower portions of the transparent display assembly 60 to extend upward along the outer circumference of the transparent display assembly 60 and then be connected to the docking PCB 604. The display light cable 606 may also have a flat cable shape and be inserted into a display light connector 604a disposed on the docking PCB 604 to connect the docking PCB 604 to the display light cable 606.

The door light connector 604b may be disposed on the docking PCB 604. The door light connector 604b may be connected to an end of the door light cable 609 extending from the door light 57. The door light 57 may be provided as a separate part with respect to the transparent display assembly 60 and mounted on the door linear 56. Thus, the door light cable 609 connected to the door light 57 may extend to the docking PCB 604 without passing through the transparent display assembly 60 and be provided as a wire type cable. The door light cable 609 may also be provided as a flat and flexible cable like other cables 601, 605, and 606.

The docking PCB 604 may be connected to the touch PCB 603. The docking PCB 604 and the touch PCB 603 may be provided as separate parts. Thus, while the docking PCB 604 and the touch PCB 603 are assembled and mounted on the PCB mounting part 545, the docking PCB 604 and the touch PCB 603 may be connected to each other through a first docking cable 608. The first docking cable 608 may be connected to a PCB connector 604d disposed on the docking PCB 604. Also, as occasion demands, the T-CON board 602 may also be connected to the docking PCB 604.

Also, in consideration of efficiency of a voltage situation or signal transmission, the T-CON board 602 may not be connected to the docking PCB 604, but the wire type connection cable 607 may be directly connected to the control unit 14 through the wire hole 541b.

Also, a connection connector 604c connected to the wire type connection cable 607 may be further disposed on the docking PCB 604. Since the connection connector 604c is connected to the docking PCB 604, the flat type cables 601, 605, and 606 may be connected to the display PCB 142 within the control unit 14 through the connection cable 607. Since the connection connector 604c is connected to the connection cable 607 that is accessed to the outside of the sub door, the connection connector 604c may be called a lead-in connector. Also, other PCBs 602 and 603 disposed on the docking PCB 604 except for the connection connector 604c or the connectors 604a, 604b, and 604d, to which the cables 605, 606, 608, and 609 connected to the electric modules are connected, may also be called lead-in connectors.

The connection cable 607 may be accessible through the wire hole 541b defined in the upper cap deco 54 and pass through the upper hinge 401 or the cover covering the upper hinge 401 to be led to the control unit 14. Here, the connection cable 607 may not be exposed to the outside and extend to the control unit 14 through the inside of the cabinet 10 and then be connected to the display PCB 142 on the control unit 14.

As described above, the plurality of electric modules disposed on the sub door 50, i.e., all of the plurality of flat cables 601, 605, and 606 connected to the electric modules constituting the transparent display assembly 60 may be connected to the PCBs 602, 603, and 604 in the upper portion of the sub door 50, and the wire type connection cable 607 extending from the control unit 14 on the cabinet 10 may be simply connected to the docking PCB 604 and the T-CON board 602 to minimize the size of the wire hole 541b and also minimize the interference when the sub door 50 is opened or closed.

That is, each of the plurality of cables 601, 605, and 606 connected to the PCBs 602, 603, and 604 may have a very large width, and thus, the wire hole 541b for guiding the plurality of cables 601, 605, and 606 to the outside of the sub door 50 may be vary large to deteriorate the efficiency and the outer appearance. Also, the plurality of cables 601, 605, and 606 may be damaged by the interference due to the structural characteristics of the sub door 50 that is opened and closed by the rotation thereof or may be damaged by the exposure to the outside. Thus, the wire type connection cable 607 having a small volume and superior durability may be substantially used as the cable connecting the sub door 50 to the cabinet 10. Also, the number of connection cables 607 may be minimized to reduce the volume and space for guiding the connection cable 607.

A main PCB 141, a display PCB 142, and an adaptor 143 may be disposed in the control unit 14 connected by the connection cable 607.

The overall operation of the refrigerator 1 as well as a refrigerating cycle may be controlled by the main PCB 141. The main PCB 141 may be connected to the display PCB 142 to receive operation information of the transparent display assembly 60.

Also, a camera 145 for photographing the inside of the refrigerator 1 so as to utilize image information may be connected to the main PCB 141. Also, a speaker 146 for outputting a voice may be connected to the main PCB 141. A separate communication module 147 for communication with an external device and a server may be connected to the main PCB 141. The communication module 147 may be directly or indirectly connected to the main PCB 141, the display PCB 142, the speaker 146, and the camera 145 to transmit the information.

Also, the adaptor 143 for converting power supplied to the transparent display assembly 60 may be further disposed on the control unit 14. DC power may be converted into AC power that is suitable for driving the transparent display assembly 60 by the adaptor 143. Also, since the adaptor 143 has a relatively large size and generate large amount of heat, it may be more efficient when the adaptor 143 is disposed on the control unit 14 on the cabinet 10 rather than the sub door 50.

Figure 20:
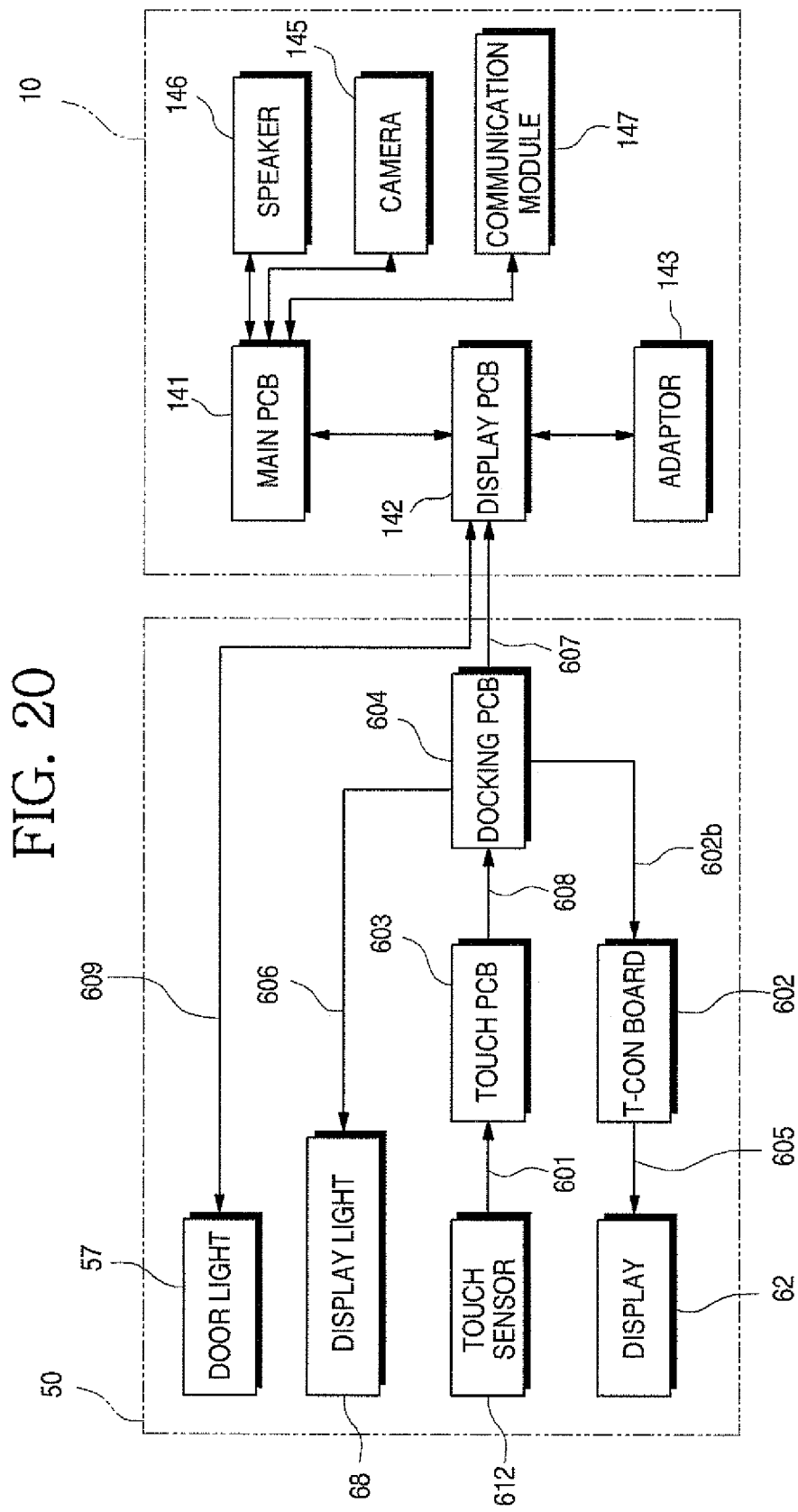
FIGS. 20 and 21 are block diagrams illustrating a different connection state of the connection cable connected to the control unit.
Figure 21:
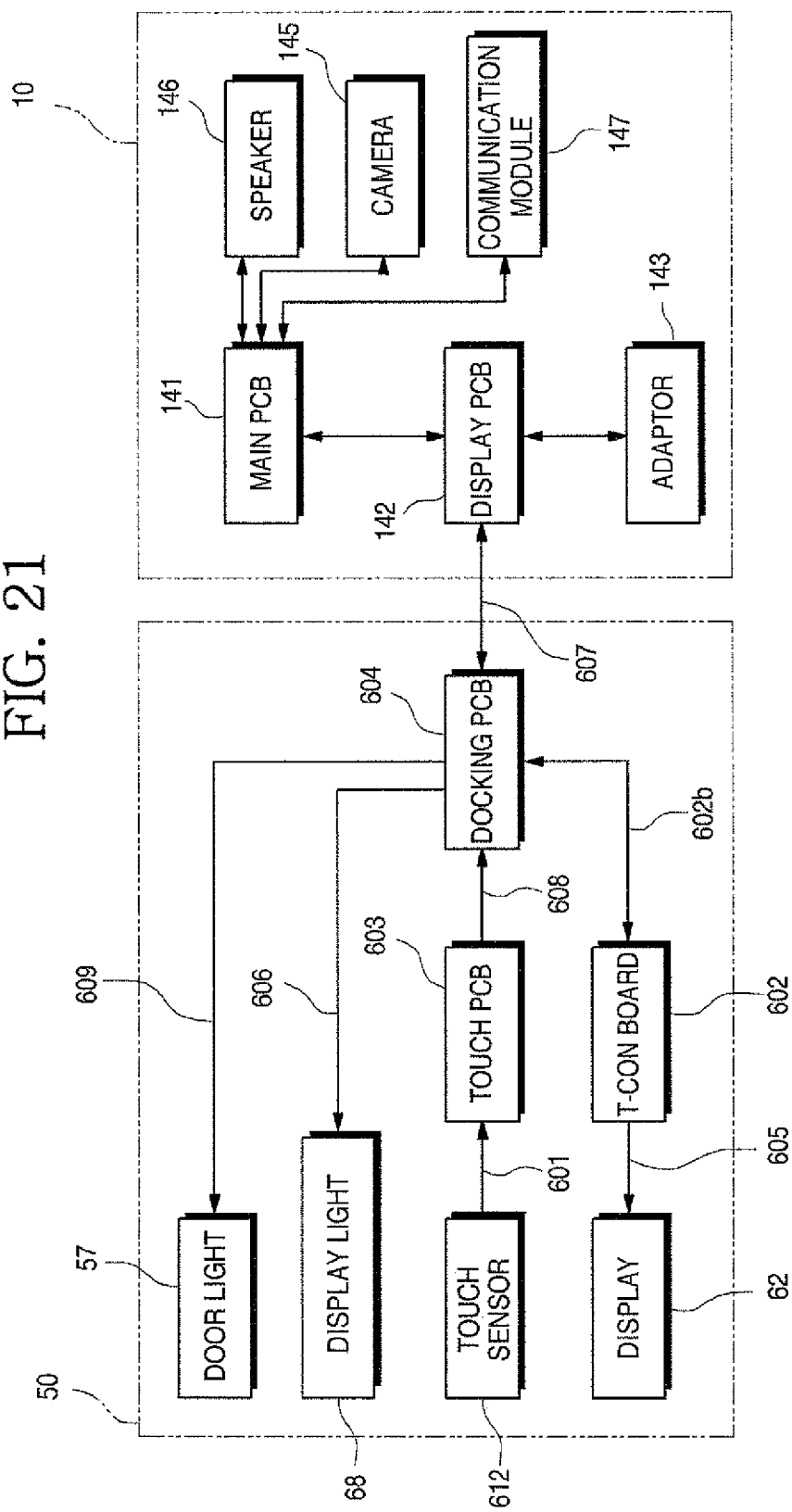

FIGS. 20 and 21 are block diagrams illustrating a different connection state of the connection cable connected to the control unit.

As illustrated in the drawings, the connection cable 607 may have various connection structures in addition to the above-described structure. The connection cable 607 may be provided in plurality so that the display PCB 142 on the cabinet 10 and the electric module or the PCBs 602, 603, and 604 on the sub door 50 are connected to each other through the wire type connection cables 607.

In detail, as illustrated in FIG. 20, the touch PCB 603 may be connected to the docking PCB 604 by the first docking cable 608, and the T-CON board 602 may be connected to the docking PCB 604 by a second docking cable 602*b*. Also, the display light 68 may be connected to the docking PCB 604 by the display light cable 606.

Also, the connection cable 607 may connect the docking PCB 604 to the display PCB 142, and the door light 57 on the sub door 50 may be directly connected to the display PCB 142 by the door light cable 609.

Here, the door light cable 609 may be provided as a wire cable like the connection cable 607. When a relatively high voltage is required for secure a sufficient light amount, as illustrated in FIG. 20, the door light cable 609 may be directly connected to the display PCB 142 without via the docking PCB 604.

Also, as illustrated in FIG. 21, the touch PCB 603 may be connected by the first docking cable 608, and the T-CON board 602 may be connected by a second docking cable 602*b*. Also, the display light 68 may be connected by the display light cable 606, and the door light 57 may be connected to the docking PCB 604 by the door light cable 609.

That is, all of the electric modules within the sub door 50 may be connected to the docking PCB 604 inside the sub door 50 by the plurality of cables 602*b*, 606, 608, and 609, and the docking PCB 604 may be connected to the transparent display assembly 60 by the one connection cable 607. Thus, the number of cables passing through the sub door 50 may be minimized to minimize the number of cables exposed through the sub door 50.

Hereinafter, turn-on/off states of the display light and the door light will be described in more detail with reference to the accompanying drawings.

Figure 22:
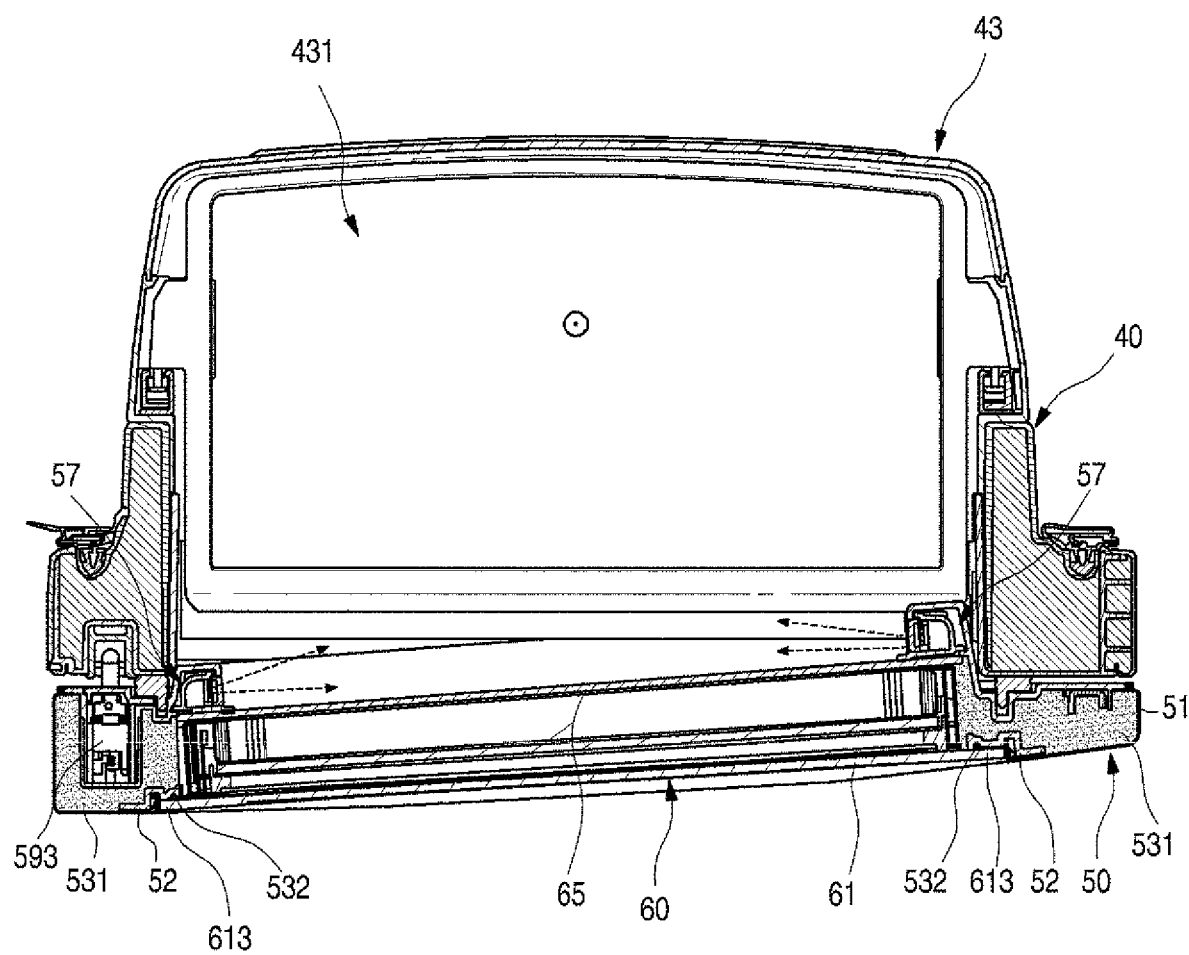
FIG. 22 is a transverse cross-sectional view of the main door and the sub door.
Figure 23:
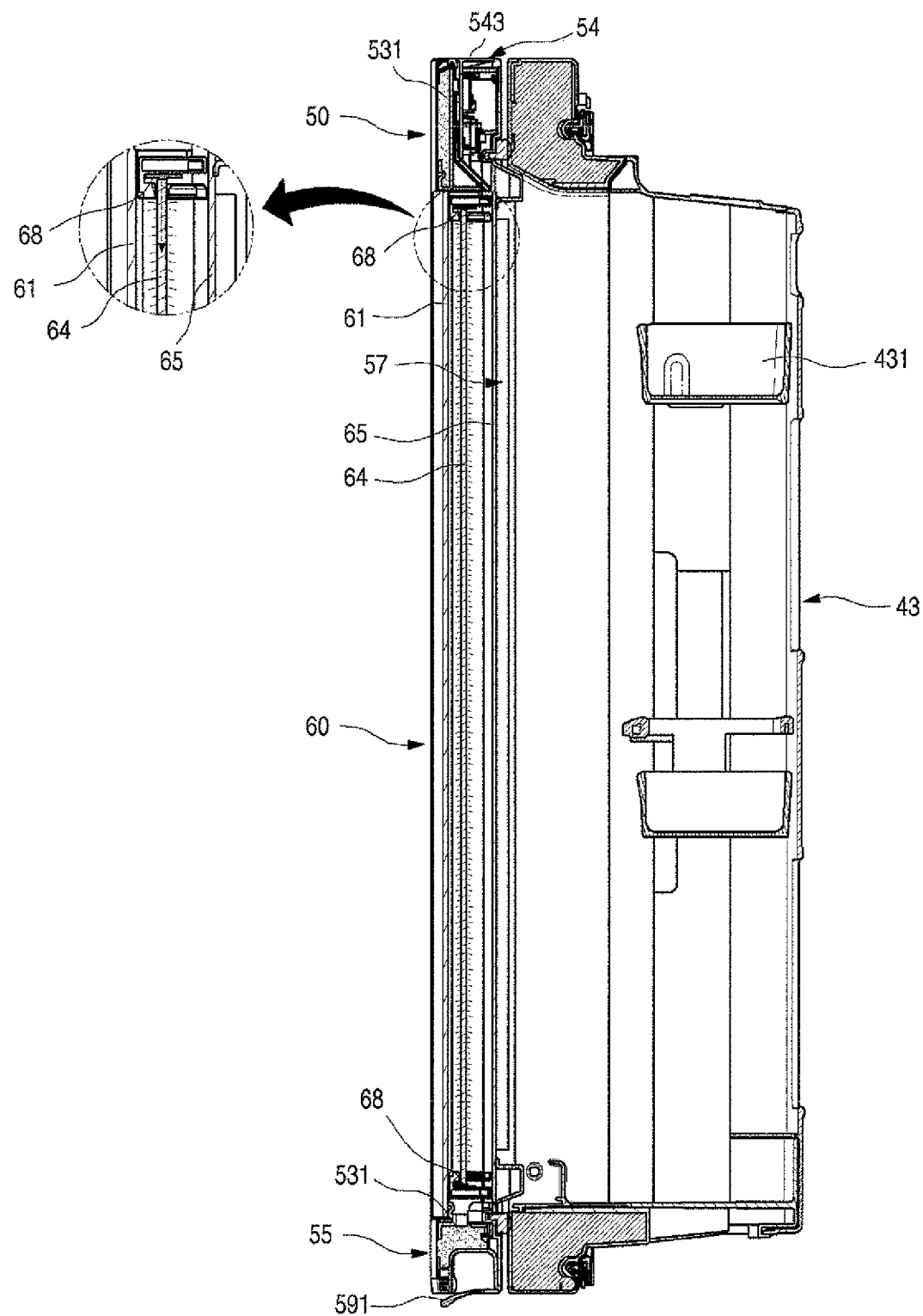
FIG. 23 is a longitudinal cross-sectional view of the main door and the sub door.
Figure 24:
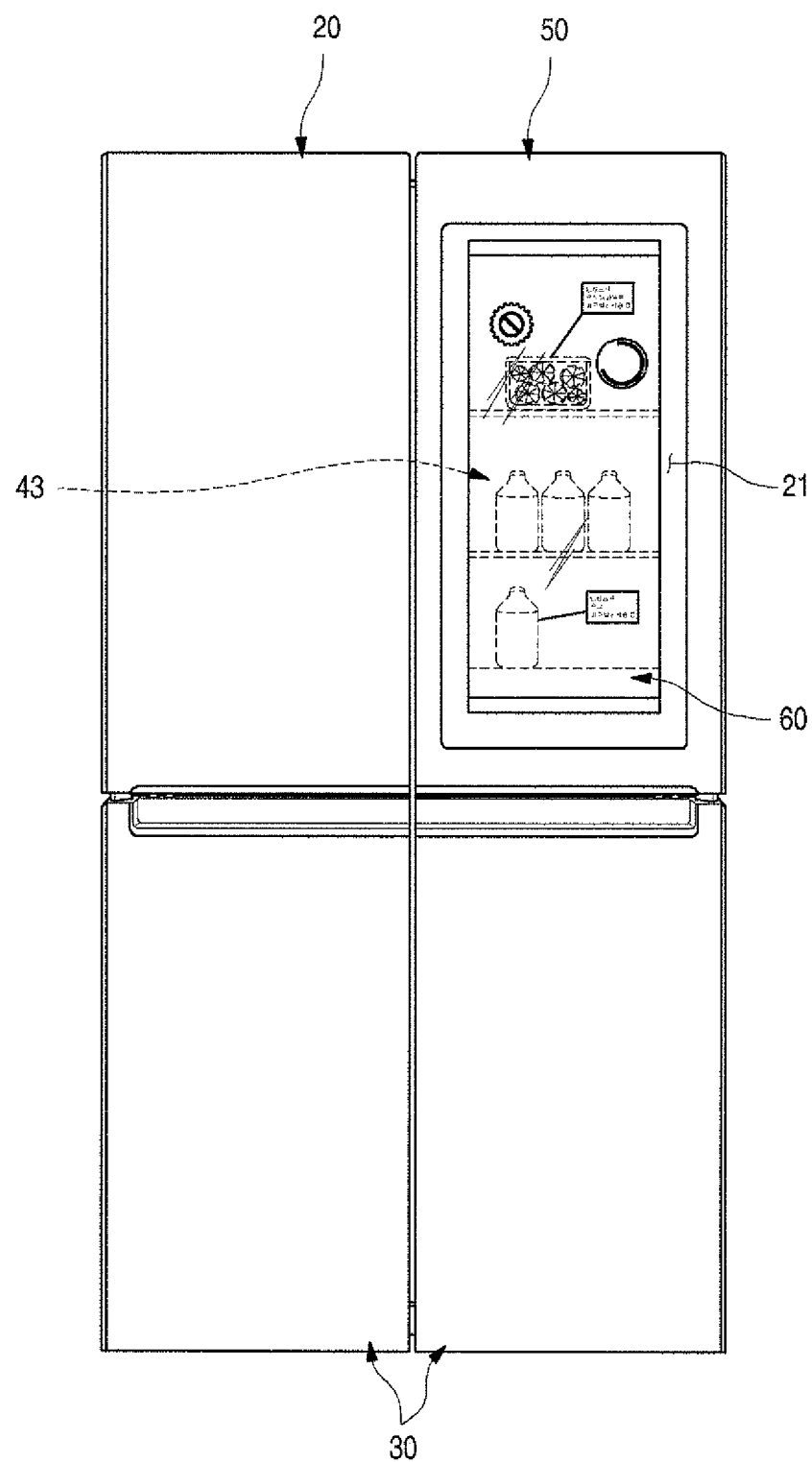
FIG. 24 is a view illustrating a state in which the inside of the refrigerator is seen through the transparent display assembly.
Figure 25:
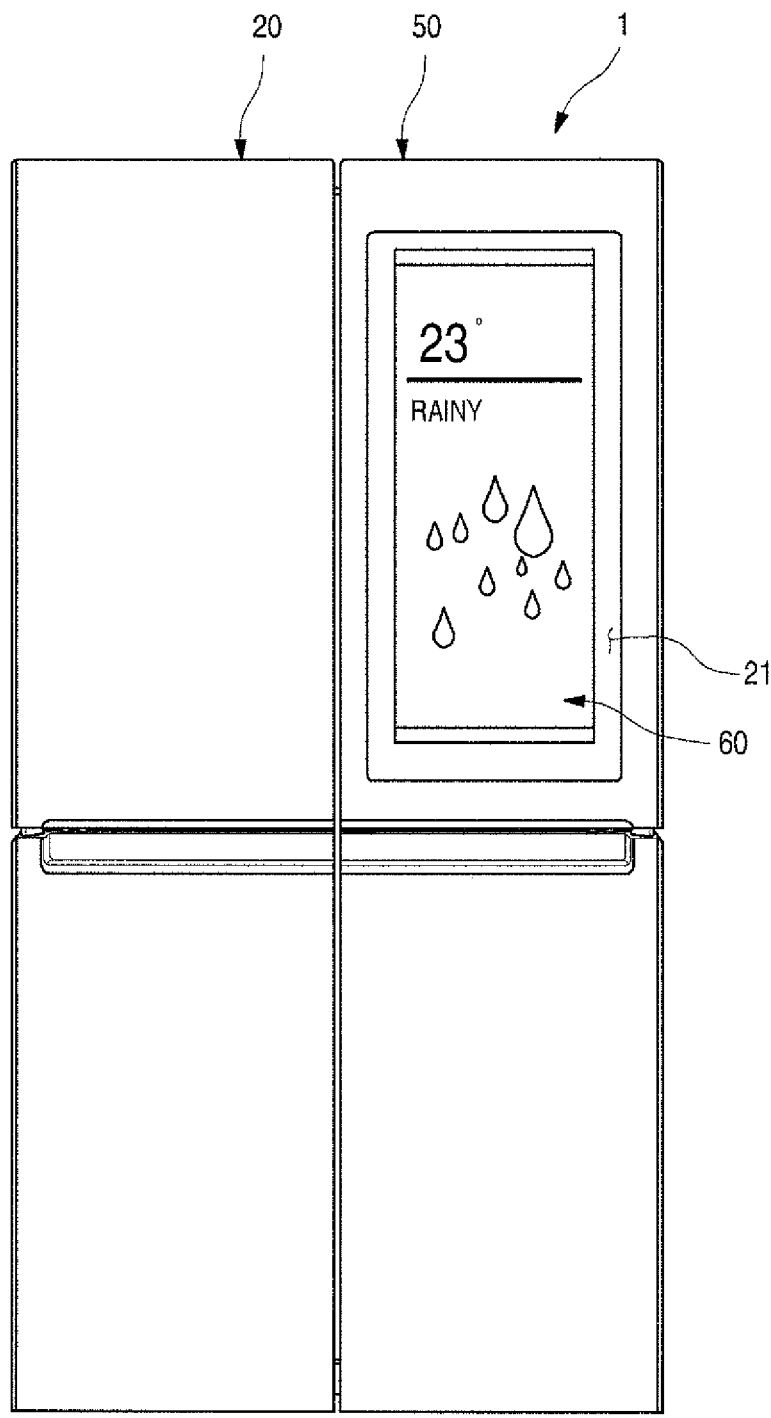
FIG. 25 is a view illustrating a state in which a screen is outputted through the transparent display assembly.

FIG. 22 is a transverse cross-sectional view of the main door and the sub door. Also, FIG. 23 is a longitudinal cross-sectional view of the main door and the sub door. Also, FIG. 24 is a view illustrating a state in which the inside of the refrigerator is seen through the transparent display assembly. Also, FIG. 25 is a view illustrating a state in which a screen is outputted through the transparent display assembly.

As illustrated in the drawings, in a state in which a latch 592 of the opening device 59 is inserted into a latch hole 421 of the locking unit 42, the sub door 50 may be maintained in a closes state. In this state, the door light 57 may be maintained in a turn-off state. An opened or closed state of the sub door 50 may be detected through a door switch that is separately provided.

In the turn-off state of the door light 57, as illustrated in FIG. 1, the rear space of the sub door 50 may be dark, and thus, the inside of the refrigerator 1 may not be seen through the see-through part 21. Thus, in the closed state of the sub door 50, if separate manipulation is not performed, the door light 57 may be maintained in the turn-off state, and the inside of the refrigerator 1 may not be seen through the see-through part 21.

In this state, the user may manipulate the front panel 61 to turn on the door light 57. When the door light 57 is turned on, light emitted from a lighting module may be emitted to positions of both rear left and right sides of the rear panel 65, which face each other.

The door light 57 may extend from the upper end to the lower end of the rear panel 65. That is, the light emitted by the door light 57 may illuminate the entire rear region of the rear panel 65 from both the left and right sides of the rear panel 65.

Here, when the display light 68 is in the turn-on state together with the door light 57, light may be emitted upward and downward by the display light 68, and thus the light may be emitted from left and right sides by the door light 57. As a result, the light may be emitted to the see-through part 21 in all directions to maximally brighten up an area of the see-through part 21.

The door light 57 may emit light in directions facing each other in a state of being close to the rear panel 65. The light emitted by the door light 57 may brighten up an inner case of the accommodation case 43 and also brighten up the front region over the rear panel 65. Thus, as illustrated in FIG. 22, the door light 57 may serve as a lighting for brightening up the inner space of the refrigerator 1, which is seen through the see-through part 21 and also serve as an auxiliary backlight for allow the display 62 to be more clearly displayed.

That is, in a state in which a screen is being outputted through the display 62, the inner space of the refrigerator 1, i.e., the rear space of the sub door 50 may be selectively seen through the see-through part 21. To allow the rear space of the sub door 50 to be seen through the see-through part 21, the door light 57 may be turned on.

A turn on/off combination of the display light 68 and the door light 57 may be variously realized according to a degree of seeing of the inside of the accommodation case 43 through the see-through part 21.

Also, when the user manipulates the front panel 61 disposed on the front surface of the refrigerator 1, the display light 68 may be turned on to turn on the display 62. Thus, the transparent display assembly 60 may output a screen as illustrated in FIG. 23. Here, the manipulation of the front panel 61 may be inputted as one of a specific position, the touch number, or a pattern. As occasion demands, a separate physical button or sensor may be used to detect the user's manipulation.

A screen for displaying a state of the refrigerator 1 and manipulating may be outputted on the display 62. Here, various screens for information with respect to accommodated foods may be outputted by using Internet, image output external input devices, or the like.

In detail, the display light 69 disposed on each of the upper and lower ends of the light guide plate 64 may be turned on together with the display 62 by the user's manipulation. The light guide plate 64 may irregularly reflect and diffuse light of the display light 68 by the turn-on of the display light 68 to emit light having generally uniform brightness to the front display 62.

Also, light may be emitted to the display 62 from the rear side of the display 62 by the light guide plate 64, and simultaneously, a screen based on inputted image information may be outputted on the display 62. Thus, the user may confirm the clearly outputted screen through the see-through part 21.

In addition to the foregoing embodiment, a refrigerator according to various embodiments may be exemplified.

Since the second embodiment is the same as the first embodiment except for positions of a deco cover and a PCB, the same constituent as that according to the foregoing embodiment may be denoted by the same reference numeral, and its detailed description will be omitted. Also, it is to be noted in advance that the reference numerals which are not shown are also the same as the abovementioned embodiment.

Figure 26:
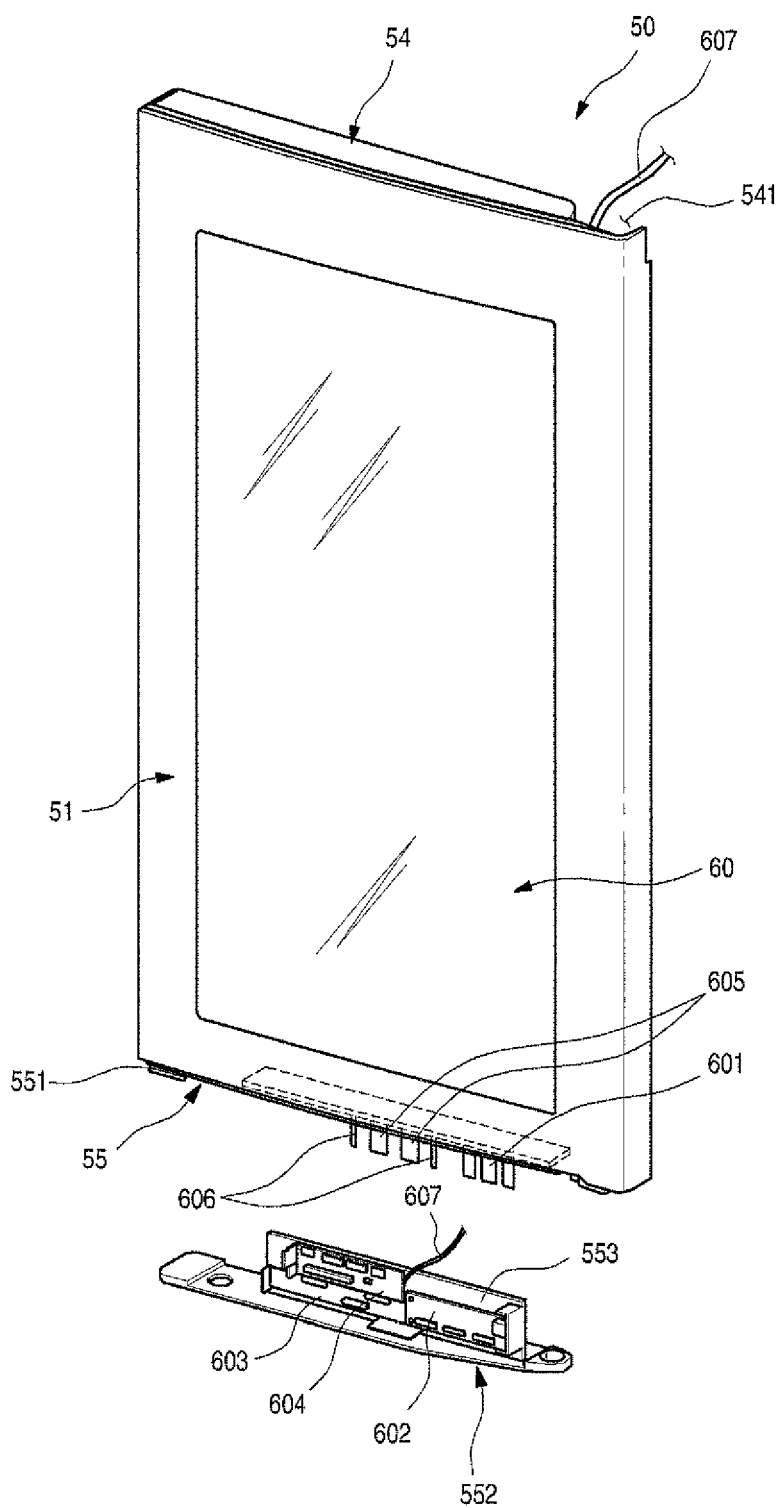
FIG. 26 is an exploded perspective view of a door according to a second embodiment.

FIG. 26 is an exploded perspective view of a door according to a second embodiment.

A door according to a second embodiment has an outer appearance defined by an outer case 51, and the outer case 51 may have an opened front surface. Also, the opening of the outer case 51 may be covered by a transparent display assembly 60. The transparent display assembly 60 may be selectively transparent to allow a user to selectively see the inside of the refrigerator 1 and also enable a touch input by users manipulation and output an image through a display 62.

An upper cap deco 54 defining a top surface of the door 50 and a lower cap deco 55 defining a bottom surface of the door 50 may be disposed on upper and lower ends of the door 50, respectively. An insulation material may be disposed on a circumference of the transparent display assembly 60 to fix the transparent display assembly 60 and thermally insulate a circumference of the door 50.

Also, a deco opening 551 that is opened to the inside of the door 50 may be defined in the lower cap deco 55. The deco opening 551 may be covered by a deco cover 552. The lower end of the transparent display assembly 60 may be exposed through the deco opening 551, and cables 601, 605, and 606 connected to electric modules of the transparent display assembly 60 may be exposed downward through the deco opening. The cables 601, 605, and 606 may be closely attached to the circumference of the transparent display assembly 60 to extend downward.

Also, a PCB mounting part 553 extending upward and inserted into the deco opening 551 may be disposed on the deco cover 552, and a plurality of PCBs 602, 603, and 604 may be mounted on the PCB mounting part 553. The PCBs 602, 603, and 604 may include a touch PCB 603 connected to the touch cable 601, a T-CON board 602 connected to the display cable 605, and a docking PCB 604 connected to the display light cable 606.

A wire cable type connection cable 607, which is introduced through a hinge mounting part 541, may be connected to the docking PCB 604 that is directly or indirectly connected to the plurality of flat cable type cables 601, 605, and 606.

Thus, the plurality of cables 601, 605, and 606 connected to the electric modules of the door 50 or the transparent display assembly 60 may be connected to the docking PCB 604 to extend to a main body 10 through one or several connection cables 607 and thus be connected to a control unit 14 of the main body.

Although the sub door 50 according to the first embodiment is described as an example of a door 50 according to the second embodiment for convenience of description and understanding, the door 50 may be equally applied to the door 20 for directly opening and closing the inner space of the refrigerator.

A refrigerator according to various other embodiments in addition to the abovementioned embodiments may be exemplified.

Since a third embodiment is the same as the abovementioned embodiments except for a position at which a PCB is mounted, the same constituent as those according to the foregoing embodiments may be denoted by the same reference numeral, and its detailed description will be omitted. Also, it is to be noted in advance that the reference numerals which are not shown are also the same as the abovementioned embodiments.

Figure 27:
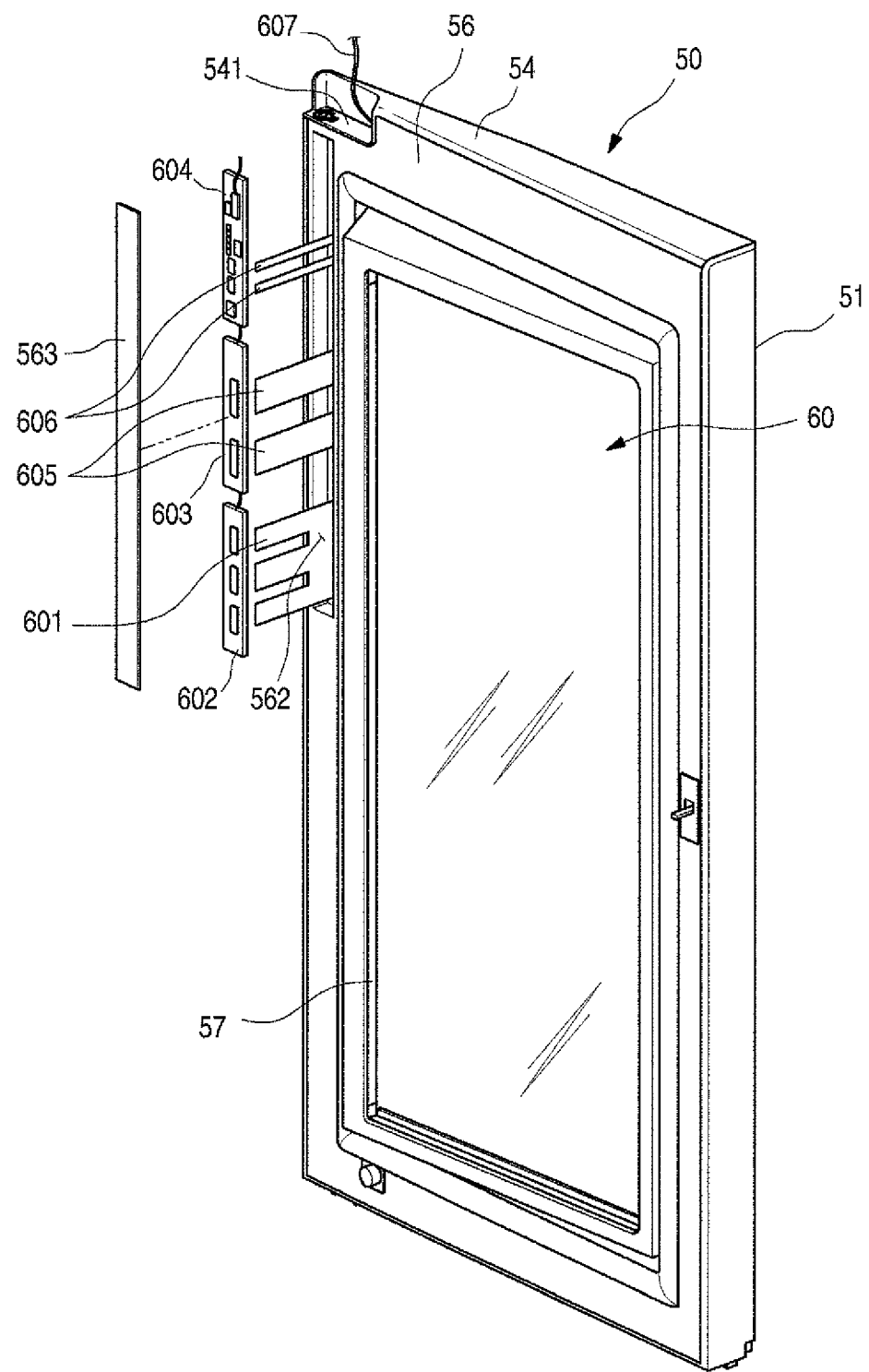
FIG. 27 is an exploded perspective view of a door according to a third embodiment.

FIG. 27 is an exploded perspective view of a door according to a third embodiment.

As illustrated in the drawings, a door 50 according to a third embodiment may have an outer appearance of a front surface, which is defined by an outer case 51, and an outer appearance of a rear surface, which is defined by a door linear 56. Also, an area of a central portion of the outer case 51 and the door linear 56 may be mostly opened, and a transparent display assembly 60 may be disposed between the outer case 51 and the door linear 56.

The transparent display assembly 60 may be selectively transparent to allow a user to selectively see the inside of a refrigerator and also enable a touch input by user's manipulation and output an image through a display 62.

An upper cap deco 54 defining a top surface of the door 50 and a lower cap deco 55 defining a bottom surface of the door 50 may be disposed on upper and lower ends of the door 50, respectively. An insulation material may be disposed on a circumference of the transparent display assembly 60 to fix the transparent display assembly 60 and thermally insulate a circumference of the door 50.

A linear mounting hole 562 may be defined in one side of the rear surface of the door linear 56. In detail, the linear mounting hole 562 may be defined at a position coming into contact with a position corresponding to a hinge mounting part 541 of the upper cap deco 54 and disposed at one side of the transparent display assembly 60.

The linear mounting hole 562 may be configured to expose one side of the transparent display assembly 60 and configured to expose flat type cables 601, 605, and 606 connected to eclectic modules of the transparent display assembly 60. The cables 601, 605, and 606 may be closely attached to a circumference of the transparent display assembly 60 to extend up to the linear mounting hole 562.

Also, a plurality of PCBs 602, 603, and 604 connected to the cables 601, 605, and 606 may be accommodated in the linear mounting hole 562. Also, in the state in which the plurality of PCBs 602, 603, and 604 are mounted inside the linear mounting hole 562, the linear mounting hole 562 may be covered by a linear cover 563.

The PCBs 602, 603, and 604 may include a touch PCB 603 connected to the touch cable 601, a T-CON board 602 connected to the display cable 605, and a docking PCB 604 connected to the display light cable 606.

A wire cable type connection cable 607, which is introduced through a hinge mounting part 541, may be connected to the docking PCB 604 that is directly or indirectly connected to the plurality of flat cable type cables 601, 605, and 606.

Thus, the plurality of cables 601, 605, and 606 connected to the electric modules of the door 50 or the transparent display assembly 60 may be connected to the docking PCB 604 to extend to a main body 10 through one or several connection cables 607 and thus be connected to a control unit 14 of the main body.

Although the sub door 50 according to the first embodiment is described as an example of a door 50 according to the third embodiment for convenience of description and understanding, the door 50 may be equally applied to the door 20 for directly opening and closing the inner space of the refrigerator.

A refrigerator according to various other embodiments in addition to the abovementioned embodiments may be exemplified.

Since the fourth embodiment is the same as the abovementioned embodiments except that a PCB connected to a flat cable is provided as a single part and is different in constituent, the same constituent as those according to the foregoing embodiments may be denoted by the same reference numeral, and its detailed description will be omitted. Also, it is to be noted in advance that the reference numerals which are not shown are also the same as the abovementioned embodiments.

Figure 28:
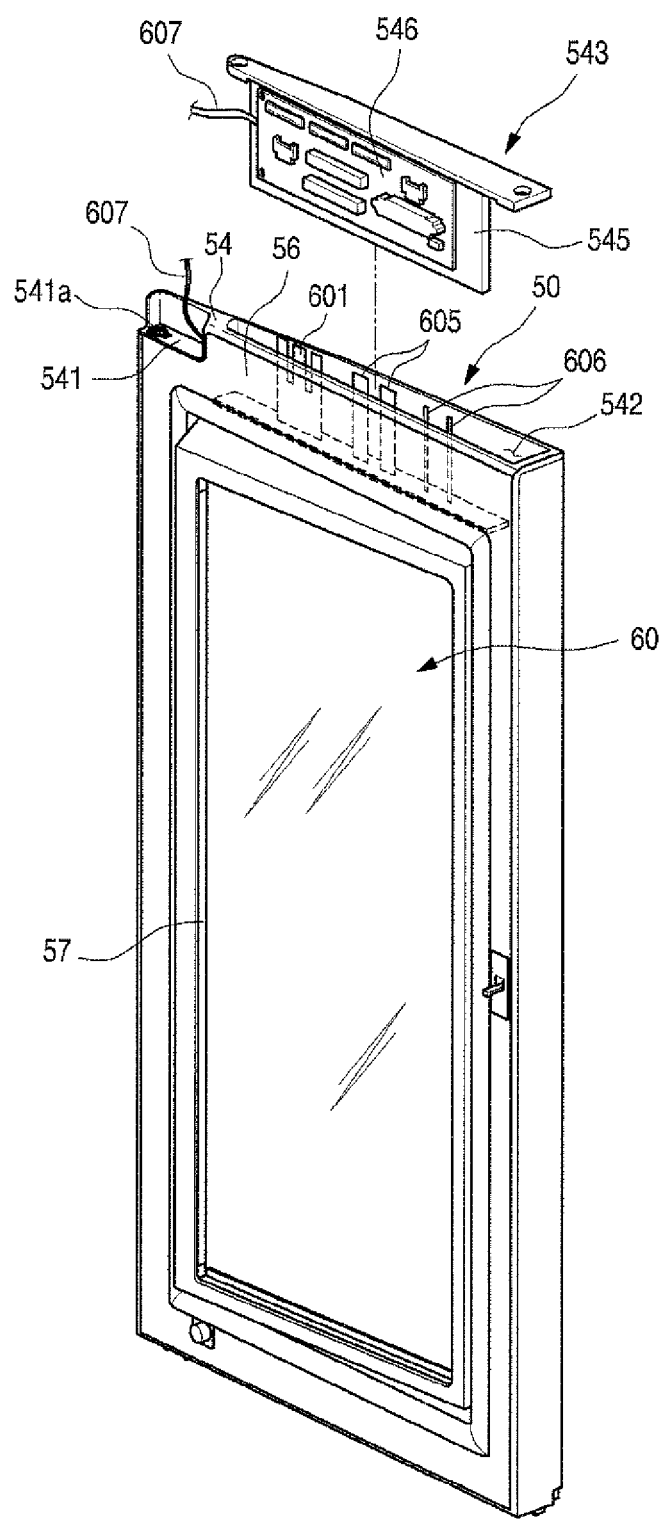
FIG. 28 is an exploded perspective view of a door according to a fourth embodiment.
Figure 29:
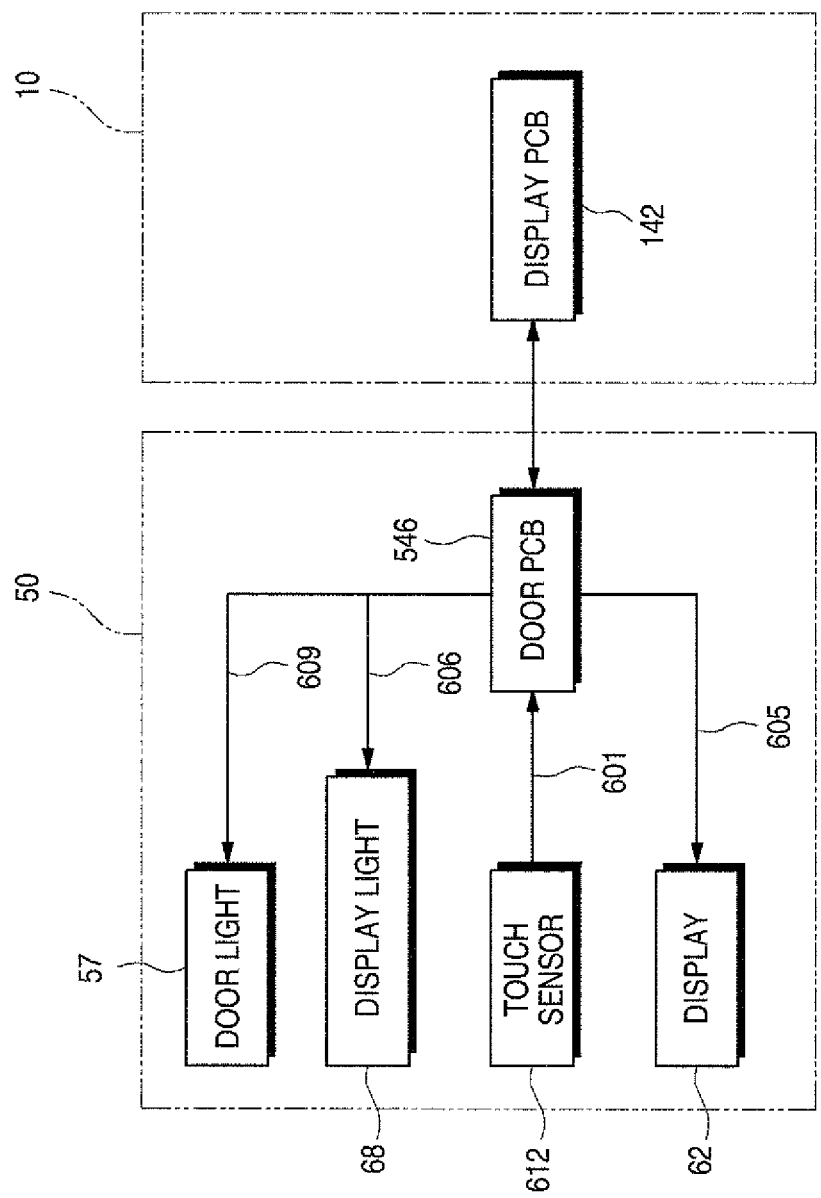
FIG. 29 is a block diagram illustrating a flow of a control signal in a refrigerator according to the fourth embodiment.

FIG. 28 is an exploded perspective view of a door according to a fourth embodiment. Also, FIG. 29 is a block diagram illustrating a flow of a control signal in a refrigerator according to the fourth embodiment.

As illustrated in the drawings, a door 50 according to a fourth embodiment may have an outer appearance of a front surface, which is defined by an outer case 51, and an outer appearance of a rear surface, which is defined by a door linear 56. Also, an area of a central portion of the outer case 51 and the door linear 56 may be mostly opened, and a transparent display assembly 60 may be disposed between the outer case 51 and the door linear 56.

The transparent display assembly 60 may be selectively transparent to allow a user to selectively see the inside of a refrigerator and also enable a touch input by user's manipulation and output an image through a display 62.

An upper cap deco 54 defining a top surface of the door 50 and a lower cap deco 55 defining a bottom surface of the door 50 may be disposed on upper and lower ends of the door 50, respectively. An insulation material may be disposed on a circumference of the transparent display assembly 60 to fix the transparent display assembly 60 and thermally insulate a circumference of the door 50.

A deco opening 542 may be defined in the upper cap deco 54, and flat cable type cables 601, 605, and 606 connected to electric modules of the transparent display assembly 60 may be disposed inside the deco opening 542. Also, the deco opening 542 may be opened and closed by the deco cover 543. The cables 601, 605, and 606 may be closely attached to the circumference of the transparent display assembly 60 to extend upward.

A PCB mounting part 545 extending downward may be disposed on a bottom surface of the deco cover 543, and a door PCB 546 may be mounted on the PCB mounting part 545. The door PCB 546 may be connected to the plurality of cables 601, 605, and 606. In the state in which the door PCB 546 and the cables 601, 605, and 606 are connected to each other, the deco cover 543 may cover the deco opening 542.

The door PCB 546 may control the whole electric modules within the door 50. Thus, the door light 57 as well as the electric modules of the transparent display assembly 60 may also be connected to the door PCB 546.

The door PCB 546 may be connected to at least one of the touch cable 601 connected to the touch sensor 612, the display cable 605 connected to a source board 621 of the display 62, and the display light cable 606 connected to the display light 68. That is, all of the plurality of flat cable type cables 601, 605, and 606 may be connected to one door PCB 546.

Also, a connection cable 607 may be connected to the door PCB 546. The connection cable 607 may have a wire shape and pass through a hinge mounting part 541 of the upper cap deco 54 and thus be guided to the outside. Also, the connection able 607 may extend to a cabinet 10 via an upper hinge and be connected to a display PCB 142 provided in the cabinet 10.

A refrigerator according to various other embodiments in addition to the abovementioned embodiments may be exemplified.

Figure 30:
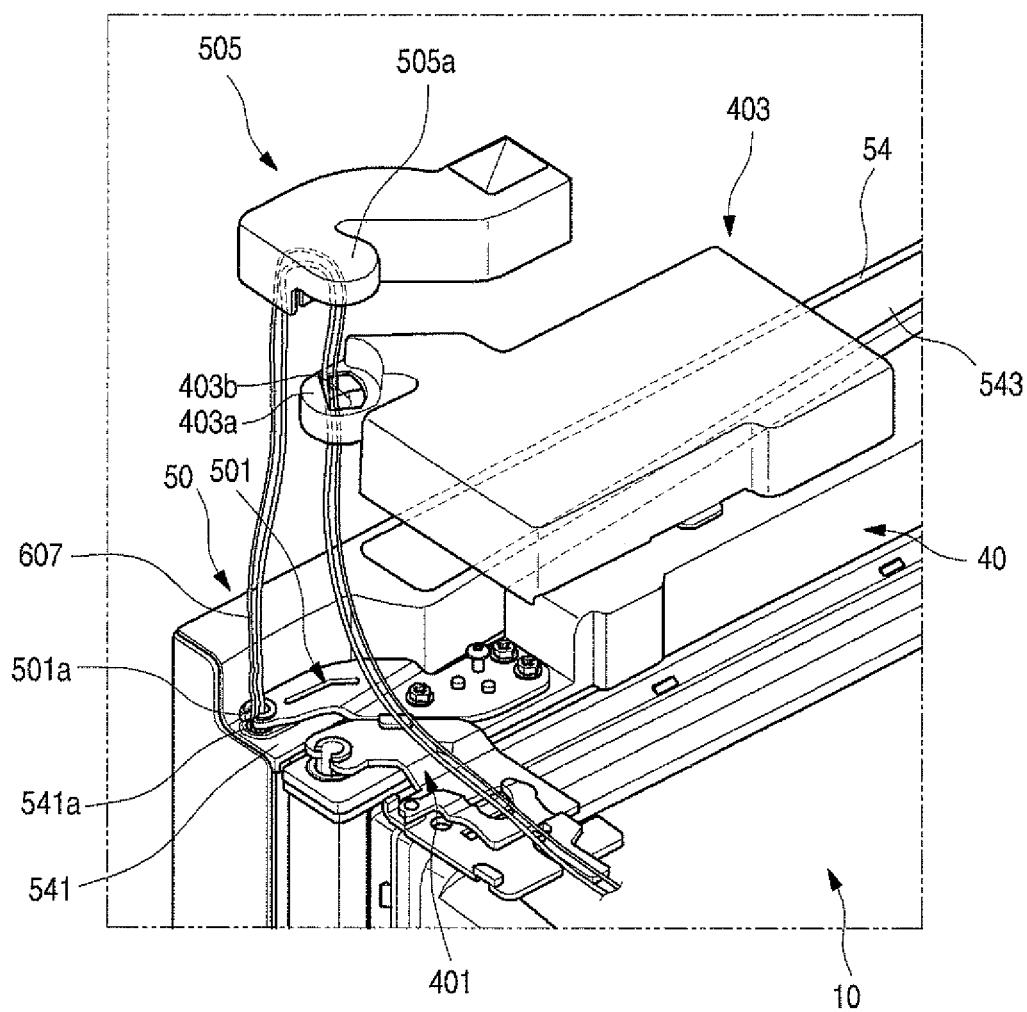
FIG. 30 is a partial perspective view illustrating an arrangement of a wire of a door according to a fifth embodiment.

A fifth embodiment is characterized by a structure in which a connection cable connected to a PCB within a sub door is guided to the outside of the door through a hinge shaft of a sub upper hinge. In the current embodiment, the same constituent as those of the abovementioned embodiments will be denoted by the same reference numeral, and its detailed description will be omitted. Also, it is to be noted in advance that the reference numerals which are not shown are also the same as the abovementioned embodiments. FIG. 30 is a partial perspective view illustrating an arrangement of a wire of a door according to a fifth embodiment.

As illustrated in the drawing, in a refrigerator 1 according to a fifth embodiment, a main door 40 is mounted to be rotatable by an upper hinge 401 on a front surface of a cabinet 10. Also, a sub door 50 is mounted to be rotatable by a sub upper hinge 501 on a front surface of the main door 40.

A deco opening 542 communicating with an upper space of the sub door 50, in which PCBs 602, 603, and 604 are mounted, may be defined in an upper cap deco 54 defining a top surface of the sub door 50. The deco opening 542 may be covered by a deco cover 543. Also, the PCBs 602, 603, and 604 may be mounted on the deco cover 543 like the abovementioned first embodiment, and electric modules of a transparent display assembly 60 may be connected to the PCBs 602, 603, and 604 by flat cable type cables 601, 605, and 606. An arrangement of the PCBs 602, 603, and 604 and the cables 601, 605, and 606 and a structure of the sub door 50 are the same as those according to the first embodiment, and thus their detailed descriptions will be omitted.

A wire cable type connection cable 607 connected to the docking PCB 604 of the PCBs 602, 603, and 604 may be guided to the outside of the hinge mounting part 541 through the hinge shaft 501*a* of the sub upper hinge 501.

That is, the hinge shaft 501*a* of the sub upper hinge 501 may have a hollow tube shape or a tube shape that is cut in a "C" shape in cross-section. Thus, the connection cable 607 connected to the docking PCB 604 at a lower side of the upper cap deco 54 may be guided to the outside of the sub door 50 by passing through the hollow of the hinge shaft 501*a*.

The sub upper hinge 501 may be covered by a sub hinge cover 505, and the upper hinge 401 may be covered by a main hinge cover 403. Also, a sub extension part 505*a* and a main extension part 403*a* may be disposed on the sub hinge cover 505 and the main hinge cover 403, respectively.

The main extension part 403*a* may extend upward from a rotation axis of the upper hinge 401 at one side of the main hinge cover 403 and have a top surface in which a cover hole 403*b*, through which the connection cable 607 passes, is defined. Also, the sub extension part 505*a* may extend to an upper side of the main extension part 403*a* to overlap the main extension part 403*a*, and a space may be defined in the sub extension part 505*a* to accommodate the connection cable 607. Also, the sub extension part 505*a* may cover a top surface of the main extension part 403*a*. When the main door 40 rotates, the main door 40 may rotate above the main extension part 403*a*.

Thus, the connection cable 607 may pass through the hinge shaft 501*a* of the sub upper hinge 501 and then be guided to the hinge mounting part 541. Then, the connection cable 607 may pass through the sub extension part 505*a* of the sub hinge cover 505 to pass through the cover hole 403*b* and then be guided to the cabinet 10 through the main extension part 403*a* of the main hinge cover 403. According to the above-described structure, the connection cable 607 may be covered without exposed to the outside from the docking PCB 604 to the cabinet 10. Also, when the sub door 50 and the main door 40 rotates, the connection cable 607 may not be exposed to the outside or may not interfere.

A refrigerator according to various other embodiments in addition to the abovementioned embodiments may be exemplified.

A sixth embodiment is characterized by a structure in which an upper or lower space of a door is partitioned into a space in which an insulation material is disposed and a space in which a PCB is disposed so that the PCB is mounted on an upper or lower portion of the door after foaming. In the current embodiment, the same constituent as those of the abovementioned embodiments will be denoted by the same reference numeral, and its detailed description will be omitted.

Figure 31:
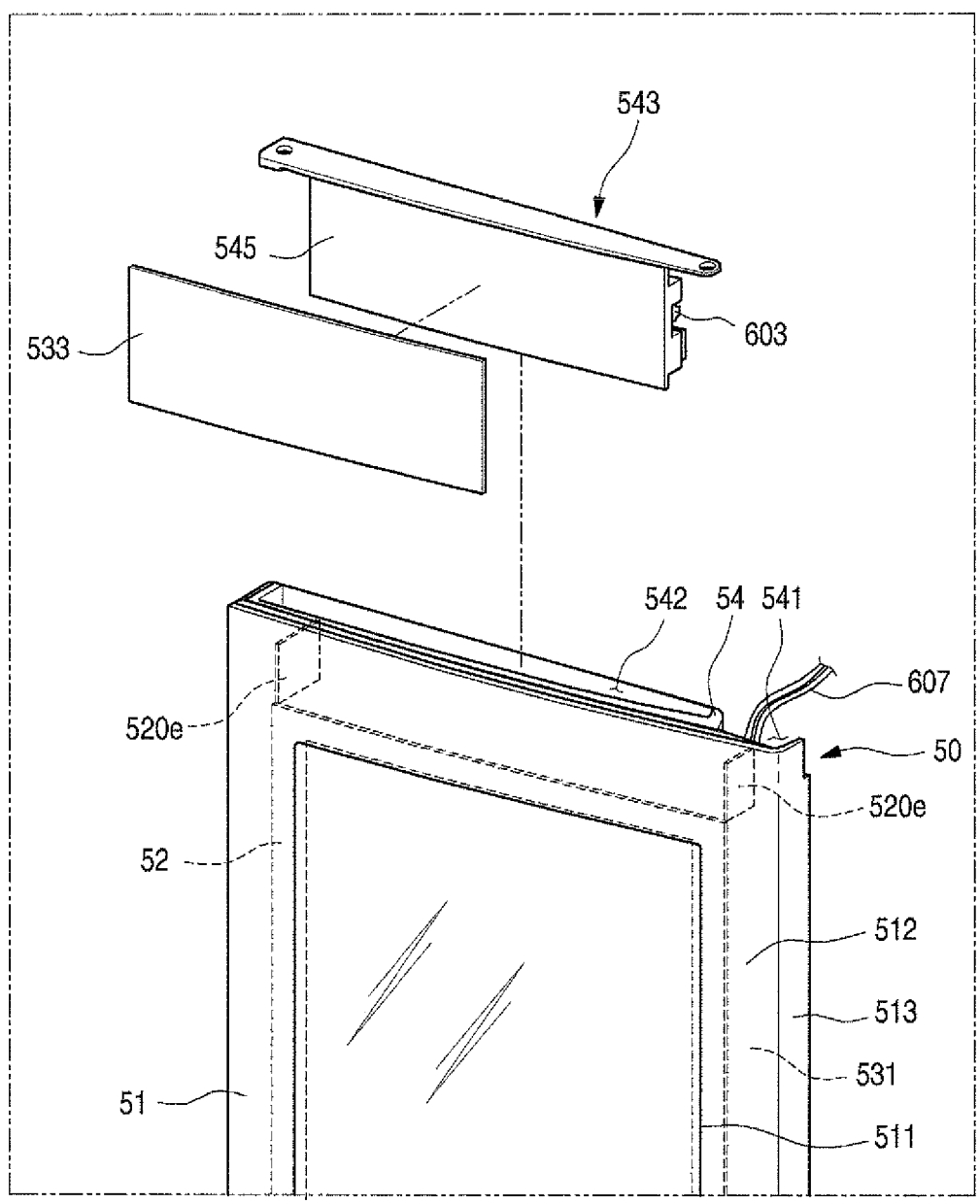
FIG. 31 is a partial exploded perspective view of a door according to a sixth embodiment.
Figure 32:
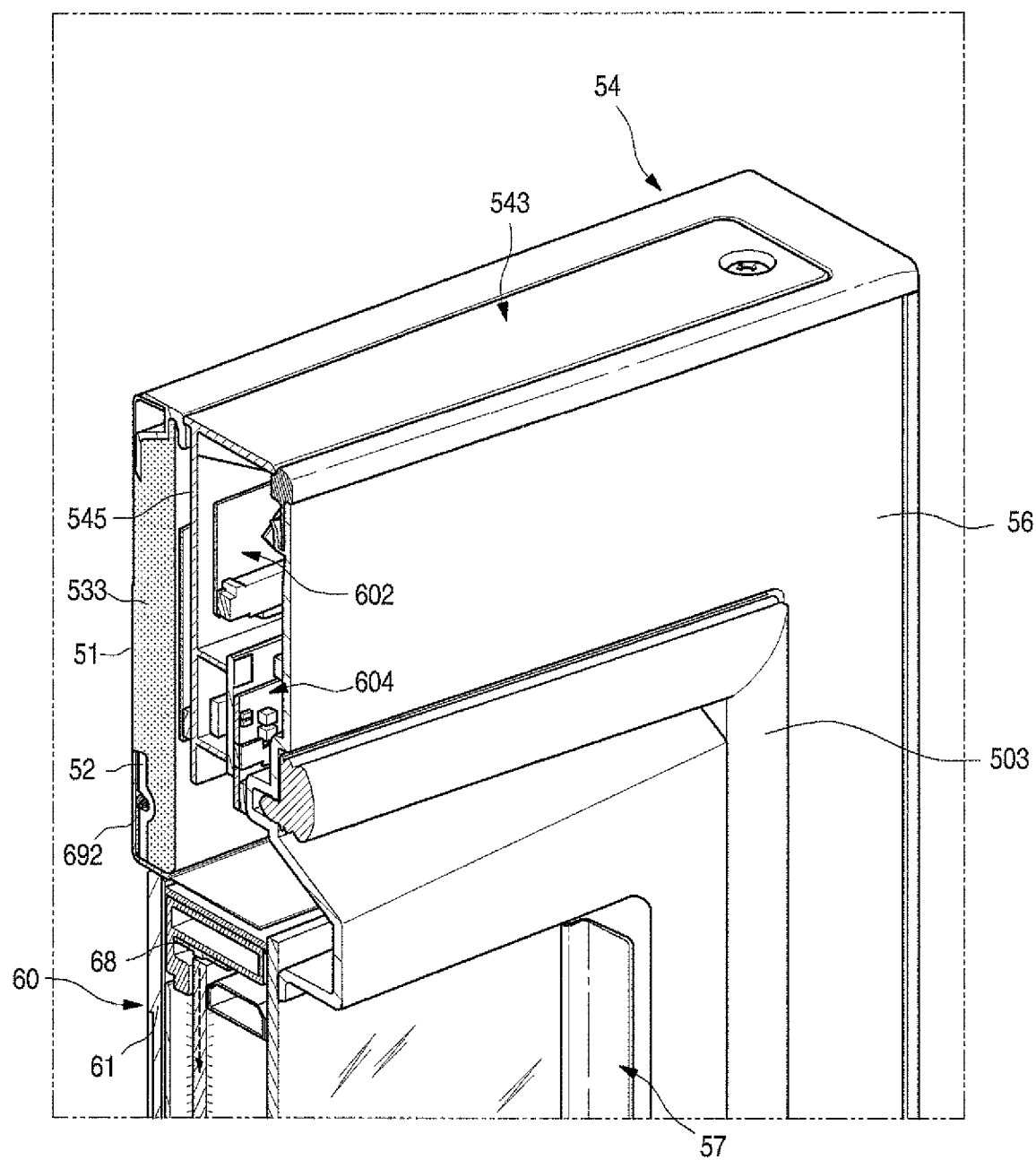
FIG. 32 is a cross-sectional view of the door according to the sixth embodiment.

FIG. 31 is a partial exploded perspective view of a door according to a sixth embodiment. Also, FIG. 32 is a cross-sectional view of the door according to the sixth embodiment.

As illustrated in the drawings, a door 50 of a refrigerator 1 according to a sixth embodiment may have an outer appearance of a front surface, which is defined by an outer case 51, and an outer appearance of a rear surface, which is defined by a door linear 56. Also, an area of a central portion of the outer case 51 and the door linear 56 may be mostly opened, and a transparent display assembly 60 may be disposed between the outer case 51 and the door linear 56.

The transparent display assembly 60 may be selectively transparent to allow a user to selectively see the inside of a refrigerator and also enable a touch input by user's manipulation and output an image through a display 62.

An upper cap deco 54 defining a top surface of the door 50 and a lower cap deco 55 defining a bottom surface of the door 50 may be disposed on upper and lower ends of the door 50, respectively. An insulation material may be disposed on a circumference of the transparent display assembly 60 to fix the transparent display assembly 60 and thermally insulate a circumference of the door 50.

A deco opening 542 may be defined in the upper cap deco 54, and the flat cable type cables 601, 605, and 606 connected to electric modules of the transparent display assembly 60 may be disposed inside the deco opening 542. Also, the deco opening 542 may be opened and closed by the deco cover 543. The cables 601, 605, and 606 may be closely attached to the circumference of the transparent display assembly 60 to extend upward.

A PCB mounting part 545 extending downward may be disposed on a bottom surface of the deco cover 543, and the PCBs 602, 603, and 604 may be mounted on the PCB mounting part 545. The PCBs 602, 603, and 604 may be connected to the plurality of cables 601, 605, and 606. In the state in which the PCBs 602, 603, and 604 and the cables 601, 605, and 606 are connected to each other, the deco cover 543 may cover the deco opening 542.

The PCBs 602, 603, and 604 may control the whole electric modules within the door 50. Thus, the door light 57 as well as the electric modules of the transparent display assembly 60 may also be connected to the PCBs 602, 603, and 604.

The PCBs 602, 603, and 604 may be constituted by a touch PCB 603, a T-CON board 602, and a docking PCB 604. The touch PCB 603 may be connected by the touch cable 601 connected to the touch sensor 612, the T-CON board 602 may be connected by the display cable 605 connected to a source board 621 of the display 62, and the docking PCB 604 may be connected by the display light cable 606 connected to the display light 68.

The docking PCB 604 may be connected to at least one of the touch PCB 603 and the T-CON board 602. Also, the docking PCB 604 may be connected to a connection cable 607. The connection cable 607 may have a wire shape and pass through a hinge mounting part 541 of the upper cap deco 54 and thus be guided to the outside. Also, the connection able 607 may extend to a cabinet 10 via an upper hinge and be connected to a display PCB 142 provided in the cabinet 10.

An inner frame 52 may be disposed on the rear surface of the outer plate 51. The inner frame 52 may be disposed along a circumference of a plate opening 511 of the outer plate 51, and a rear surface of the inner frame 52 may support the circumference of the plate opening 511 and a circumference of a front panel 61 of the transparent display assembly 60.

That is, the inner frame 52 may have a rectangular frame shape and adhere to the circumference of the plate opening 511 and a rear surface of a front protrusion 613, which protrudes outward, of the front panel 61 by using an adhesion member 693 such as a double-sided tape or an adhesive. Thus, the transparent display assembly 60 may be mounted without being stepped with respect to a front surface of the outer plate 51 by the inner frame 52.

A barrier 520*e* extending upward may be disposed on an upper end of the inner frame 52. The barrier 520*e* may be provided in a pair on both left and right sides and extend from the upper end of the inner frame 52 up to a bottom surface of the upper cap deco 54. The barrier 520*e* may partition an upper portion of the door 50 into both left and right sides, i.e., a space in which a foaming solution is filled to form the insulation material 531 and a space in which the PCBs 602, 603, and 604 are accommodated between the pair of barriers 520*e*.

Thus, the PCBs 602, 603, and 604 may be accommodated into the space defined between the pair of barriers 520*e*. Also, in the space defined between the pair of barriers 520*e*, the insulation material 531 may not be provided because the space is partitioned by the barrier 520*e* so that the foaming solution is not filled. Also, the deco opening 542 may be defined at a position corresponding to the space between the pair of barriers 520*e*. The PCBs 602, 603, and 604 may be inserted and mounted through the deco opening 542 and then connected to the cables 601, 605, and 606 of the transparent display assembly 60.

A PCB insulation material may be further provided in the space between the pair of barriers 520*e*. The PCB insulation material 533 may be disposed at a front side of the PCBs 602, 603, and 604 to thermally insulate the rest portion except for a space required for mounting the PCBs 602, 603, and 604.

Thus, the PCB insulation material 533 may be mounted after molding the insulation material 531 that is foamed and formed in the door 50 and have a thickness less than that of the insulation material 531.

The PCB insulation material 533 may be made of a vacuum insulation material or a Styrofoam (PSP) material, which has relatively superior insulation performance so that the PCB insulation material 533 has a thin thickness and sufficient insulation performance. Also, the PCB insulation material 533 may be formed in a sheet shape and attached to the rear surface of the outer plate 51 or attached to a front surface of the PCB mounting part 545.

The PCBs 602, 603, and 604 may be disposed in a lower space of the door 50. Here, the deco opening 542 and the deco cover 543 may be mounted on the lower cap deco 55. This configuration may be the same as that according to the abovementioned embodiments except that the mounted position is changed from the upward direction to the downward direction, and thus, its detailed description will be omitted.

A refrigerator according to various other embodiments in addition to the abovementioned embodiments may be exemplified.

A seventh embodiment is characterized by a structure in which all of connection cables of a docking PCB and a T-CON board within a sub door are guided to a main body through a hinge hole of the sub door. In the current embodiment, the same constituent as those of the abovementioned embodiments will be denoted by the same reference numeral, and its detailed description will be omitted. Also, although not shown, it is to be noted in advance that the reference numerals which are not shown are also the same as the abovementioned embodiments.

Figure 33:
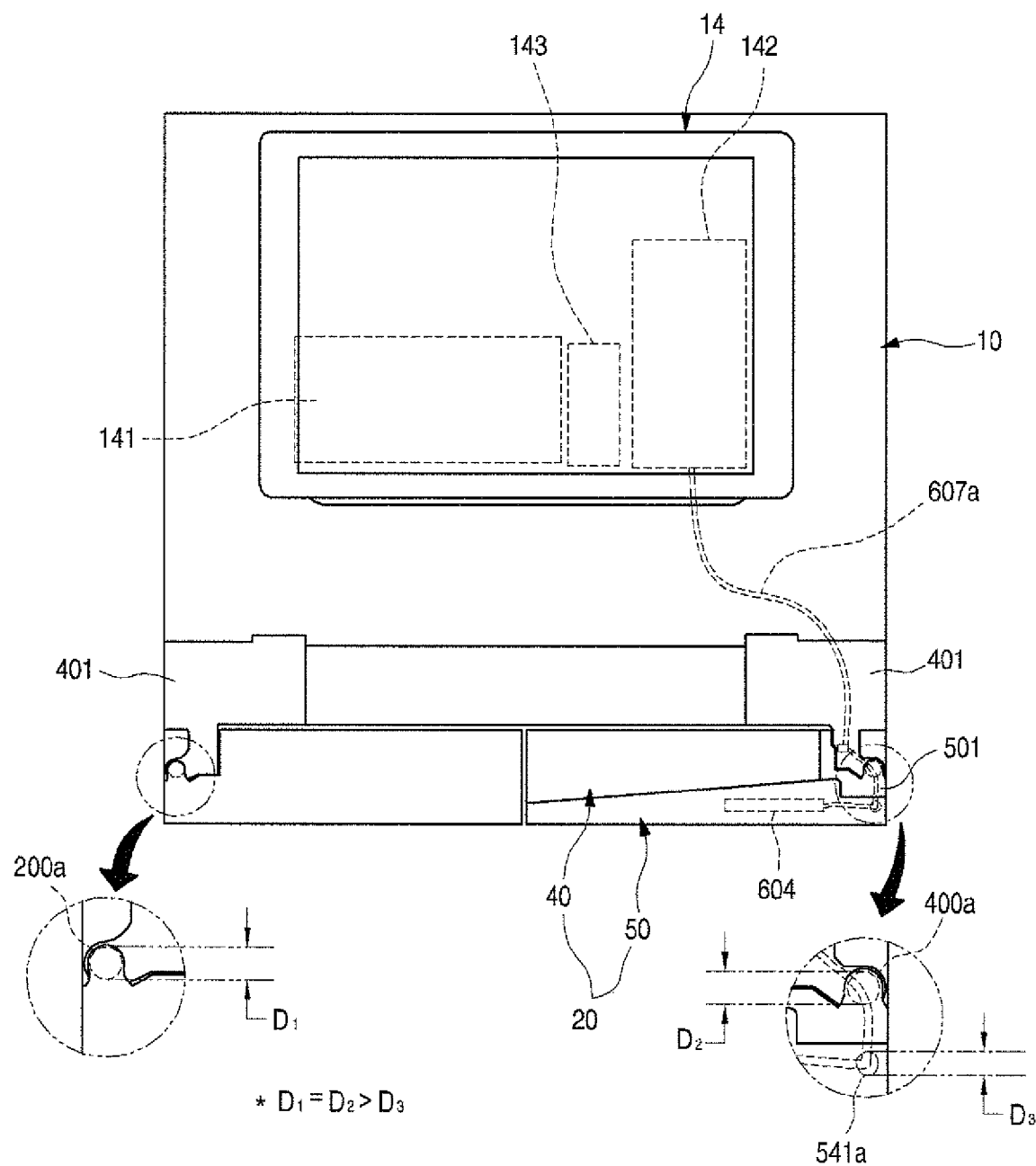
FIG. 33 is a plan view of a refrigerator according to a seventh embodiment.
Figure 34:
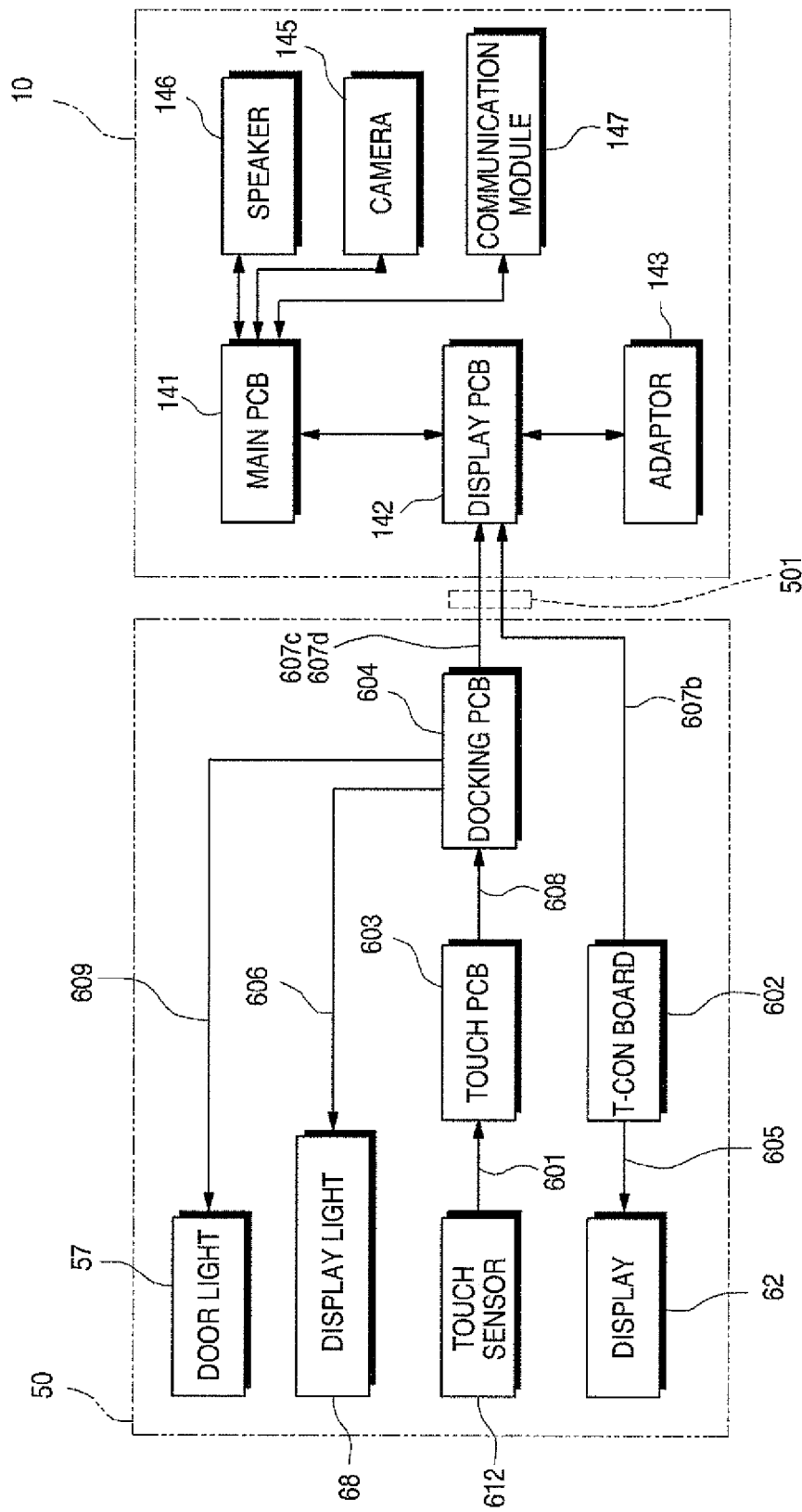
FIG. 34 is a block diagram illustrating a flow of a control signal of the refrigerator.

FIG. 33 is a plan view of a refrigerator according to a seventh embodiment. FIG. 34 is a block diagram illustrating a flow of a control signal of the refrigerator.

Referring to the drawings, a door 20 for opening and closing a storage space may be disposed on a cabinet 10. The door 20 may be disposed on each of both left and right sides and rotatably mounted on the cabinet 10 to open and close the storage space.

The door 20 may be provided in a pair on both left and right sides and mounted to be rotatable by a main hinge 401 on the cabinet 10. A hinge shaft 401a may be disposed on the main hinge 401. The hinge shaft 401a may pass through hinge holes 200a and 400a defined in a top surface of the door 20.

Also, one door (a right door in FIG. 33) of the pair of both left and right doors 20 may be constituted by a main door 40 and a sub door 50. Since the main door 40 and the sub door 50 have the same structure as the abovementioned embodiments, their detailed descriptions will be omitted.

The pair of both left and right doors may not be provided according to types of refrigerator. For example, the main door 40 and the sub door 50 may be provided as one door. Here, the main door and the sub door may also have the same structure as the abovementioned embodiments.

The main door 40 may be rotatably connected to the cabinet 10 by the main hinge 401, and the sub door 50 may be rotatably connected to an upper end of the main door 40 by the sub hinge 501.

Here, the hinge shaft 401a of the main hinge 401 is coupled to pass through the hinge hole 400a defined in an upper end of the main door 40, and a rotation shaft 501a of the sub hinge 501 may be mounted to pass through a hinge hole 541a of the sub door 50.

Also, each of the hinge shaft of the main hinge 401 and the hinge shaft of the sub hinge 501 may have a hollow tube shape or a tube shape that is bent in a "C" shape" so that a wire is accessible therethrough.

Particularly, a transparent display assembly 60 and a door light 57 may be provided in the sub door 50. Here, cables connected to the transparent display assembly 60 and the door light 57 may pass through the hinge shaft 501a and the hinge hole 541a of the sub hinge 501 and then be connected to a display PCB 142 disposed on a top surface of the cabinet 10.

As occasion demands, the cables may pass through the hinge supporting a lower end of the sub door 50.

Each of the hinge shafts 501a and 501a and the hinge holes 200a, 400a, and 541a may be limited in size according to a thickness of each of the main door 40 and the sub door 50.

In detail, each of the right door of the door 20 and the main door 40 may have a relatively thick thickness. Thus, the hinge shaft 401a and the hinge holes 200a and 400a for the rotation of the door 20 and the main door 40 may have predetermined inner diameters D1 and D2. Here, the inner diameter D1 of the hinge hole 400a of the door 20 and the inner diameter D2 of the hinge hole 400a of the main door 40 may be the same. Alternatively, since the main door 40 has a thickness less than that of the door 20, the inner diameter D2 of the hinge hole 400a of the main door 40 may be somewhat less than that of the D1 of the hinge hole 541a of the door 20.

Wires connecting electric modules such as an ice maker, a dispenser, a display device, various sensors, and a heater may be guided through the hinge holes 200a and 400a and also be connected to a main PCB 141 on the top surface of the cabinet 10. Here, the main hinge 401 may include a hinge cover. Thus, the wires may be accommodated without being exposed or to be minimally exposed.

The sub door 50 may have a significantly thin thickness when compared with the main door 40. The sub door 50 may perform a function of covering an accommodation space defined in the main door 40 without forming a separate accommodation space in a state of being maintained in total thickness of the door 20. Here, since the sub door 50 has a thickness that is sufficient to accommodate the transparent display assembly 60, the sub door 50 may have a relatively thin thickness.

Thus, each of the hinge hole 541a in which the sub hinge 501 for rotatably mounting the sub door 50 is mounted and the hinge shaft 501a mounted in the hinge hole 541a may have a relatively small inner diameter.

That is, each of the hinge shaft 501a of the sub door 50 and the hinge hole 541a into which the hinge shaft 501a is inserted may have a diameter D3 necessarily less than that D2 of each of the hinge shaft 401a of the main door 40 and the hinge hole 541a.

Also, a display 142 constituting the transparent display assembly 60 and a T-CON board 602 for driving the display 142 may be disposed in the sub door 50. In addition, a touch sensor 612 and a touch PCB 603 for an operation of the touch sensor 612 may be disposed in the sub door 50, and a docking PCB 604 connecting the touch PCB 603 to a display light 68 and a door light 57 may be disposed in the sub door 50.

The plurality of PCBs 602, 603, and 604 may be disposed in an upper space of the sub door 50. Also, the upper space of the sub door 50, in which the plurality of PCBs 602, 603, and 604 are disposed may communicate with the hinge hole 541a. Thus, cables 607b, 607c, and 607d connected to the T-CON board 602 and the docking PCB 604 may pass through the hinge hole 541a and the hinge shaft 501a and then be guided to the cabinet 10.

Here, since the inner diameter D3 of the hinge hole 541a or the hinge shaft 501a is limited, all of the cables connected to the plurality of electric modules may not individually pass through the hinge hole 541a. Particularly, the cables connected to the display 142, the display light 68, and the touch sensor 612 may be flat type cables. Thus, each of the cables may have a structure that is not suitable to pass through the hinge hole 541a.

Thus, the flat type cables may be converted into wire type cables through the docking PCB 604 and rearranged to have an arrangement that is suitable to pass through the hinge hole 541a so that the cables pass through the hinge hole 541a.

A display PCB 142 may be disposed on the top surface of the cabinet 10. The display PCB 142 may control an operation of the transparent display assembly 60. The display PCB 142 may be constituted by the touch PCB 603, the T-CON board 602, and the docking PCB 604, which are minimum components for driving the transparent display assembly 60 and disposed in the sub door 50. Also, the rest components may be disposed in the cabinet 10. That is, the display PCB 142 for the overall control of the components of the sub door 50 and components having relatively large volumes such as an adaptor related to power may be disposed in the cabinet 10 to minimize the size of each of the PCBs 602, 603, and 604 within the sub door 50.

Also, the main PCB 141 and a speaker 146, a camera 145, and a communication module 147 connected to the main PCB 141 may be disposed in the cabinet 10.

Figure 35:
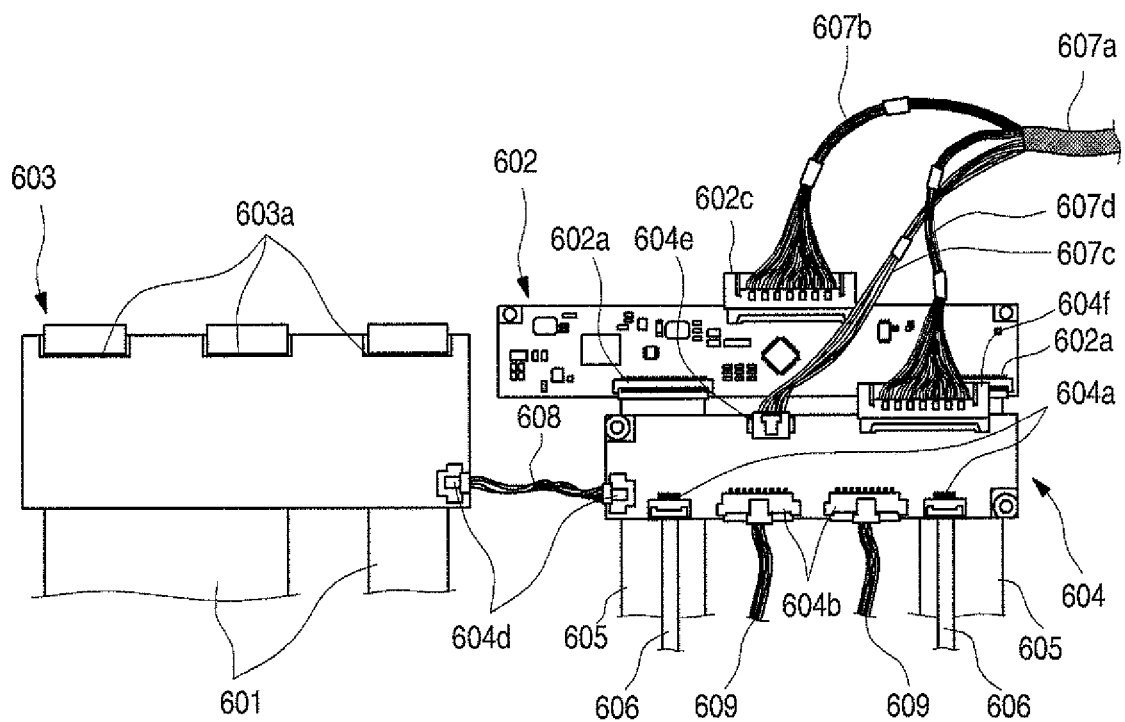
FIG. 35 is a perspective view illustrating a structure of PCBs disposed in a sub door according to the seventh embodiment.

FIG. 35 is a perspective view illustrating a structure of PCBs disposed in a sub door according to the seventh embodiment.

Although not shown, a plurality of PCBs 602, 603, and 604 may be disposed in a sub door 50. The PCBs 602, 603, and 604 may be divided into a plurality of parts so that the PCBs 602, 603, and 604 are efficiently disposed in an upper space of the narrow sub door 50. Thus, at least portions of at least one of the plurality of PCBs 602, 603, and 604 may overall each other and be disposed in a front and rear direction.

That is, the plurality of PCBs 602, 603, and 604 may be disposed at an optimum position in the connection to a display 142, a touch sensor 612, a door light 57, and a display light 68. Also, at least a portion of the PCBs 602, 603, and 604 may be disposed in a front and rear directions within the narrow sub door 50.

The plurality of PCBs 602, 603, and 604 may include a T-CON board 602, a touch PCB 603, and a docking PCB 604. The T-CON board 602 and the touch PCB 603 except for the docking PCB 604 may be provided as one PCB. As occasion demands, the T-CON board 602 and the touch PCB 603 may be provided as at least two PCBs separated from each other.

A display connector 602a may be disposed on the T-CON board 602, and a flat cable type display cable may be connected to the display connector 602a. The display connector 602a may be provided in plurality.

A T-CON output connector 602c may be disposed on the T-CON board 602. The T-CON output connector 602c may be provided as a wire type T-CON connection cable 607b. The T-CON output connector 602c may have a minimum volume when the T-CON output connector 602c is provided as a plurality of strands of cables, each of which has a thin thickness, are bound to each other and thus may easily pass through the hinge hole 541a and the hinge shaft 501a.

The touch connector 603a may be disposed on the touch PCB 603, and a flat cable type touch cable 601 may be connected to the touch connector 603a. Also, a PCB connector 604d may be disposed on the touch PCB 603 and the docking PCB 604. A PCB cable 608 may be connected to the PCB connector 604d, and the touch PCB 603 may be connected to the docking PCB 604 by the PCB cable 608.

A door light connector 604b and a display light connector 604d may be disposed on the docking PCB 604. A door light cable 609 connected to the door light 57 may be connected to the door light connector 604b, and a display light cable 606 may be connected to the display light connector 604a. Since two display lights and two door lights 57 are provided, two door light cables 606 and two door light cables 609 may also be provided. Thus, the connector provided in the docking PCB 604 may include total five connectors, i.e., the PCB connector 604d, the two display light connectors 604a, and the two door light connectors 604b, which connected to each other. Alternatively, as occasion demands, the number of cables or connector may increase or decrease. Also, the cables and the connectors may be provided in a terminal structure in which the cables and the connectors are simply coupled to each other so that assembly and connection are easy. Also, a first connection connector 604e and a second connection connector 604f may be disposed on the docking PCB 604. A first connection cable 607c and a second connection cable 607d, which are provided as wire type cables, may be connected to the first connection connector 604e and the second connection connector 604f, respectively.

The first connection cable 607c and the second connection cable 607d may be provided for transmitting a signal or power of the PCB cable 608 and pass through the hinge hole 541a and the hinge shaft 501a to connect the docking PCB 604 to the display PCB 142.

That is, the PCB cable 608, the two display light cables 606, and the two door light cables 609 may be connected and led to the docking PCB 604. In the docking PCB 604, the PCB cable 608, the two display light cables 606, and the two door light cables 609 may be rearranged to be outputted to the first connection cable 607c and the second connection cable 607d and then be connected to the display PCB 142 disposed in the cabinet 10.

That is, in the docking PCB 604, the number of outputted cables to the number of cables physically inputted in the form of 5 input-2 output may be reduced, and also, the flat type cables may be converted into the wire type cables.

The first connection cable 607c and the second connection cable 607d may be rearranged in various manners.

For example, the first connection cable 607c and the second connection cable 607d may be configured to redistribute and output the plurality of input cables 605, 606, 608, and 609 according to a kind of cables.

For example, the first connection cable 607c may be a cable related to power and constituted by cables for supplying power to the touch PCB 603, the display light 68, and the door light 57. Also, the second connection cable 607d may be a cable related to a signal or processing and constituted by cables for transmitting and processing a signal to the touch PCB 603, the display light 68, and the door light 57.

That is, in the docking PCB 604, the plurality of cables connected to the docking PCB 604 may be rearranged into the power and signal-related cables and then outputted to two type cables of a first connection cable 607c having a high voltage and a second connection cable 607d having a low voltage to significantly reduce the number of cables.

For another example, the first connection cable 607c and the second connection cable 607d may be configured to redistribute and output the plurality of input cables according to voltages.

For example, the first connection cable 607c may be a cable for transmitting a high voltage and be constituted by cables that are connected to a component that requires a high voltage to transmit the high voltage. Also, the second connection cable 607d may be a cable for transmitting a low voltage and be constituted by cables that are connected to a component that requires a low voltage to transmit the low voltage.

That is, in the docking PCB 604, the cables of the plurality of components connected to the docking PCB 604 may be rearranged according to a difference in voltage and then outputted to two type cables of a first connection cable 607c having a high voltage and a second connection cable 607d having a low voltage to significantly reduce the number of cables.

For another example, the first connection cable 607c and the second connection cable 607d may be configured to redistribute and output the plurality of input cables according to functions.

For example, the first connection cable 607c may be constituted by cables connected to the touch PCB 603 to which the power is being supplied. Also, the second connection cable 607d may be constituted by cables connected to the display light 68 and the door light 57 to which the power is supplied according to an operation signal.

That is, in the docking PCB 604, the cables of the plurality of components connected to the docking PCB 604 may be rearranged into a component that requires normal power and a component that does not require the normal power and then outputted to the first connection cable 607c to which the normal power is supplied and the second connection cable 607d to which power is supplied during the operation to significantly reduce the number of cables.

Each of the first connection cable 607c and the second connection cable 607d may be provided as a wire type cable. Each of the first and second connection cables 607c and 607d may have a minimum volume when each of the first and second connection cables 607c and 607d is bound as a plurality of strands of cables, each of which has a thin thickness, are bound to each other and thus may easily pass through the hinge hole 541a and the hinge shaft 501a.

As described above, all of the T-CON connection cable 607b connected to the T-CON output connector 602c and the first and second connection cables 607c and 607d connected to the first and second connection connectors 604e and 604f may pass through the hinge hole 541a of the sub door 50 and the hinge shaft 501a of the sub hinge 501 and then be guided to the cabinet 10.

Figure 36:
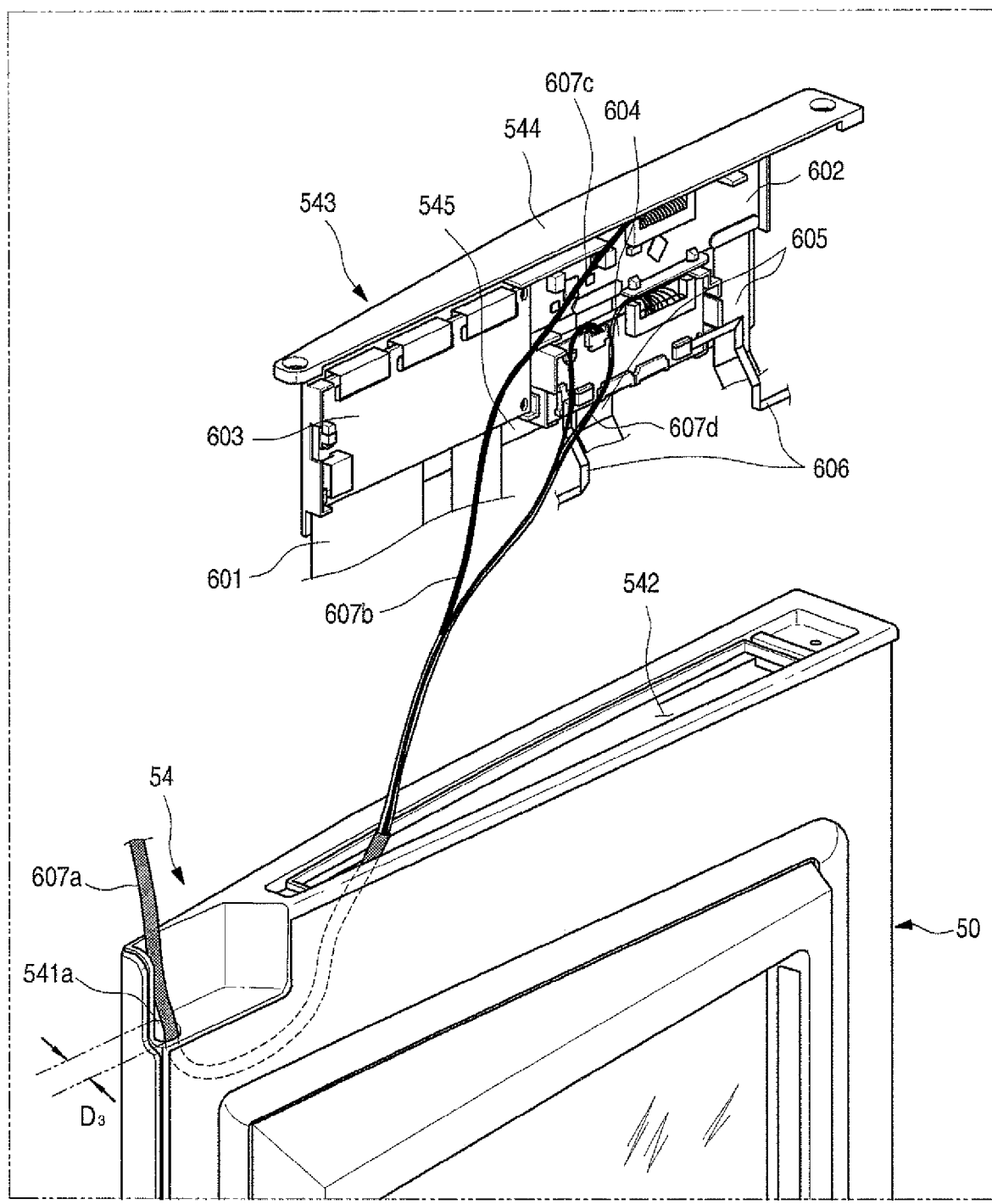
FIG. 36 is an exploded perspective view illustrating a connection structure between the PCBs and a cable inside the sub door.
Figure 37:
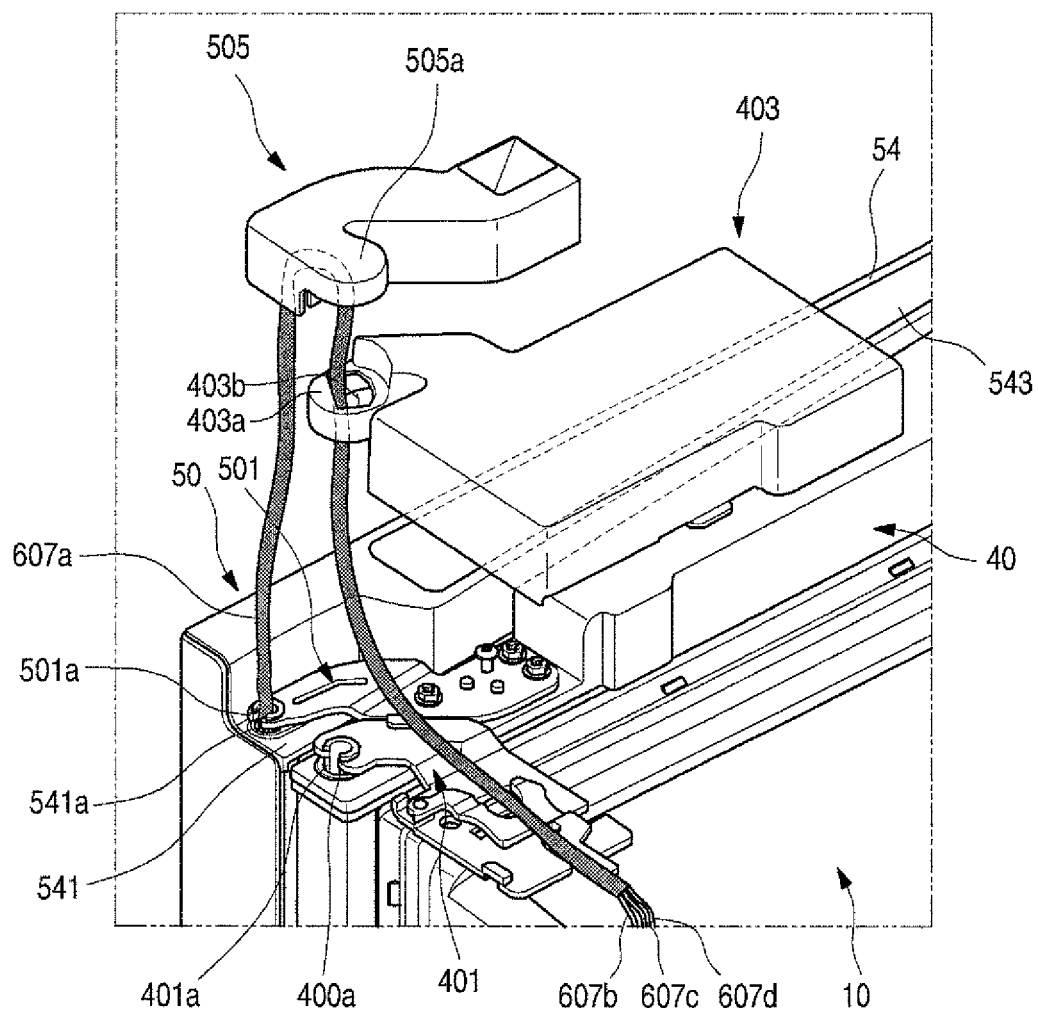
FIG. 37 is an exploded perspective view illustrating an arrangement of a wire outside the sub door.

FIG. 36 is an exploded perspective view illustrating a connection structure between the PCBs and the cable inside the sub door. Also, FIG. 37 is an exploded perspective view illustrating an arrangement of a wire outside the sub door.

As illustrated in the drawings, a deco opening 542 may be defined in an upper cap deco 54 defining a top surface of the sub door 50, and the touch PCB 603, the T-CON board 602, and the docking PCB 604 may be mounted on the deco cover 543 that covers the deco opening 542 and then accommodated into the deco opening 542.

A hinge hole 541a in which the sub hinge 501 is mounted may be defined in one side of the upper cap deco 54. The hinge hole 541a may communication with an inner space of the deco opening 542. Thus, the T-CON connection cable 607b connected to the T-CON board 602 and the first and second connection cables 607c and 607d of the docking PCB 604 may be accessible through the hinge hole 541a.

Here, the T-CON connection cable 607b and the first and second connection cables 607c and 607d may be provided as one wire form by a binding member 607a such as a shrinkable tube, a separate binding film, or a tape to pass through the hinge hole 541a and the hinge shaft 501a.

The binding member 607a may be disposed in a section passing through at least the hinge hole 541a and the hinge shaft 501a. Thus, the binding member 607a may easily pass through the hinge hole 541a and the hinge shaft 501a and also prevent the cables 607b, 607c, and 607d from being damaged even when the sub door is repeatedly opened and closed.

The cables 607b, 607c, and 607d passing through the hinge hole 541a and the hinge shaft 501a may be exposed to an upper side of the sub door 50 through the hinge shaft 501a as illustrated in FIG. 37 and pass through the sub hinge cover 505 covering the sub hinge 501 and then be introduced into the main hinge cover 403.

Here, the cables 607b, 607c, and 607d may be rotatably coupled to each other and pass through a sub extension part 505a and a main extension part 403a, which communicate with each other, and then be guided to the cabinet 10. Thus, the cables 607b, 607c, and 607d may be prevented from interfering or being damaged even when the sub door rotates and be guided to the cabinet 10 and then be connected to the display PCB 142.

A refrigerator according to various other embodiments in addition to the abovementioned embodiments may be exemplified.

An eighth embodiment is characterized by a door structure in which an entire surface of a door is defined by a transparent display assembly. Although not shown, the same constitution as that of the foregoing embodiment will be denoted as the same reference numeral, and its detailed description will be omitted.

Figure 38:
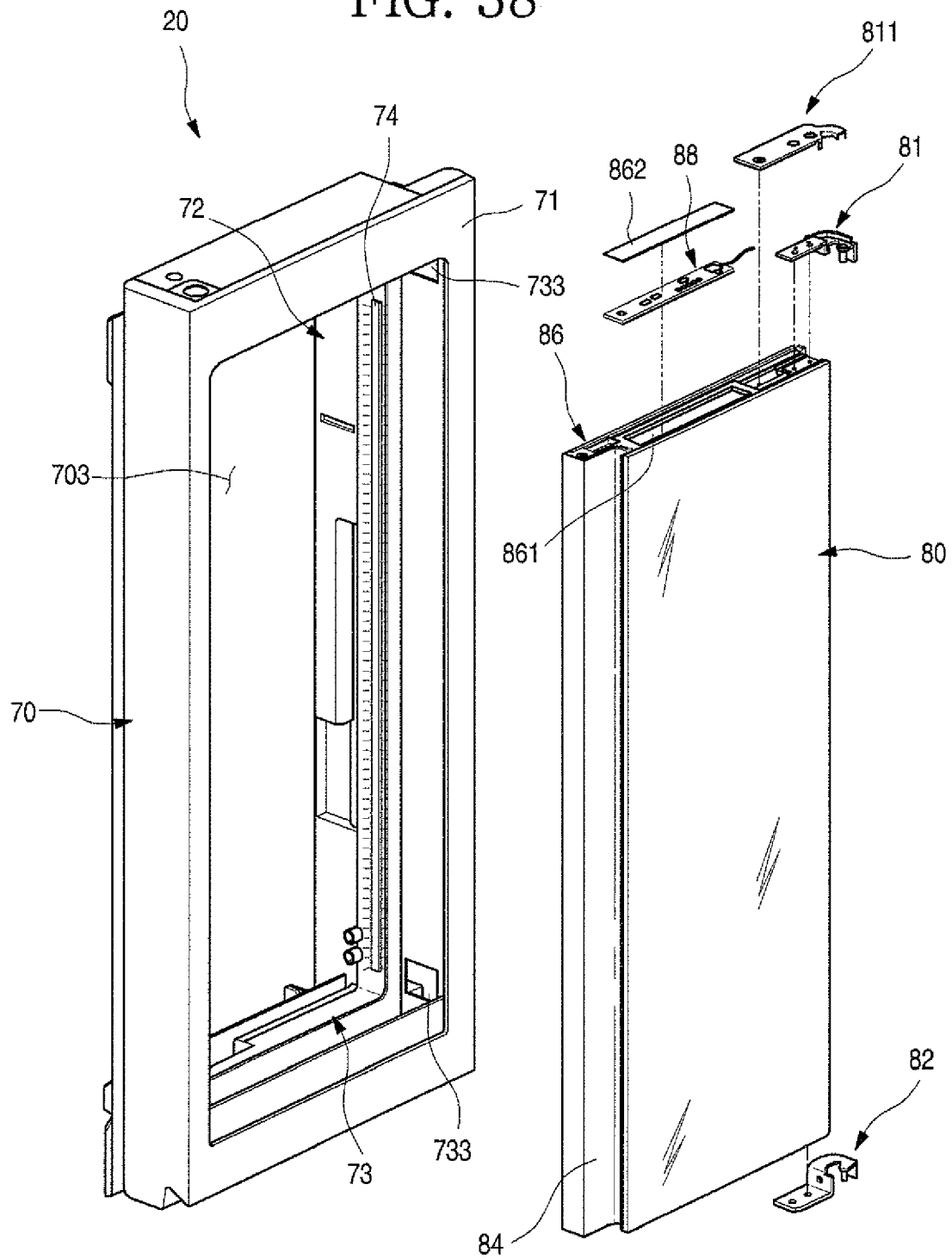
FIG. 38 is an exploded perspective view of a door according to an eighth embodiment.

FIG. 38 is an exploded perspective view of a door according to an eighth embodiment.

As illustrated in the drawing, a door 20 of a refrigerator 1 according to an eighth embodiment may include a main door 70 that opens and closes at least a portion of an opened front surface of a cabinet 10 and a sub door 80 that opens and closes an opening 703 of the main door 70.

The opening 703 that is opened with a predetermined size is defined in the main door 70. A separate accommodation space may be defined in the opening 703, and an access to the accommodation space may be enabled through opening and closing of the sub door.

Also, an outer appearance of the main door 70 may be defined by an outer plate 71 made of a metal material, a door linear 72 coupled to the outer plate 71, and a door cap deco disposed on each of upper and lower ends of the door linear 72.

Also, a door lighting unit 74 for brightening up the inside of the opening 703 may be disposed on an inner surface of the door linear 72. The door lighting unit 74 may be disposed on both left and right surfaces or a top surface of the opening 703. The door lighting unit 74 may allow the sub door 80 to be transparent or perform a backlight function of a transparent display assembly 90 mounted on the sub door 80 to visualize a screen outputted through the transparent display assembly 90.

A door frame 73 may be further disposed between the outer plate 71 and the door linear 72. The door frame 73 may be coupled between the outer plate 71 and the door linear 72 to form a circumference of the opening 703.

Also, a hinge hole 733 in which sub hinges 81 and 82 for mounting the sub door 80 are mounted may be defined to be opened in one side of the door frame 73. The hinge hole 733 may be opened at a position facing a side surface of the sub door 80, and the sub hinges 81 and 82 may be inserted into the hinge hole 733. Also, a connection cable 884 connected to a door PCB 88 may be accessible through the hinge hole 733.

Upper and lower ends of the sub door 80 may be recessed so that the sub hinges 81 and 82 are mounted, respectively. Also, the sub hinges 81 and 82 may extend laterally to the hinge hole 733 and be coupled inside the main door 70. Thus, the sub hinges 81 and 82 may prevent an interference with the main door 70 from occurring when the sub door 80 rotates while maintaining a very narrow space between the sub hinges 81 and 82 and the main door 70. Also, the sub hinges 81 and 82 may further include a hinge cover 811 disposed above the sub hinge 81 to cover the sub hinge 81 and guide an access of the connection cable 884.

Figure 39:
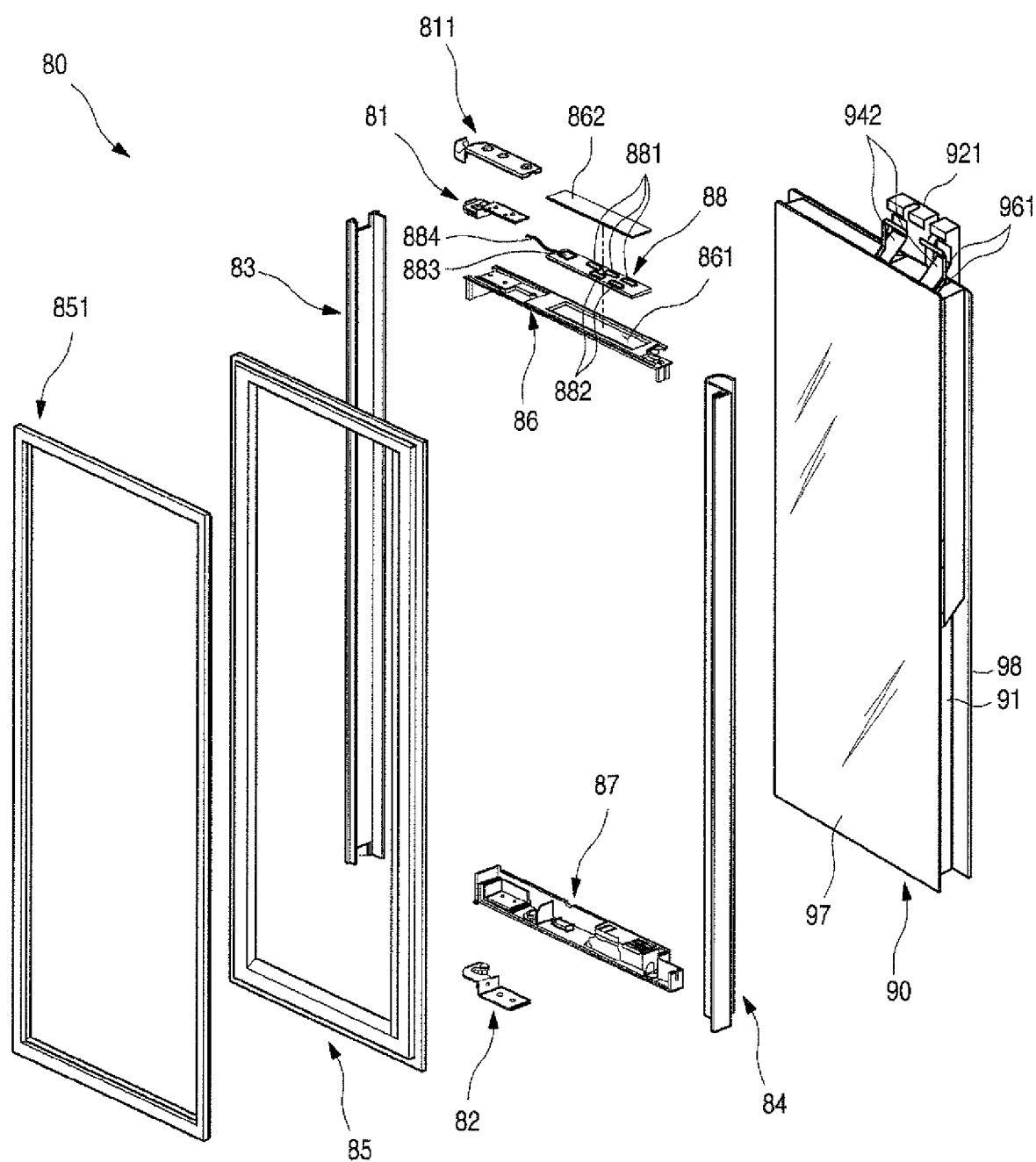
FIG. 39 is an exploded perspective view of a sub door according to the eighth embodiment.

FIG. 39 is an exploded perspective view of the sub door according to the eighth embodiment.

As illustrated in the drawing, the sub door 80 may have a shape corresponding to that of the opening 703. The sub door 80 may include a transparent display assembly 90 through which the inside of the refrigerator 1 is seen, and a screen is outputted, side frames 83 and 84 defining both side surfaces of the sub door 80, a sub door linear defining a circumference of a rear surface of the sub door 80, a sub door gasket 851 mounted on the sub door linear 85 to seal a gap between the main door 70 and the sub door 80, and upper and lower cap decos 86 and 87 defining top and bottom surfaces of the sub door 80.

An outer appearance of front and rear surfaces of the transparent display assembly 90 may be defined by a front panel 91 and a rear panel 97, which are made of a glass material and define the front and rear surfaces of the sub door 80. Also, a display 94 for outputting a screen and a touch sensor 92 for touch input may be disposed between the front panel 91 and the rear panel 97.

Also, flat cable type cables 921 and 942 and 961 connected to electric modules of the transparent display assembly 90 may be disposed along the circumference of transparent display assembly 90 to extend upward and then be coupled to a door PCB 88.

The door PCB 88 may be configured to control the electric modules within the transparent display assembly 90 and be disposed at a position that is capable of being connected to the cables 921, 942, and 961. Also, the door PCB 88 may be connected to a wire cable type connection cable 884 that is introduced to the sub hinge 81. Thus, the door PCB 88 may convert a signal, which is received or transmitted through the plurality of flat cable type cables 921, 942, and 961, through the wire cable type connection cable 884 to guide the signal to the outside of the sub door 80.

The door PCB 88 may be disposed to be divided into a plurality of parts according to a size of an inner space of the sub door 80 or may be disposed to be integrated in one PCB shape. When the door PCB 88 is provided in plurality, the plurality of door PCBs 88 may be disposed horizontally and vertically and be stacked with each other.

For this, a deco opening 861 may be defined in the upper cap deco 86 that is disposed at a position corresponding to that of the cables 921, 942, and 961, and the door PCB 88 may be mounted inside the deco opening 861. Also, the deco opening 861 may be covered by a deco cover 862 in the state in which the door PCB 88 is mounted.

Figure 40:
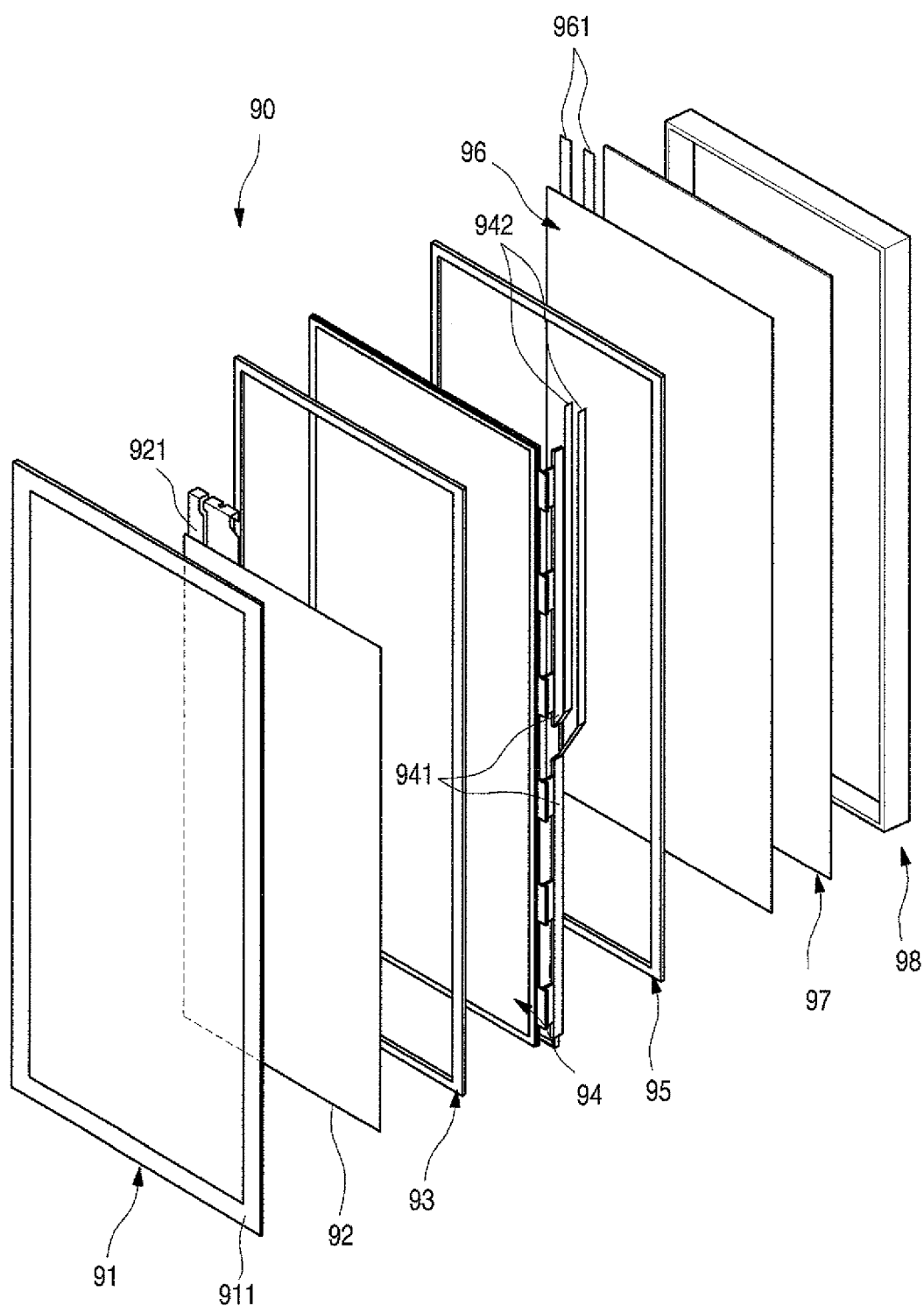
FIG. 40 is an exploded perspective view of a transparent display assembly according to the eighth embodiment.

FIG. 40 is an exploded perspective view of the transparent display assembly according to the eighth embodiment.

As illustrated in the drawings, the transparent display assembly 90 may provide a see-through part of the sub door 80 and define an outer appearance of each of the front and rear surfaces of the sub door 80. Thus, an accommodation space inside the opening 703 may be seen, or the screen may be outputted through the transparent display assembly 90.

The transparent display assembly 90 may include a front panel 91 defining an outer appearance of a front surface, a display 94 disposed at a rear side of the front panel 91, a rear panel 97 which is disposed at a rear side of the display 94 and on which a PDLC film for illuminating the display 94 is attached, and a display frame 98 for fixing the front panel 91, the display 94, and the rear panel 97.

In more detail, the front panel 91 may be disposed at the frontmost position of the transparent display assembly 90 to define the front surface of the sub door 80. The front panel 91 may be made of blue glass, and a bezel 911 may be printed on a circumference of a rear surface of the front panel 91. Spacing rods 93 and 95 disposed at the rear side of the front panel 91 or the door PCB 88 may not be exposed to the outside by the bezel 911. The bezel 911 may have a width that is adjustable according to the mounted position of the door PCB 88. The bezel 88 disposed at an end of a side at which the door PCB 911 is disposed may have a thicker thickness to completely cover the door PCB 911.

A printing or film type touch sensor 92 may be attached to the rear surface of the front panel 91. Thus, when a user touches the front panel 91, the touch sensor 92 may recognize the user's touch. Also, a flexible flat cable type touch cable 921 may be connected to one side of the touch sensor 92.

The display 94 may be mounted on the rear side of the front panel 91 to which the touch sensor 92 is attached. Also, the first spacing rod 93 may be disposed between the display 94 and the front panel 91. The first spacing rod 93 may have a rectangular frame shape disposed along a circumference of the display 94. Also, the first spacing rod 93 may adhere between the display 94 and the front panel 91 to maintain a predetermined distance between the front panel 91 and the display 94 and support the display 94.

The display 94 may be provided as a transparent LCD display. Thus, although the display 94 does not output a screen, the inside of the refrigerator 1 may be seen through the display 94 as if glass. Also, a source board 941 for controlling the display 94 may be mounted on one end of the display 94, and a flexible flat cable type display cable 942 may be connected to the source board 941.

The rear panel 97 may define an outer appearance of a rear surface of the transparent display assembly 90 and be exposed to the door linear 72. The rear panel 97 may be made of low-ε glass to realize thermal insulation.

The PDLC film 96 may be attached to the front surface of the rear panel 97. The PDLC film 96 may be selectively transparent or opaque according to applying of power. Thus, the user may selectively see the inside of the refrigerator according to the state of the PDLC film 96. Also, a flexible flat cable type PDLC cable 961 may be connected to one side of the PDLC film 96.

Also, the second spacing rod 95 having the same structure as the first spacing rod 93 may be disposed between the rear panel 97 and the display 94 to maintain a space between the display 94 and the rear panel 97.

The display frame 98 may define a circumferential surface of the transparent display assembly 90. Also, the display frame 98 may fix the front panel 91 and the rear panel 97 to maintain the preset space between the front panel 91 and the rear panel 97. Also, the transparent display assembly 90 may be fixed and mounted on the sub door 80 when the transparent display assembly 90 is completely assembled. Also, the flat type cables 921, 942, and 961 may be guided to the outside between the display frame 98 and an adhesion surface of the front panel 91 or the rear panel 97, and a sealant may be applied to an outer surface of the display frame 98 to seal a gap so that the gap does not occur.

In the state in which the display 94 does not output the screen, and the PDLC film 96 is transparent, the transparent display assembly 90 may be transparent. In this state, when the door lighting unit 74 is turned on, the space inside the opening 703 may be seen from the outside.

Also, in the state in which the PDLC film 96 is opaque, the transparent display assembly 90 may be opaque. In this state, when the door lighting unit 74 is turned off, the inside of the refrigerator may be darker, and thus, the space inside the opening 703 may not be seen.

The display 94 may be driven to output the screen. In this case, in the state in which the door lighting unit 74 is turned on, and the PDLC film 96 is transparent, the door lighting unit 74 may serve as a backlight that brightens up the display 94 so that the display 94 is more clearly displayed.

Figure 41:
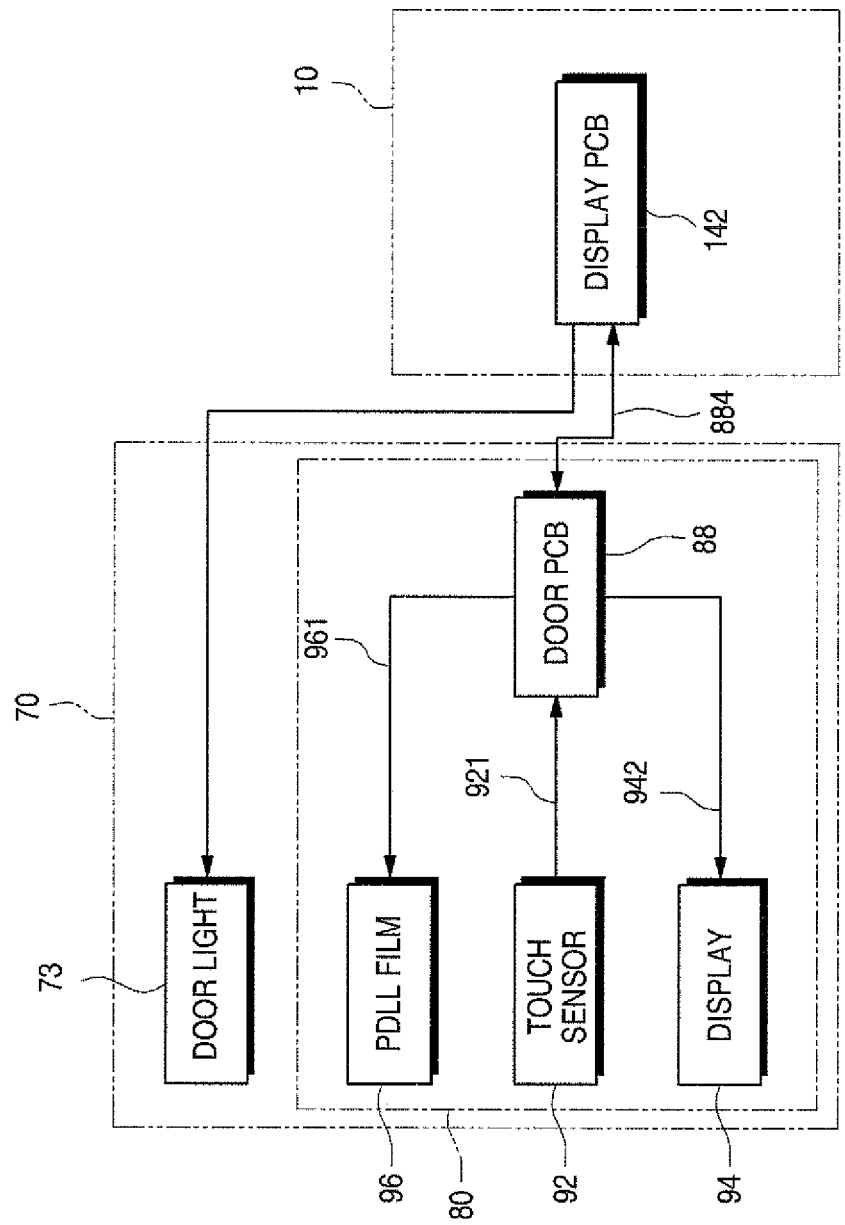
FIG. 41 is a block diagram illustrating a flow of a control signal in a refrigerator according to the eighth embodiment.

FIG. 41 is a block diagram illustrating a flow of a control signal in the refrigerator according to the eighth embodiment.

As illustrated in the drawing, the flat type touch cable 921, the display cable 942, and the PDLC cable 961 may be connected to one side of the door PCB 88 disposed on the sub door 80. Also, in the other side of the door PCB 88, the wire type connection cable 884 may be guided to the main door 70 through the upper hinge 81 and the hinge hole 733 to pass through main door 70 and then be connected to the transparent display assembly 90 on the cabinet 10.

Since the connection cable 884 has a small volume and superior durability, the connection cable 884 may be disposed to easily pass through the sub door 80 and the main door 70 and prevent the main door 70 and the sub door 80 from being damaged even though the main door 70 and the sub door 80 are repeatedly opened and closed. Also, the door lighting unit 74 mounted on the main door 70 may also be connected to the display PCB 142 on the cabinet 10 by passing through the main door 70.

The display PCB 142 may receive a signal inputted from the touch sensor 92 and control the turn-on/off of the door lighting unit 74 and the image output of the display 94.

Although the door PCB 88 is disposed on the upper end in the eighth embodiment, the door PCB 88 may be disposed on the lower end of the sub door 80, or both side ends of the sub door 80 so that the door PCB 88 is capable of being accommodated and also be disposed outside the transparent display assembly 90 so that the door PCB 88 is not exposed through the transparent display assembly 90.

The following effects may be expected in the refrigerator according to the proposed embodiments.

In the refrigerator according to the embodiments, the see-through part that sees the accommodation space may be provided in the door. The see-through part may include the transparent display and be selectively transparent or opaque according to the turn-on/off of the door light and the display light. Thus, the user may confirm the accommodation space through the see-through part by the user's manipulation without opening the door to improve the user's convenience and reduce the power consumption.

Also, in the see-through part, the display may operate according to the user's manipulation to display various screens and thereby to provide various pieces of information for the user's convenience and allow the user to input the manipulation thereof, thereby improving the user's convenience.

Also, the cables connected to the electric modules of the transparent display assembly may have the flexible structure as the flat type cable. Thus, the cables may easily access between the transparent display assembly having the structure in which the plurality of panels are laminated, and the airtight state may be maintained.

Also, the cables may be bent and thus closely attached to the circumference of the transparent display assembly. Thus, the door may have the compact structure, and the interface with the insulation material may be minimized.

Also, the PCB for controlling the electric modules of the transparent display assembly may be disposed at the upper, lower, or left/right sides of the transparent display assembly. In addition, since the cables connected to the PCB are also disposed along the circumference of the transparent display assembly, the PCB or the cables may not be exposed to the outside through the transparent display assembly. That is, the inside of the refrigerator may be seen through the transparent display assembly that is capable of outputting the screen. Here, the interference with the PCB or the cables may be prevented.

Also, the PCBs may be connected to the cables that are exposed through the opening of the door. Thus, the PCBs may be mounted after the foaming for molding the insulation material in the door is performed to prevent the PCBs from being damaged by the foaming heat or static electricity.

Also, the PCB may have one side connected to the plurality of flat type cables and the other side connected to the wire type cable. Thus, the wire type cable may be guided outward from the inside of the door and then connected to the control unit disposed in the cabinet. Thus, the flat type cables connected to the plurality of electric modules may not pass through the door. As a result, the lead-out structure of the cable to the outside of the door may be simplified, and even though the door is repeatedly opened and closed, the cable may be prevented from being short-circuited or damaged.

In addition, the number of cables, which are connected to the electric modules and other PCBs within the door, in the docking PCB may be less than that of connection cables, which pass through the door hinge through the control unit, in the docking PCB. Also, the control signal transmitted from the control unit in the cabinet may be transmitted to the electric modules and other PCBs through the docking PCB.

Thus, the control signal and the power may be supplied to the inside of the door, in which the plurality of electric modules are provided, through the narrow door hinge. Particularly, in the refrigerator having the sub door structure, the hinge shaft of the sub door may be very narrow. Thus, the arrangement structure of the wire for driving the display and the electric module may be realized through the narrow hinge shaft.

Also, the connector may be provided in the PCB to allow the flat type cable exposed through the opening of the door to be easily inserted into and mounted on the connector, thereby improving the workability in assembly of the PCB.

In addition, the PCB for controlling the operation of the door and/or the transparent display assembly may be provided in the door, and the additional display assembly connected to the PCB may be provided in the cabinet. Thus, the constituents of the PCB provided in the door may be minimized, and also, the number of wires connected to the PCB may be minimized to maximally expand the space in which the transparent display assembly is disposed. Therefore, the visible area of the accommodation space may be more expanded.

Also, the plurality of PCBs for driving the transparent display assembly and the door light may be provided and then connected to each other in the same space so as to be modularized, thereby improving the assemblability of the door and the transparent display assembly.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A refrigerator, comprising:
   a cabinet defining a storage space;
   a controller disposed on the cabinet;
   a main door configured to open and close the storage space;
   a sub door rotatably provided to the main door, the sub door defining an opening;
   a hinge provided at the sub door and including a hinge shaft;
   a light provided in the cabinet or the main door to illuminate the storage space; and
   a transparent display assembly configured to cover the opening, the transparent display assembly including:
      a front panel and a rear panel, the front panel and the rear panel being spaced apart from each other;
      a frame provided between the front panel and the rear panel;
      a display provided within a space defined by the front panel, the rear panel, and the frame; and
      a first connection cable that is electrically connected to the display and passes through between the frame and one of the front panel or the rear panel;
   a door printed circuit board (PCB) provided in the sub door, the door PCB being configured to be electrically connected to the display by the first connection cable; and
   a second connection cable configured to electrically connect the door PCB to the controller, wherein the second connection cable passes through the hinge shaft and is connected to the controller, wherein when the display operates and the light is turned off, an electric signal generated at the controller is transmitted to the door PCB by the second connection cable, then is transmitted to the display by the first connection cable, and information is output at the display, and wherein when the light is turned on and the display is not operated, the storage space is seen through the transparent display assembly.

2. The refrigerator according to claim 1, wherein the hinge further comprises:
   a hinge body coupled to the main door; and
   a hinge cover configured to shield the hinge body, the hinge cover having a extension through which the second connection cable passes.

3. The refrigerator according to claim 1, wherein the first connection cable comprises a flexible flat cable, and wherein the second connection cable comprises a wire cable.

4. The refrigerator according to claim 1, wherein when the light is turned on and the display is operated, user information is input through the transparent display assembly.

5. The refrigerator according to claim 1, wherein the display comprises a source PCB disposed on one end of a pair of ends of the display, and wherein the source PCB is disposed inside the transparent display assembly and oriented in a direction in which a surface of the source PCB is perpendicular to a surface of the display.

6. The refrigerator according to claim 5, wherein the first connection cable connects the source PCB to the door PCB, and wherein the first connection cable includes a flat display cable that is bent and arranged along a circumferential surface of the transparent display assembly.

7. The refrigerator according to claim 1,
   wherein the main door defines a second storage space and the opening of the main door is defined at a position corresponding to the second storage space.

8. The refrigerator according to claim 7, further comprising a main hinge about which the main door is configured to rotate with respect to the cabinet, the main hinge including a rotational shaft, wherein an inner diameter of the hinge shaft is less than an inner diameter of the rotational shaft of the main hinge, and wherein the second connection cable is guided to an outside of the sub door by passing through the hinge shaft.

9. The refrigerator according to claim 7, wherein the second connection cable comprises a plurality of wires that pass through the hinge shaft.

10. The refrigerator according to claim 1, wherein the sub door includes a cap that defines a top surface of the sub door, the cap having a hinge hole into which the hinge shaft is provided.

11. The refrigerator according to claim 10, wherein the cap defines a cap opening into which the door PCB is inserted, and wherein the refrigerator further comprises a cap cover to shield the cap opening, the cap cover including a PCB mount on which the door PCB is provided.

12. The refrigerator according to claim 11, further comprising:
   an insulation material provided above the transparent display assembly, wherein the PCB mount is provided between the door PCB and the insulation material.

13. The refrigerator according to claim 1, wherein the door PCB comprises a docking PCB including:
   first connectors electrically connected to the first connection cable; and
   second connectors connected to the second connection cable, wherein the controller is configured to transmit a control signal to the display through the first and second connectors of the door PCB.

14. The refrigerator according to claim 13, wherein a number of the second connectors is less than a number of the first connectors.

15. The refrigerator according to claim 13, further comprising:
a display light configured to illuminate a light guide plate disposed at a rear side of the display, wherein the first connection cable includes a display light cable that connects the display light to the door PCB, and wherein the display light cable is arranged along a protrusion that protrudes from a front surface of the transparent display assembly or from a rear surface of the transparent display assembly.

16. The refrigerator according to claim 13, wherein the door PCB further comprises a timing controller (T-CON) board electrically connected to the display, and wherein the timing controller (T-CON) board is electrically connected to the docking PCB.

17. The refrigerator according to claim 13, further comprising:
a touch sensor configured to receive a touch input on the display, wherein the first connection cable includes a touch cable that connects the touch sensor to the door PCB, and wherein the touch cable is arranged inside the transparent display assembly, and a portion of the touch cable passes through a circumferential surface of the transparent display assembly to connect to the door PCB.

18. The refrigerator according to claim 17, wherein the door PCB further comprises a touch PCB electrically connected to the touch sensor, and wherein the touch PCB is electrically connected to the docking PCB.

19. A refrigerator, comprising:
a cabinet defining a storage space;
a door rotatably coupled to the cabinet by a hinge shaft to open and close a portion of the storage space, the door defining an opening;
a light provided in the cabinet or the door to illuminate the storage space; and
a transparent display assembly configured to cover the opening, the transparent display assembly including:
a front panel and a rear panel, the front panel and the rear panel being spaced apart from each other;
a frame provided between the front panel and the rear panel;
a display provided within a space defined by the front panel, the rear panel, and the frame; and
a first cable that electrically connects to the display and passes through between the frame and one of the front panel or the rear panel;
a door printed circuit board (PCB) electrically connected to the display by the first cable; and
a second cable that electrically connects to the door PCB, wherein the door comprises a cap that defines a top surface of the door, the cap having a hinge hole into which the hinge shaft is provided, wherein the second connection cable is configured to pass through the hinge shaft and is connected to the controller, wherein when the display operates and the light is turned off, an electric signal generated at the controller is transmitted to the door PCB by the second cable, then is transmitted to the display by the first cable, and information is output at the display, and wherein when the light is turned on and the display is not operated, the storage space is seen through the transparent display assembly.

20. The refrigerator according to claim 19, wherein the first cable comprises a flexible flat cable, and wherein the second cable comprises a wire cable.

21. A refrigerator, comprising:
a cabinet defining a storage space;
a door rotatably coupled to the cabinet by a hinge to open and close a portion of the storage space, the door defining an opening and the hinge being provided at an upper portion of the door;
a light provided in of the cabinet or the door to illuminate the storage space; and
a transparent display assembly configured to cover the opening, the transparent display assembly including:
a plurality of panels spaced apart from each other;
a frame provided between the plurality of panels;
a display provided within a space defined by the plurality of panels and the frame, the display comprising a source printed circuit board (PCB) disposed on one end of a pair of ends of the display; and
a first cable that electrically connects to the display and passes through between the frame and one of the plurality of panels;
a door PCB electrically connected to the display by the first cable; and
a second cable that electrically connects the door PCB to a controller, the second cable being configured to pass through the hinge, wherein when the display operates and the light is turned off, an electric signal generated at the controller is transmitted to the door PCB by the second cable, then is transmitted to the display by the first cable, and information is output at the display, wherein when the light is turned on and the display is not operated, the storage space is seen through the transparent display assembly, and wherein the source PCB is connected to the door PCB by the first cable.

22. The refrigerator according to claim 21, wherein the hinge comprises a hinge shaft disposed at an upper end of the door, and wherein the second cable passes through the hinge shaft and is connected to the controller.

23. The refrigerator according to claim 21 wherein the source PCB is oriented in a direction in which a surface of the source PCB is perpendicular to a surface of the display.

24. The refrigerator according to claim 23, wherein the first cable includes a flat display cable that is bent and arranged along a circumferential surface of the transparent display assembly.

* * * * *